United States Patent
Nitta et al.

(10) Patent No.: US 10,714,661 B2
(45) Date of Patent: Jul. 14, 2020

(54) LIGHT-EMITTING APPARATUS INCLUDING PHOSPHOR

(71) Applicant: Panasonic Intellectual Property Management Co., Ltd., Osaka (JP)

(72) Inventors: Mitsuru Nitta, Kyoto (JP); Nobuaki Nagao, Gifu (JP); Yasuhisa Inada, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/933,455

(22) Filed: Mar. 23, 2018

(65) Prior Publication Data

US 2018/0212112 A1 Jul. 26, 2018

Related U.S. Application Data

(63) Continuation-in-part of application No. PCT/JP2017/019465, filed on May 25, 2017, which is (Continued)

(30) Foreign Application Priority Data

Jul. 4, 2016 (JP) ................................ 2016-132126
Feb. 16, 2017 (JP) ................................ 2017-026910
Feb. 27, 2017 (JP) ................................ 2017-035535

(51) Int. Cl.
*H01L 33/50* (2010.01)
*H01L 33/62* (2010.01)
(Continued)

(52) U.S. Cl.
CPC ............ *H01L 33/504* (2013.01); *H01L 27/15* (2013.01); *H01L 33/0045* (2013.01);
(Continued)

(58) Field of Classification Search
None
See application file for complete search history.

(56) References Cited

U.S. PATENT DOCUMENTS 10,214,429 B2 * 2/2019 Nitta .................. C01F 17/0012
2005/0117334 A1 6/2005 Lee et al.
(Continued)

FOREIGN PATENT DOCUMENTS

| CN | 101220272 A | 7/2008 |
| CN | 103148395 A | 6/2013 |

(Continued)

OTHER PUBLICATIONS

Le Toquin, R., and A. K. Cheetham. "Red-emitting cerium-based phosphor materials for solid-state lighting applications." Chemical physics letters 423.4-6 (2006): 352-356. (Year: 2006).*

(Continued)

*Primary Examiner* — Walter H Swanson
*Assistant Examiner* — Kien C Ly
(74) *Attorney, Agent, or Firm* — McDermott Will & Emery LLP

(57) ABSTRACT

A light-emitting apparatus includes: a solid-state light source; and a wavelength convertor. The solid-state light source emits first light including green light with a peak wavelength in a range of 480 to 550 nm, inclusive. The wavelength convertor contains a red phosphor including Ce as a luminescent center. The red phosphor is excited by at least part of the green light to emit second light. The second light has a spectrum with a peak wavelength in a range of 600 to 700 nm, inclusive. The red phosphor contains a nitride or an oxynitride as a host material.

17 Claims, 43 Drawing Sheets

Related U.S. Application Data a continuation-in-part of application No. PCT/JP2017/000935, filed on Jan. 13, 2017.

(51) Int. Cl.
  *H01L 33/00* (2010.01)
  *H01L 27/15* (2006.01)
(52) U.S. Cl.
  CPC .... *H01L 33/62* (2013.01); *H01L 2224/48091* (2013.01); *H01L 2224/73265* (2013.01)

(56) References Cited

U.S. PATENT DOCUMENTS

| | | |
|---|---|---|
| 2005/0242329 A1 | 11/2005 | Fiedler et al. |
| 2006/0043879 A1 | 3/2006 | Naitou |
| 2006/0197098 A1 | 9/2006 | Aihara |
| 2007/0126011 A1 | 6/2007 | Lee |
| 2008/0150412 A1 | 6/2008 | Yoshimatsu |
| 2009/0167149 A1 | 7/2009 | Ito |
| 2012/0242912 A1 | 9/2012 | Kitano |
| 2013/0234588 A1 | 9/2013 | Seto et al. |
| 2014/0185282 A1* | 7/2014 | Hsu .................... F21V 9/08 362/231 |
| 2014/0285772 A1 | 9/2014 | Tajiri |
| 2017/0307163 A1* | 10/2017 | Nagasaki ............. F21S 41/16 |
| 2019/0171093 A1* | 6/2019 | Furuyama ........... G02B 5/0226 |

FOREIGN PATENT DOCUMENTS

| | | |
|---|---|---|
| EP | 2610217 A1 | 7/2013 |
| JP | 2005-167177 | 6/2005 |
| JP | 2006-008721 | 1/2006 |
| JP | 2006-073656 | 3/2006 |
| JP | 2006-245443 | 9/2006 |
| JP | 2007-158296 | 6/2007 |
| JP | 2007-515527 | 6/2007 |
| JP | 2008-088362 | 4/2008 |
| JP | 2009-512741 | 3/2009 |
| JP | 2009-153712 A | 7/2009 |
| JP | 2011-526066 | 9/2011 |
| JP | 2012-212129 A | 11/2012 |
| WO | 2007/041563 | 4/2007 |
| WO | 2009/157999 | 12/2009 |

OTHER PUBLICATIONS

International Search Report of PCT application No. PCT/JP2017/019465 dated Aug. 22, 2017.
International Search Report of PCT application No. PCT/JP2017/000935 dated Mar. 7, 2017.
Yongchao Jia et al., "First-principles study of Ce3+-doped lanthanum silicate nitride phosphors: Neutral excitation, Stokes shift, and luminescent center identification", Physical Review B93, 155111, Apr. 6, 2016.
R. Le Toquin et al., "Red-emitting cerium-based phosphor materials for solid-state lighting applications", Chemical Physics Letters, vol. 423, Issues4-6, Jun. 1, 2006, pp. 352-356.
Qiang-Qiang Zhu et al., "Extra-Broad Band Orange-Emitting Ce3+-Doped Y3Si5N9O Phosphor for Solid-State Lighting: Electronic, Crystal Structures and Luminescence Properties", Chemistry of Materials, vol. 28, Jun. 20, 2016, pp. 4829-4839.
International Search Report of PCT application No. PCT/JP2017/019464 dated Jun. 27, 2017.
International Search Report of PCT application No. PCT/JP2017/019466 dated Aug. 22, 2017.
International Search Report of PCT application No. PCT/JP2017/019467 dated Aug. 22, 2017.
Yun-Chen Wu et al., "a-(Y,Gd)FS:Ce3+: a novel red-emitting fluorosulfide phosphor for solid-state lighting", Journal of Materials Chemistry, 21, Oct. 21, 2011, pp. 15163-15166.
The Extended European Search Report dated Jun. 27, 2019 for the related European Patent Application No. 17823889.5.
The Extended European Search Report dated Jun. 28, 2019 for the related European Patent Application No. 17823890.3.
The Extended European Search Report dated Jun. 28, 2019 for the related European Patent Application No. 17823891.1.
The Extended European Search Report dated Jul. 2, 2019 for the related European Patent Application No. 17780614.8.
The Extended European Search Report dated Jun. 27, 2019 for the related European Patent Application No. 17734219.3.
Lihong Liu et al: "Yellow-Emitting Y3Si6N11: Ce3+ Phosphors for White Light-Emitting Diodes (LEDs)", Journal of The American Ceramic Society., vol. 96, No. 6, Jun. 1, 2013 (Jun. 1, 2013), pp. 1688-1690,XP055450326.
Database WPI Week 201372 Thomson Scientific, London, GB; AN 2013-R71607, XP002792144.
English Translation of Chinese Search Report dated May 8, 2020 for the related Chinese Patent Application No. 201780002095.2.
English Translation of Chinese Search Report dated May 8, 2020 for the related Chinese Patent Application No. 201780002084.4.

* cited by examiner

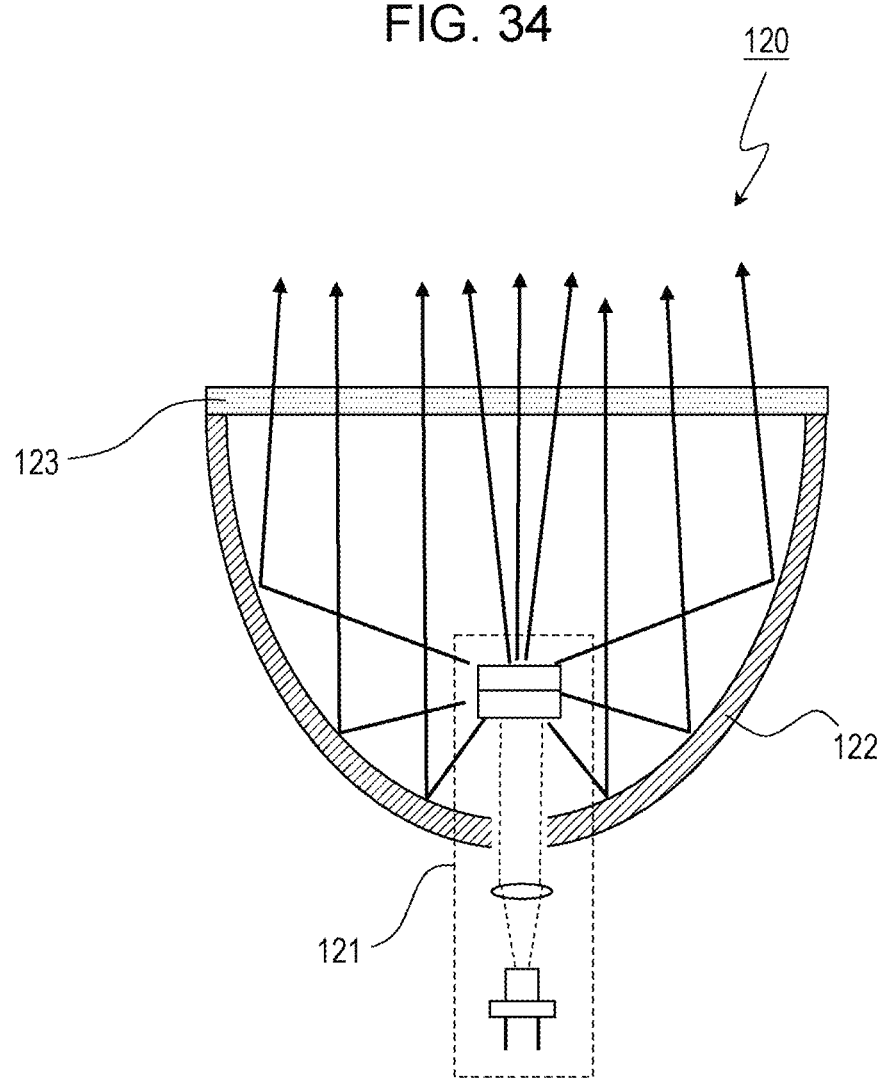

US 10,714,661 B2

LIGHT-EMITTING APPARATUS INCLUDING PHOSPHOR

BACKGROUND

1. Technical Field

The present disclosure relates to a light-emitting apparatus including a phosphor.

2. Description of the Related Art

In recent years, solid-state light sources, such as white light-emitting diodes (LEDs) and laser-excited light sources, have been widely used. Existing typical white LEDs include a combination of a blue LED chip, which is a blue light-emitting device, and a phosphor. In such typical white LEDs, light from a blue LED chip is partly subjected to color conversion with a phosphor, and blue light from the blue LED chip and light from the phosphor are mixed to produce white light. In more recent years, high-power white-light-emitting apparatuses including a combination of a laser diode (LD) and a phosphor have been developed. At present, white solid-state light sources mainly include a combination of a blue LED chip or a blue LD and a yellow phosphor. In order to improve color rendering properties and color reproducibility or in order to produce low-color-temperature white, white light sources including a red phosphor in addition to a blue light source and a yellow phosphor are being developed.

Yellow phosphors including Ce as a luminescent center, such as the phosphor represented by the general formula $Y_3Al_5O_{12}:Ce^{3+}$ (hereinafter abbreviated to YAG:Ce) or with the general formula $La_3Si_6N_{11}:Ce^{3+}$ (hereinafter abbreviated to LSN:Ce) described in Japanese Patent No. 4459941, are known. Also known are red phosphors including Eu as a luminescent center, such as the phosphor represented by the general formula $(Sr,Ca)AlSiN_3:Eu^{2+}$ (hereinafter abbreviated to CASN:Eu) described in Japanese Patent No. 3837588.

SUMMARY

One non-limiting and exemplary embodiment provides a light-emitting apparatus in which the power can be improved.

In one general aspect, the techniques disclosed here feature a light-emitting apparatus that includes: a solid-state light source; and a wavelength convertor. The solid-state light source emits first light including green light with a peak wavelength in a range of 480 to 550 nm, inclusive. The wavelength convertor contains a red phosphor including Ce as a luminescent center. The red phosphor is excited by at least part of the green light to emit second light. The second light has a spectrum with a peak wavelength in a range of 600 to 700 nm, inclusive. The red phosphor contains a nitride or an oxynitride as a host material.

According to the present disclosure, the power can be improved.

It should be noted that general or specific embodiments of the present disclosure may be implemented as a phosphor, a device, an apparatus, a system, a vehicle, a method, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 34 is a schematic cross-sectional view of a lighting apparatus according to a tenth embodiment;

Figure 1A:
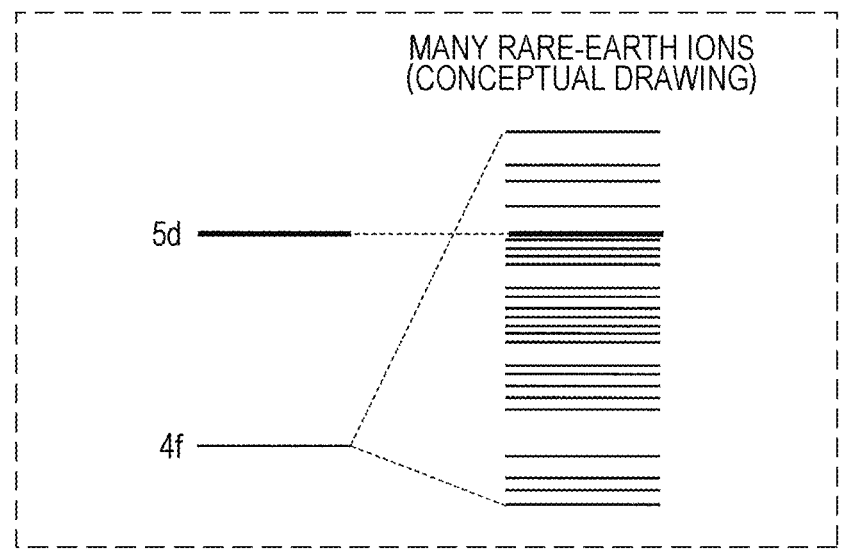
FIG. 1A is a schematic view of splitting of the 4f orbital and the 5d orbital of rare-earth ions.

DETAILED DESCRIPTION (Underlying Knowledge Forming Basis of the Present Disclosure)

A white-light-emitting apparatus including a combination of a phosphor and a solid-state light source, such as LD, may be any of the following apparatus.

A first apparatus is a pseudo-white light source including a combination of a blue LED and a yellow phosphor YAG:Ce. A light-emitting apparatus of this type is widely used because of its lower power consumption and high drive controllability of the LED. Only having two color components, however, such a white light source cannot produce warm light, for example, of the incandescent lamp color, and has poor color controllability.

A second apparatus is a white light source including a combination of a blue LED, a yellow phosphor YAG:Ce, and a red phosphor CASN:Eu. A light-emitting apparatus of this type can produce white composed of three color components and can control the light intensity of each color component to produce any white light. Thus, a light-emitting apparatus of this type has higher color controllability than light-emitting apparatuses with two color components as described above. The yellow phosphor YAG:Ce used in such a light-emitting apparatus has high emission quantum efficiency, and has almost constant emission quantum efficiency even when excited by a high-power blue LED or blue LD.

By contrast, the red phosphor CASN:Eu has a problem of decreased emission quantum efficiency when excited by high-power light and is therefore used only in relatively low power light sources. This is because phosphors including Eu as a luminescent center have a longer emission lifetime than phosphors including Ce as a luminescent center and therefore tends to reach luminance saturation during high-energy excitation. Thus, no high-power color-controllable white light source has been developed.

The present inventors have extensively studied to develop a high-power color-controllable light-emitting apparatus, for example, a high-power color-controllable light-emitting apparatus that can emit white light.

Summary of Aspect of the Present Disclosure

A light-emitting apparatus according to a first aspect of the present disclosure includes a solid-state light source and a wavelength convertor. The solid-state light source emits first light including green light with a peak wavelength in a range of 480 to 550 nm, inclusive. The wavelength convertor contains a red phosphor including Ce as a luminescent center. The red phosphor is excited by at least part of the green light to emit second light. The second light has a spectrum with a peak wavelength in a range of 600 to 700 nm, inclusive.

The light-emitting apparatus according to the first aspect contains the red phosphor including the Ce luminescent center. The red phosphor is excited by green light with high absorption efficiency. Thus, the light-emitting apparatus according to the first aspect can have high power and higher quantum efficiency than known light-emitting apparatuses. Furthermore, the light-emitting apparatus according to the first aspect has high color controllability due to the use of the red phosphor. In particular, when used as a white-light-emitting apparatus, the light-emitting apparatus according to the first aspect can exhibit good color rendering properties and color reproducibility. Thus, the first aspect of the present disclosure can provide a high-power color-controllable light-emitting apparatus.

In a second aspect, for example, the peak wavelength of the green light in the light-emitting apparatus according to the first aspect may be in a range of 510 to 540 nm, inclusive.

In the red phosphor, a longer wavelength of excitation light (i.e., green light emitted from a solid-state light source) results in a smaller energy conversion loss (e.g., Stokes' loss) of the phosphor and higher energy conversion efficiency. Thus, the light-emitting apparatus according to the second aspect can produce high power because the peak wavelength of the green light is 510 nm or more.

In a third aspect, for example, the solid-state light source of the light-emitting apparatus according to the first or second aspect may include a GaN semiconductor laser.

The light-emitting apparatus according to the third aspect can produce high power by using the GaN semiconductor laser.

In a fourth aspect, for example, each of all phosphors contained in the wavelength convertor of the light-emitting apparatus according to at least one aspect of the first to third aspects may have a 1/e afterglow value of not more than 100 ns.

All phosphors in the light-emitting apparatus according to the fourth aspect have good luminance saturation characteristics and can maintain high quantum efficiency even at high power. Thus, the light-emitting apparatus according to the fourth aspect can have high quantum efficiency and color reproducibility even at high power.

In a fifth aspect, for example, the red phosphor of the light-emitting apparatus according to at least one aspect of the first to fourth aspects may contain a host material, the host material containing Y or a lanthanoid element other than Ce.

The red phosphor in the light-emitting apparatus according to the fifth aspect contains a host material, the host material containing Y or a lanthanoid element other than Ce. Ions of the lanthanoid element other than Ce and Y have the same valence as $Ce^{3+}$. Furthermore, the ionic radii of the lanthanoid element other than Ce and Y are relatively close to the ionic radius of $Ce^{3+}$. Thus, the host material can stably take $Ce^{3+}$ into its crystal structure. Thus, the light-emitting apparatus according to the fifth aspect containing the red phosphor can have high luminous efficiency.

In a sixth aspect, for example, the red phosphor of the light-emitting apparatus according to at least one aspect of the first to fifth aspects may contain a nitride or an oxynitride as a host material. Or, the red phosphor may contain an oxide as a host material.

A nitride or an oxynitride has high thermal conductivity and is less likely to become hot. Thus, the light-emitting apparatus according to the sixth aspect can reduce the decrease in the luminous efficiency of the phosphor caused by temperature quenching.

In a seventh aspect, for example, the red phosphor of the light-emitting apparatus according to at least one aspect of the first to sixth aspects may contain a host material having a tetragonal crystal structure.

In an eighth aspect, for example, the red phosphor of the light-emitting apparatus according to at least one aspect of the first to seventh aspects may contain a crystal phase having the chemical composition of $Ce_xM_{3-x-y}\beta_{6}\gamma_{11-z}$, where M denotes one or two or more elements selected from the group consisting of Sc, Y, La, Pr, Nd, Sm, Eu, Gd, Tb, Dy, Ho, Er, Tm, Yb, and Lu, β includes Si in an amount of not less than 50% by mole of the total amount of Si, γ includes N in an amount of not less than 80% by mole of the total amount of N, and x, y and z satisfy $0<x\leq0.6$, $0\leq y\leq1.0$, and $0\leq z\leq1.0$.

The light-emitting apparatus according to the eighth aspect can have higher quantum efficiency than known light-emitting apparatuses at high power. Furthermore, when used as a white-light-emitting apparatus, the light-emitting apparatus according to the eighth aspect can exhibit good color rendering properties and color reproducibility.

In a ninth aspect, for example, the red phosphor of the light-emitting apparatus according to the eighth aspect may contain a crystal phase having the chemical composition of $Ce_xM_{3-x}Si_{6-q}Al_qN_{11-z}$, where q satisfies $0\leq q\leq2.0$. In other words, β in the chemical composition of the eighth aspect may be Si or Si and Al.

The light-emitting apparatus according to the ninth aspect can have higher quantum efficiency than known light-emitting apparatuses at high power. Furthermore, when used as a white-light-emitting apparatus, the light-emitting apparatus according to the ninth aspect can exhibit good color rendering properties and color reproducibility.

In a tenth aspect, for example, the red phosphor of the light-emitting apparatus according to the ninth aspect may contain a crystal phase having the chemical composition of $Ce_xLa_{3-x}Si_{6-q}Al_qN_{11-z}$, where q satisfies $0<q\leq2.0$. In other words, in the chemical composition of the ninth aspect, M may be La, and $0<q$.

The light-emitting apparatus according to the tenth aspect can have higher quantum efficiency than known light-emitting apparatuses at high power. Furthermore, when used as a white-light-emitting apparatus, the light-emitting apparatus according to the tenth aspect can exhibit good color rendering properties and color reproducibility.

In an eleventh aspect, for example, the red phosphor of the light-emitting apparatus according to the ninth aspect may contain a crystal phase having the chemical composition of $Ce_xY_pLa_{3-x-p}Si_6N_{11}$, where p and x satisfy $(1.5-x) \leq p \leq (3-x)$. In other words, in the chemical composition of the eighth aspect, $\beta$ may be Si, and M may be Y and La.

The light-emitting apparatus according to the eleventh aspect can have higher quantum efficiency than known light-emitting apparatuses at high power. Furthermore, when used as a white-light-emitting apparatus, the light-emitting apparatus according to the eleventh aspect can exhibit good color rendering properties and color reproducibility.

In a twelfth aspect, for example, the wavelength convertor of the light-emitting apparatus according to at least one aspect of the first to eleventh aspects may further contain a green phosphor containing a garnet crystal including Ce as a luminescent center.

Containing at least two phosphors having different emission wavelengths, the light-emitting apparatus according to the twelfth aspect can control emission color. The phosphors for use in the light-emitting apparatus according to the twelfth aspect have good luminance saturation characteristics. Thus, the light-emitting apparatus according to the twelfth aspect can have high quantum efficiency even at high power.

In a thirteenth aspect, for example, the first light emitted from the solid-state light source of the light-emitting apparatus according to at least one aspect of the first to twelfth aspects further includes blue light with a peak wavelength in a range of 430 to 470 nm, inclusive.

The light-emitting apparatus according to the thirteenth aspect includes the solid-state light source that can emit green light and blue light and can therefore exhibit good color rendering properties and color reproducibility.

In a fourteenth aspect, for example, the solid-state light source of the light-emitting apparatus according to the thirteenth aspect may include a GaN semiconductor laser that emits the blue light and a YAG:Nd solid-state laser that emits the green light and that includes a second harmonic generator.

The light-emitting apparatus according to the fourteenth aspect can produce high power.

Embodiments of the Present Disclosure

The embodiments of the present disclosure will be described in detail below. It goes without saying that the present disclosure is not limited to these embodiments, and these embodiments may be modified within the technical scope of the present disclosure. The same or substantially the same constituents are denoted by the same reference numerals and letters and will not be described again.

First Embodiment

A first embodiment describes an embodiment of a light-emitting apparatus according to the present disclosure.

The light-emitting apparatus according to the first embodiment includes a solid-state light source and a wavelength convertor, which converts the wavelength of output light emitted from the solid-state light source. The solid-state light source emits at least green light. The green light has a peak wavelength in the range of 480 to 550 nm, desirably 510 to 540 nm. The wavelength convertor contains at least a red phosphor including Ce as a luminescent center. The red phosphor has an emission spectrum with a peak wavelength in the range of 600 to 700 nm.

The red phosphor including the Ce luminescent center for use in the light-emitting apparatus according to the first embodiment (hereinafter also referred to as the "red phosphor in the first embodiment") will be described below.

The red phosphor in the first embodiment contains a host material and Ce as the luminescent center. The host material may contain Y or a lanthanoid element other than Ce. The host material may be a nitride or an oxynitride. The host material may have a tetragonal crystal structure. Furthermore, the host material may contain an oxide or may be an oxide. Sulfide phosphors are likely to be hydrolyzed and produce hydrogen sulfide. Thus, it is difficult to use sulfide phosphors from a practical standpoint. By contrast, many oxide, oxynitride, and nitride phosphors are stable in the air. Nitride phosphors require heat treatment in a high-pressure atmosphere and require large-scale facilities. On the other hand, oxides can be synthesized by firing in the air, require a simple synthesis process, and can be produced at low cost.

The red phosphor in the first embodiment may contain a crystal phase having the chemical composition of $Ce_xM_{3-x-y}\beta_{6\gamma 11-z}$, for example. The red phosphor containing the crystal phase having the chemical composition of $Ce_xM_{3-x-y}\beta_{6\gamma 11-z}$ is hereinafter also referred to as the red phosphor of a first example in the first embodiment. The variable x satisfies $0 < x \leq 0.6$. Since x is more than 0, Ce can emit light. In order to increase emission intensity, x is desirably 0.0003 or more, more desirably 0.015 or more. The maximum value of x is not particularly limited as long as the phosphor can emit light. However, an excessively large x results in low emission intensity due to concentration quenching. Thus, the decrease in emission intensity can be reduced when x is 0.6 or less. In order to increase emission intensity, x is desirably 0.3 or less, more desirably 0.15 or less.

M denotes one or two or more rare-earth elements other than Ce. More specifically, M denotes one or two or more elements selected from the group consisting of Sc, Y, La, Pr, Nd, Sm, Eu, Gd, Tb, Dy, Ho, Er, Tm, Yb, and Lu. M may contain 90% or more by mole La. The element group other than La has an ionic radius close to that of La and therefore can occupy the M site.

The variable y satisfies $0 \leq y \leq 1.0$. When y is 1.0 or less, the structure of the crystal phase can be stabilized.

$\beta$ includes Si in an amount of not less than 50% by mole of the total amount of Si. More specifically, $\beta$ is Si alone, or includes Si in an amount of equal to or more than 50% by mole and less than 100% by mole and other element(s) in an amount of not more than 50% by mole. For example, $\beta$ may include one or two elements selected from the group consisting of Al and Ga. $(100x/6)\%$ or more by mole of $\beta$ may be the one or two elements. Thus, the amount of the one or two elements in $Ce_xM_{3-x-y}\beta_{6\gamma 11-z}$ may be greater than or equal to the amount of Ce. Furthermore, $(300x/6)\%$ or more by mole of $\beta$ may be the one or two elements. Thus, the amount of the one or two elements in $Ce_xM_{3-x-y}\beta_{6\gamma 11-z}$ may be at least three times the amount of Ce. $\beta$ may further include other element(s) as long as the phosphor can emit light.

$\gamma$ includes N in an amount of not less than 80% by mole of the total amount of N. More specifically, $\gamma$ is N alone, or includes N in an amount of equal to or more than 80% by mole and less than 100% by mole and other element(s) in an amount of not more than 20% by mole. For example, $\gamma$ may include oxygen (O). For example, substitution of Al (or Ga) at part of the Si sites around Ce or substitution of O at part of the N sites results in low symmetry of a ligand of Ce and emission of light with a longer wavelength.

The variable z satisfies $0 \leq z \leq 1.0$. A loss of N (that is, z of more than 0) results in low symmetry of a ligand of Ce and emission of light with a longer wavelength. When z is 1.0 or less, the structure of the crystal phase can be stabilized.

The red phosphor of the first example in the first embodiment has an emission spectrum with the maximum peak in the wavelength range of 600 to 800 nm. The maximum peak herein refers to the peak with the maximum value of the spectrum. A peak of the emission spectrum appears upon excitation at a wavelength of 535 nm, for example.

The red phosphor of the first example in the first embodiment has an excitation spectrum with a first peak in the wavelength range of 500 to 600 nm. The red phosphor of the first example in the first embodiment may have an excitation spectrum with an additional second peak with a wavelength of 350 nm or more and less than 500 nm. The first or second peak may be the maximum peak of the excitation spectrum.

The red phosphor of the first example in the first embodiment may have a 1/e emission lifetime of 100 ns or less. The emission lifetime has an influence on the luminance saturation characteristics. Phosphors containing Eu, such as a known red phosphor CASN:Eu, have a longer emission lifetime than phosphors containing Ce. Thus, phosphors containing Eu are likely to reach luminance saturation due to a decrease in quantum efficiency during high-energy excitation. Thus, the phosphor including the Ce luminescent center of the first embodiment is expected to be a red phosphor with higher quantum efficiency than known red phosphors even at high power.

The crystal phase having the chemical composition of $Ce_xM_{3-x-y}\beta_{6\gamma11-z}$ in the red phosphor of the first example in the first embodiment may be a tetragonal crystal. The crystal phase may contain a region with a space group P4bm (#100). The crystal phase of the red phosphor of the first example in the first embodiment may have almost the same crystal structure as a crystal represented by the general formula $La_3Si_6N_{11}$.

The red phosphor of the first example in the first embodiment may have diffraction peaks at (1) $2\theta=17.8$ to 18.8 degrees, (2) $2\theta=26.2$ to 27.2 degrees, (3) $2\theta=27.2$ to 28.2 degrees, (4) $2\theta=30.5$ to 31.5 degrees, (5) $2\theta=32.8$ to 33.8 degrees, and (6) $2\theta=35.8$ to 36.8 degrees in an X-ray diffraction pattern with Cu-K$\alpha$ radiation. These diffraction peaks may have Miller indices (001), (211), (310), (221), (311), and (410), respectively.

The crystal phase of the red phosphor of the first example in the first embodiment may have the following characteristics in XAFS measurement. In an EXAFS radial distribution function spectrum of the K absorption edge of Ce, the first neighbor shell of Ce may have a lower peak height than the second neighbor shell of Ce. The peak height of the first neighbor shell may be 0.8 to 0.9 times the peak height of the second neighbor shell.

The coordination number of the first neighbor shell of Ce obtained from the EXAFS radial distribution function spectrum of the K absorption edge of Ce may be seven coordination. In this case, for example, the coordination structure around Ce has a nitrogen defect around an A site of La in $La_3Si_6N_{11}$ and may be a coordination structure of seven coordination with low symmetry. A known crystal represented by the general formula $La_3Si_6N_{11}$ has a coordination structure of eight coordination with high symmetry. Thus, in the coordination structure of seven coordination with low symmetry, larger splitting of the 5d orbital and a smaller energy difference between the 5d orbital and the 4f orbital can induce the emission of light with a longer wavelength than before.

The crystal phase may be a crystal phase represented by the chemical composition of $Ce_xM_{3-x-y}Si_{6-q}A_qN_{11-z}$, for example. M may be one or two or more elements selected from the group consisting of Sc, Y, La, Pr, Nd, Sm, Eu, Gd, Tb, Dy, Ho, Er, Tm, Yb, and Lu. A may be one or two elements selected from the group consisting of Al and Ga. The variable x may satisfy $0<x\leq0.6$. The variable y may satisfy $0\leq y\leq1.0$. The variable z may satisfy $0\leq z\leq1.0$. The variable q may satisfy $x\leq q\leq3.0$. When A denotes Al alone, q may satisfy $0<q\leq2.0$.

In the red phosphor in the first embodiment, for example, M of the chemical composition of $Ce_xM_{3-x}Si_{6-q}Al_qN_{11-z}$ may be La alone. Thus, the red phosphor in the first embodiment may contain a crystal phase having the chemical composition of $Ce_xLa_{3-x}Si_{6-q}Al_qN_{11-z}$. In this chemical composition, q may satisfy $0<q\leq2.0$.

In the chemical composition of $Ce_xM_{3-x}Si_{6-q}Al_qN_{11-z}$ of the red phosphor in the first embodiment, for example, M may be Y alone or Y and La, q may be 0, and z may be 0. Thus, the red phosphor in the first embodiment may contain a crystal phase having the chemical composition of $Ce_xY_pLa_{3-q}Si_qN_{11}$. In this chemical composition, p may satisfy $(1.5-x)\leq p\leq(3-x)$.

Method for Producing Red Phosphor of First Example in First Embodiment

A method for producing a red phosphor containing the crystal phase represented by the chemical composition of $Ce_xM_{3-x-y}Si_{6-q}Al_qN_{11-z}$ as an example of the red phosphor of the first example in the first embodiment will be described below. In the following description, M denotes La. For example, a compound(s) containing Ce, La, Si, and Al may be used as a raw material. Al may be replaced by Ga. Alternatively, Ce alone, La alone, Si alone, and Al alone may be used as raw materials. Al alone may be replaced by Ga alone. The compound may be a compound that can be converted into a nitride by firing in a nitrogen atmosphere, a high-purity (purity of 99% or more) nitride, or a metal alloy. A small amount of fluoride (such as ammonium fluoride) may be added to promote the reaction.

For example, a Ce compound, a La compound, and a Si compound may be prepared at a chemical composition ratio represented by $Ce_xLa_{3-x-y}Si_6N_{11-z}$ ($0<x\leq0.6$, $0\leq y\leq1.0$, and $0\leq z\leq1.0$). Furthermore, an Al compound (or Al alone) may also be prepared. The Si compound may be replaced by Si alone. Specific raw materials may be a $CeF_3$ powder, a LaN powder, a $Si_3N_4$ powder, and an AlN powder, for example. The $CeF_3$ powder may be replaced by a CeN powder. The $Si_3N_4$ powder may be replaced by a powder of Si alone. The AlN powder may be replaced by a powder of Al alone. The amount of the LaN powder may be approximately 24% more than the theoretical value. LaN is likely to be decomposed during firing, and the addition of excess LaN in the preparation of the raw materials can reduce the production of a by-product $LaSi_3N_5$ crystals.

A phosphor is produced by firing a mixture of the raw materials. The raw materials may be mixed by wet blending in a solution or by dry blending of dry powders. Industrially commonly used ball mills, medium stirring mills, planetary mills, vibrating mills, jet mills, V-type mixers, and agitators may be used. The firing is performed in a high-pressure nitrogen atmosphere at a temperature in the range of 1500° C. to 2000° C. for approximately 1 to 50 hours. The pressure is typically 3 atm or more, desirably 4 atm or more, more desirably 8 atm or more. After firing, the phosphor may be washed in a 10% nitric acid solution for 1 hour, for example. The resulting phosphor powder may be ground again in a ball mill or a jet mill and, if necessary, may be washed or classified to adjust the particle size distribution and flowability of the phosphor powder.

The red phosphor in the first embodiment will be further described below. The following also describes how the present inventors have developed the red phosphor.

<Principle of Light Emission of Rare-Earth Phosphor>

The following describes how the present inventors have studied the principle of light emission of a rare-earth phosphor and have focused on a $Ce^{3+}$ phosphor.

The divalent or trivalent ions of Ce, Pr, Nd, Pm, Sm, Eu, Gd, Tb, Dy, Ho, Er, Tm, and Yb of rare-earth elements have a valence electron in the 4f orbital. Among these, most of the rare-earth ions have multiple electrons in the 4f orbital and, as conceptually illustrated in FIG. 1A, lifting of the 4f orbital degeneracy causes large splitting of the 4f orbital. Thus, transition from one 4f level to another 4f level (f-f transition) can be utilized to emit light. Because the f-f transition is forbidden transition, excited electrons characteristically have a long life. Thus, phosphors containing a rare-earth ion are often used as laser media. When such phosphors are used in incoherent light sources, such as general illumination, however, the emission intensity is immediately saturated.

Figure 1B:
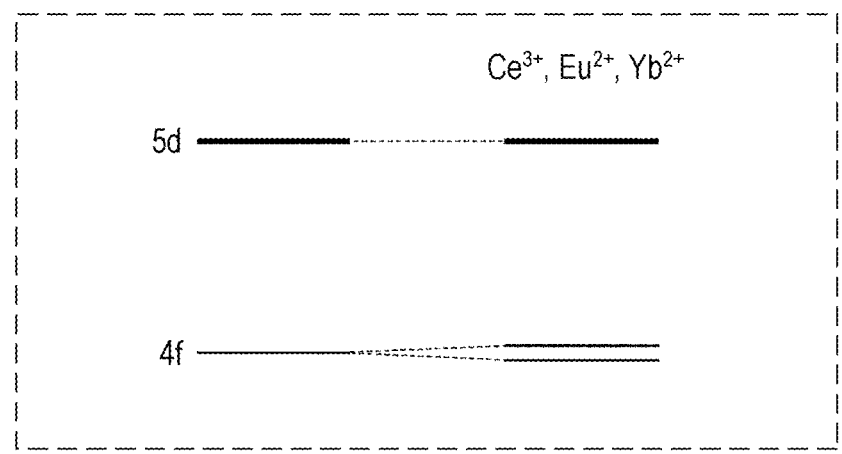
FIG. 1B is a schematic view of splitting of the 4f orbital and the 5d orbital of $Ce^{3+}$, $Eu^{2+}$, and $Yb^{2+}$.

$Ce^{3+}$ has only one valence electron in the 4f orbital. Thus, as conceptually illustrated in FIG. 1B, splitting of the 4f orbital is much smaller in $Ce^{3+}$ than in other rare-earth ions. Exceptionally, energy splitting of the 4f orbital in $Eu^{2+}$ and $Yb^{2+}$ is also small. This is because $Eu^{2+}$ has a semiclosed shell with seven electrons in the 4f orbital, and $Yb^{2+}$ has a closed shell with 14 electrons in the 4f orbital.

Due to the small splitting of the 4f orbital, $Ce^{3+}$, $Eu^{2+}$, and $Yb^{2+}$ have a large energy difference between the 4f ground level and the 5d orbital. Furthermore, there is no 4f orbital with large energy between the 4f ground level and the 5d orbital. Thus, transition between 4f and 5d (4f-5d transition) can be easily utilized.

The 4f-5d transition is allowed transition, and excited electrons therefore have short lives. Thus, excitation immediately induces light emission, and even excitation with strong excitation light is less likely to cause saturation (luminance saturation).

The present inventors have further focused on $Ce^{3+}$ out of $Ce^{3+}$, $Eu^{2+}$, and $Yb^{2+}$. $Ce^{3+}$ has only one electron involved in 4f-5d transition, and the 4f orbitals are completely vacant during transition from the 5d excited state to the 4f ground state; that is, the 4f orbital involved in transition has a high state density. Thus, the present inventors thought that $Ce^{3+}$ has the shortest emission lifetime. By contrast, $Eu^{2+}$ has six electrons in 4f after excitation of an electron to 5d, and $Yb^{2+}$ has 13 electrons remaining in 4f after excitation of an electron to 5d. Thus, $Eu^{2+}$ and $Yb^{2+}$ have a low state density in the 4f orbital and are expected to have a longer emission lifetime than $Ce^{3+}$. Thus, $Ce^{3+}$ phosphors have the shortest emission lifetimes among the rare-earth elements and are less likely to reach luminance saturation. Actually, YAG:Ce has a 1/e emission lifetime of approximately 70 ns, and CASN:Eu has a 1/e emission lifetime in the range of approximately 600 to 800 ns.

On the basis of these considerations, $Ce^{3+}$ phosphors are superior to $Eu^{2+}$ phosphors. Actually, almost all commercially available white LEDs include YAG:Ce. However, CASN:Eu is widely used as a red phosphor. The present inventors think that this is because $Ce^{3+}$ phosphors with red-light emission are difficult to develop, and promising materials have not been found. The reason for that and the principle that determines the emission wavelength will be described below.

<Emission Wavelength of Phosphor>

Phosphors with a $Ce^{3+}$ luminescent center and phosphors with a $Eu^{2+}$ luminescent center utilize transition from the ground state of the 4f orbital to the excited state of the 5d orbital (4f-5d transition). $Ce^{3+}$ and $Eu^{2+}$ introduced into a host crystal for a phosphor are mainly affected by the nearest bonded anion atom (ligand), and the energy of the 4f and 5d orbitals and the emission wavelength are changed. Thus, the emission wavelength of the phosphor depends on the host crystal.

Figure 2:
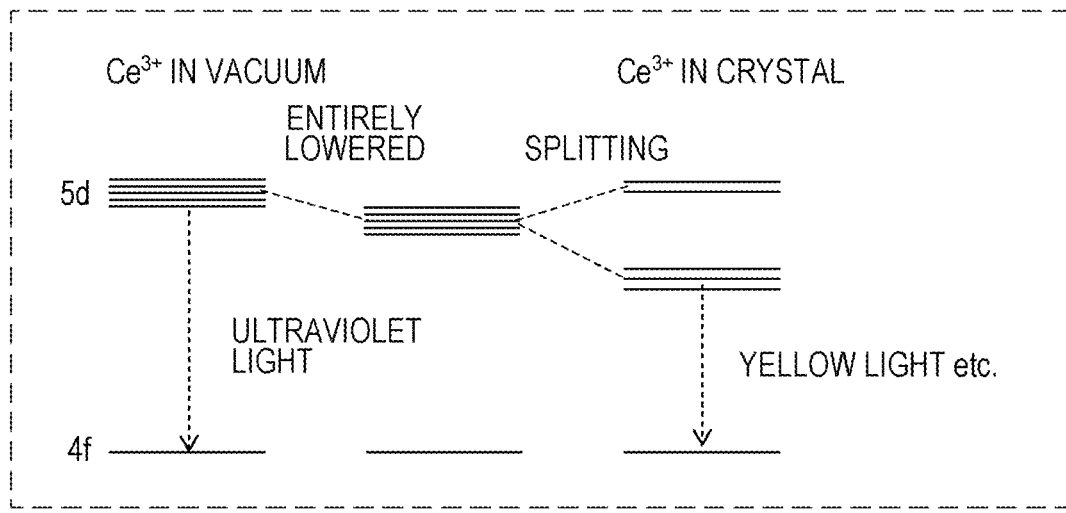
FIG. 2 is an energy level diagram of $Ce^{3+}$ in a vacuum and in a crystal.

The influence of the ligand includes the energy shift of the 4f or 5d orbital and the lifting of degeneracy of five levels of the 5d orbital (that is, splitting of the 5d orbital). The energy shift depends greatly on the expansion of the wave function of the 4f or 5d orbital and the positional relationship of the ligand. In the splitting of the 5d orbital, as illustrated in FIG. 2, the 5d orbital splits while the total energy of the five levels of the 5d orbital is maintained. Thus, an increase in the energy of one level is associated with a decrease in the energy of another level. Thus, splitting of the 5d orbital can be enlarged to decrease the lowest energy of the 5d orbital.

As illustrated in FIG. 2, light emission due to 4f-5d transition is caused by transition from the lowest energy level of the 5d orbital to 4f. Thus, $Ce^{3+}$ or $Eu^{2+}$ can be introduced into the crystal to decrease the 4f-5d energy difference and to increase the emission wavelength.

Although $Ce^{3+}$ in a vacuum (that is, not introduced into the crystal) has a large 4f-5d energy difference and emits light in a deep ultraviolet region, $Eu^{2+}$ emits blue light. Thus, $Eu^{2+}$ can emit red light with a smaller long-wavelength shift, and CASN:Eu is practically used. Practically used $Ce^{3+}$ phosphors having the longest wavelength are yellow phosphors YAG:Ce. Practically used $Ce^{3+}$ red phosphors have not been developed.

<Studied by the Present Inventors>

Figure 3:
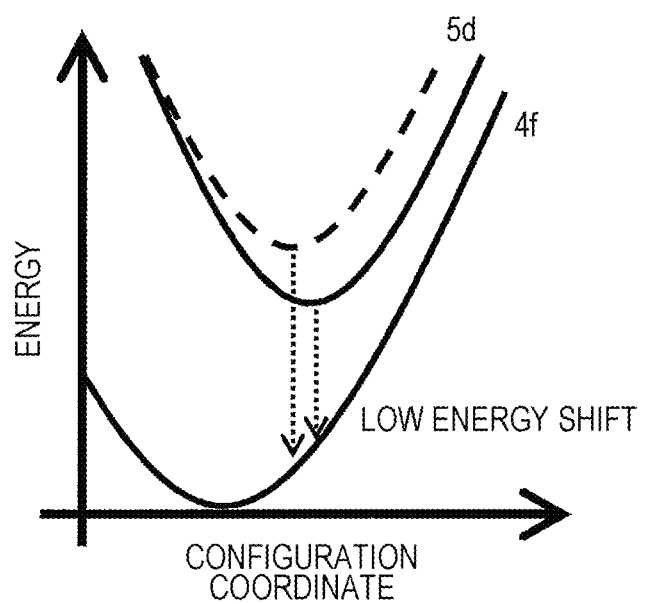
FIG. 3 is a configuration coordinate model diagram between the 4f orbital and the 5d orbital.

The present inventors have conducted studies considering that the 5d orbital or the 4f orbital is needed to be shifted to develop a Ce red phosphor, as illustrated in FIG. 3.

In order to shift the 5d orbital or the 4f orbital, it should be important for a ligand of $Ce^{3+}$ to satisfy (1) the short ligand distance and (2) low symmetry of the ligand.

Regarding (1), a short ligand distance between $Ce^{3+}$ and its nearest anion results in a large influence of the orbital of the anion on the 4f orbital, the 5d orbital, or both and a large energy shift of the 4f orbital, the 5d orbital, or both. This results in an increase in the energy of the 4f orbital or a decrease in the lowest energy level of the 5d orbital due to large splitting of the 5d orbital. These effects decrease the 4f-5d energy difference. Regarding (2), low symmetry of the ligand results in stabilization of the 5d orbital, which has a wave function extending in a direction in which no ligand exists. This decreases the 4f-5d energy difference.

On the basis of these guidelines, the present inventors have searched for a new material. More specifically, the present inventors examined the calculation of the emission wavelength by crystal structure simulation. Through these approaches, the present inventors have found new red phosphors that exhibit red. These approaches will be described below.

<Calculation of Emission Wavelength of Ce Phosphor>

In order to determine the relationship between the emission wavelength and the excitation wavelength of a phosphor including Ce as a luminescent center, the present inventors simulated the relationship between the emission wavelength and the excitation wavelength of various crystals doped with Ce. The results and discussion of the crystal structure simulation will be described below.

The present inventors calculated the emission wavelength using a technique described in the literature "Y Jia et al., Physical Review B 93, 155111 (2016)". In the technique, the excitation wavelength is calculated from the difference between the total energy at the equilibrium point of the ground state and the total energy of the excited state on the atomic coordinates. In the technique, the emission wavelength is calculated from the difference between the total energy at the equilibrium point at which the excited state is relaxed and the total energy of the ground state on the atomic coordinates. According to the literature, the calculated emission wavelengths and excitation wavelengths of three phosphors YAG:Ce, $LaSi_3N_5$:Ce, and $La_3Si_6N_{11}$:Ce agree well with experimental values. The present inventors calculated the emission wavelength and the excitation wavelength of $YAlO_3$:Ce as well as $LaSi_3N_5$:Ce and $La_3Si_6N_{11}$:Ce and confirmed that the calculation can precisely reproduce the experimental results as in the literature. Table 1 lists the excitation wavelength and the emission wavelength of each phosphor determined by the simulation.

TABLE 1

| | Chemical composition | | |
|---|---|---|---|
| | $(Y,Ce)AlO_3$ | $(La,Ce)Si_3N_5$ | $(La_3,Ce)Si_6N_{11}$ |
| Excitation wavelength (nm) | 310 | 366 | 470 |
| Emission wavelength (nm) | 349 | 445 | 543 |
| <New Composition $(La,Y)_3Si_6N_{11}$:Ce Phosphor> | | | |

First, the present inventors intended to substitute $Y^{3+}$ at a $La^{3+}$ site of $La_3Si_6N_{11}$:Ce to shorten the ligand distance.

$Y^{3+}$ has a smaller ionic radius than $La^{3+}$. Thus, substitution of $Y^{3+}$ at a $La^{3+}$ site can decrease the lattice constant. A decrease in lattice constant is expected to shorten the ligand distance.

Figure 4:
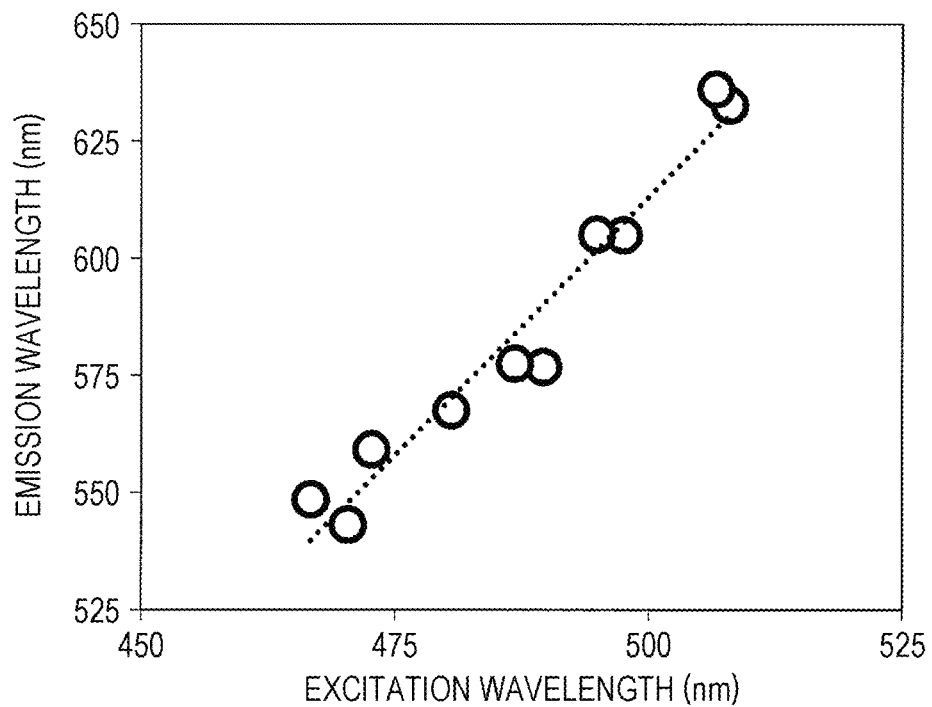
FIG. 4 is a graph showing the relationship between the excitation wavelength and the emission wavelength of a $(La,Y)_3Si_6N_{11}:Ce$ phosphor.
Figure 5:
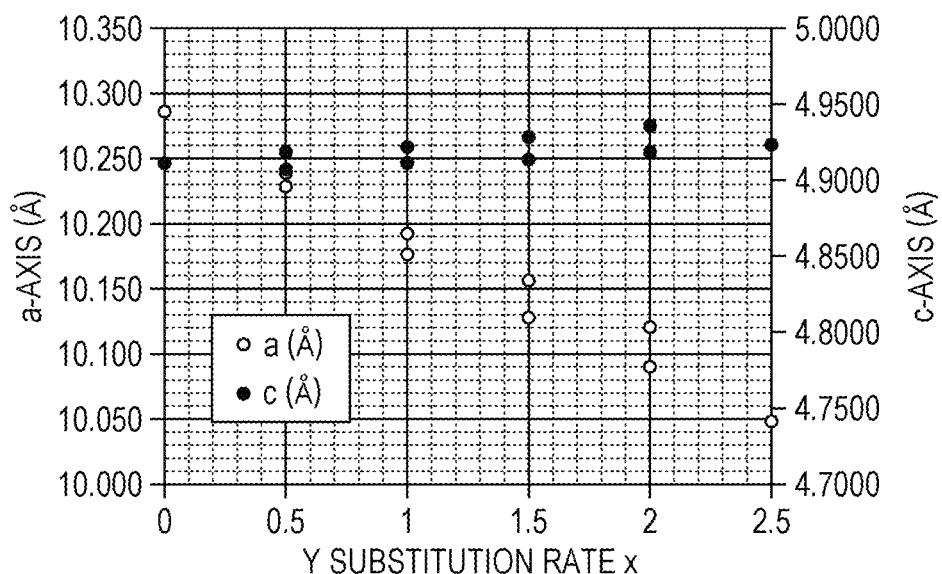
FIG. 5 is a graph showing the relationship between the $Y^{3+}$ substitution rate x and the lattice constant of the a-axis and the relationship between the $Y^{3+}$ substitution rate x and the lattice constant of the c-axis of the $(La,Y)_3Si_6N_{11}:Ce$ phosphor.
Figure 6:
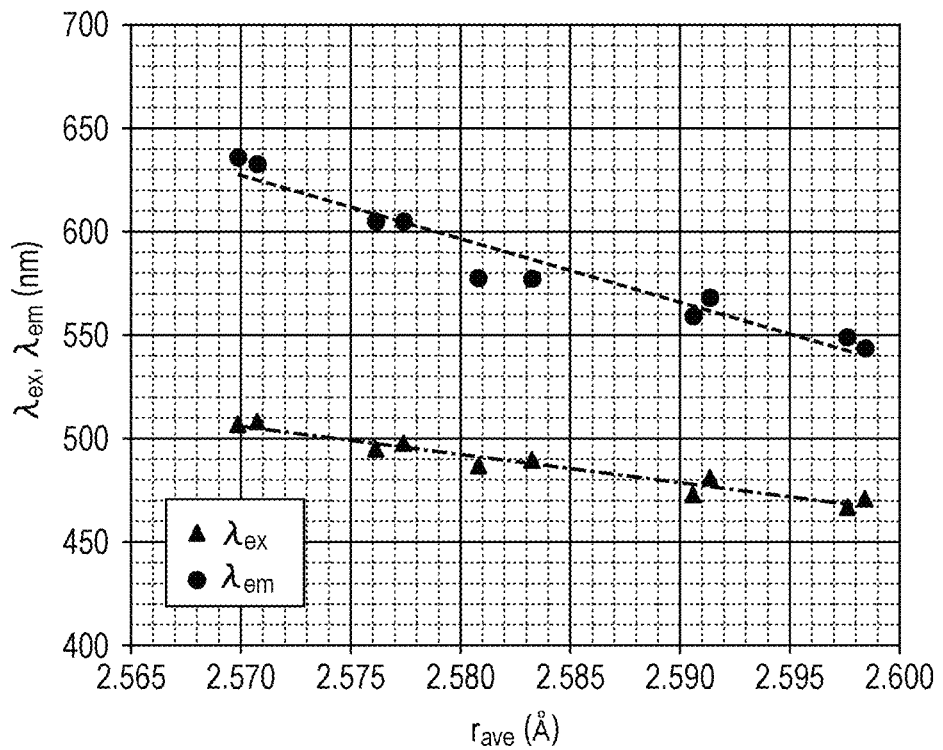
FIG. 6 is a graph showing the relationship between the average coordination distance $r_{ave}$ and the excitation wavelength $\lambda_{ex}$ and the relationship between the average coordination distance $r_{ave}$ and the emission wavelength $\lambda_{em}$ of the $(La,Y)_3Si_6N_{11}:Ce$ phosphor.
Figure 7:
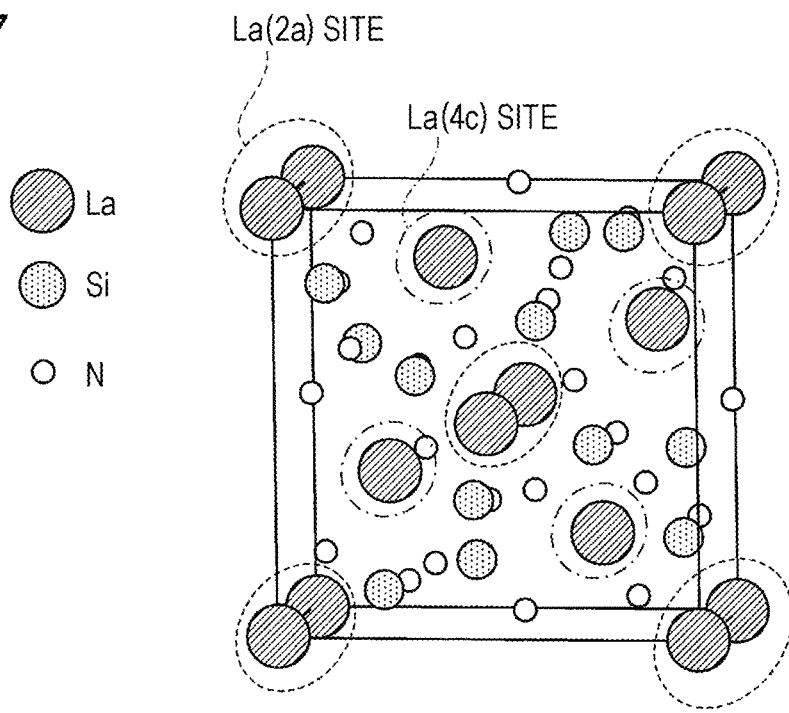
FIG. 7 is a schematic view of a $La_3Si_6N_{11}$ crystal structure and two different sites of La.
Figure 8A:
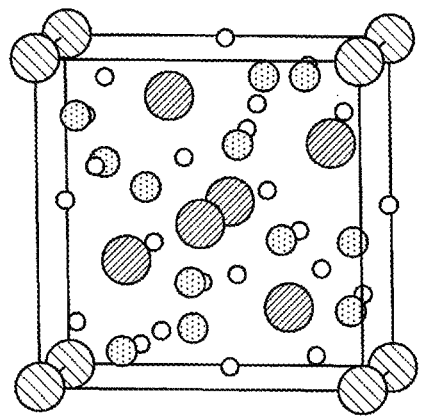
FIG. 8A is a schematic view of the crystal structure of a sample No. 1 of the $(La,Y)_3Si_6N_{11}:Ce$ phosphor.
Figure 8B:
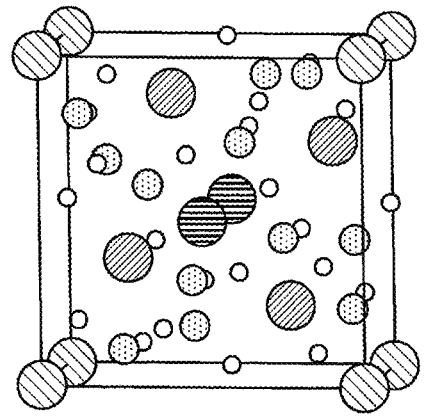
FIG. 8B is a schematic view of the crystal structure of a sample No. 2 of the $(La,Y)_3Si_6N_{11}:Ce$ phosphor.
Figure 8C:
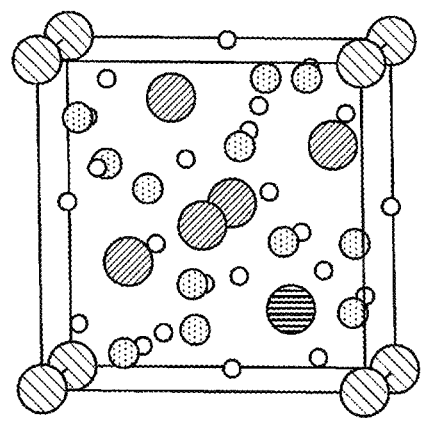
FIG. 8C is a schematic view of the crystal structure of a sample No. 3 of the $(La,Y)_3Si_6N_{11}:Ce$ phosphor.
Figure 8D:
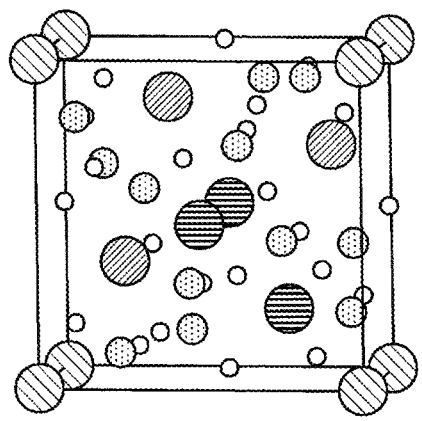
FIG. 8D is a schematic view of the crystal structure of a sample No. 4 of the $(La,Y)_3Si_6N_{11}:Ce$ phosphor.
Figure 8E:
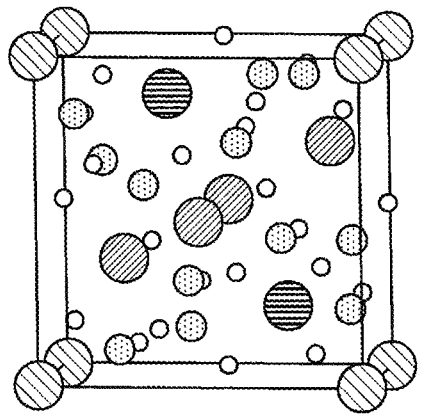
FIG. 8E is a schematic view of the crystal structure of a sample No. 5 of the $(La,Y)_3Si_6N_{11}:Ce$ phosphor.
Figure 8F:
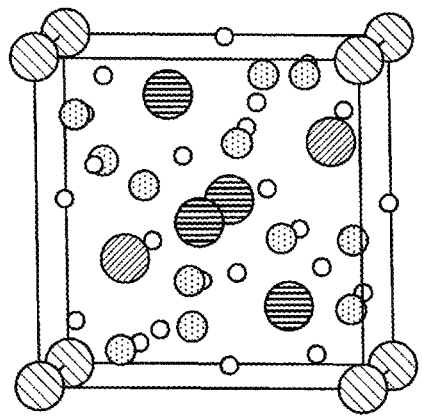
FIG. 8F is a schematic view of the crystal structure of a sample No. 6 of the $(La,Y)_3Si_6N_{11}:Ce$ phosphor.
Figure 8G:
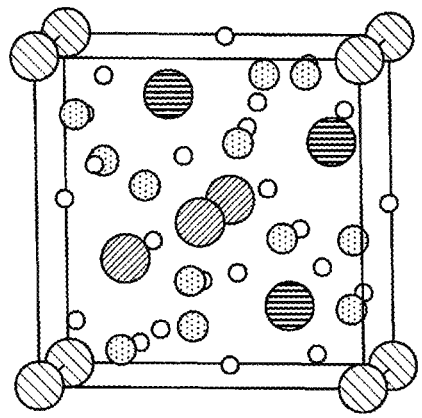
FIG. 8G is a schematic view of the crystal structure of a sample No. 7 of the $(La,Y)_3Si_6N_{11}:Ce$ phosphor.
Figure 8H:
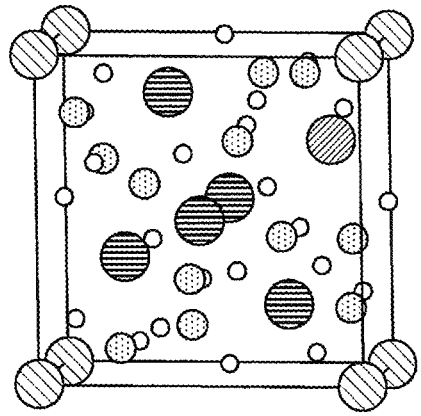
FIG. 8H is a schematic view of the crystal structure of a sample No. 8 of the $(La,Y)_3Si_6N_{11}:Ce$ phosphor.
Figure 8I:
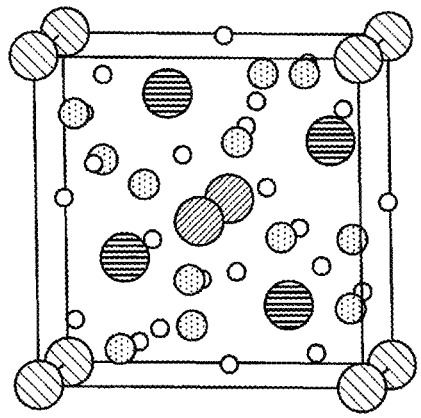
FIG. 8I is a schematic view of the crystal structure of a sample No. 9 of the $(La,Y)_3Si_6N_{11}:Ce$ phosphor.
Figure 8J:
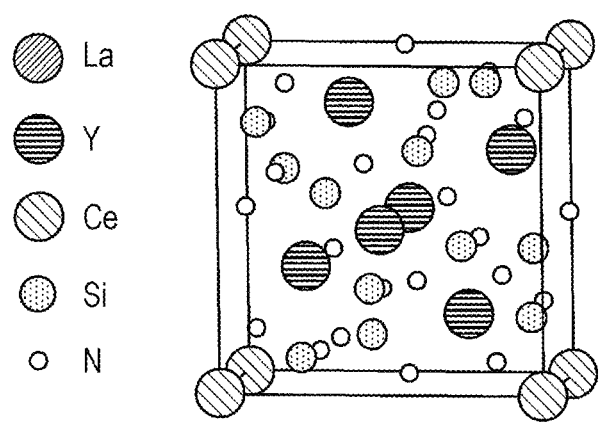
FIG. 8J is a schematic view of the crystal structure of a sample No. 10 of the $(La,Y)_3Si_6N_{11}:Ce$ phosphor.
Figure 9:
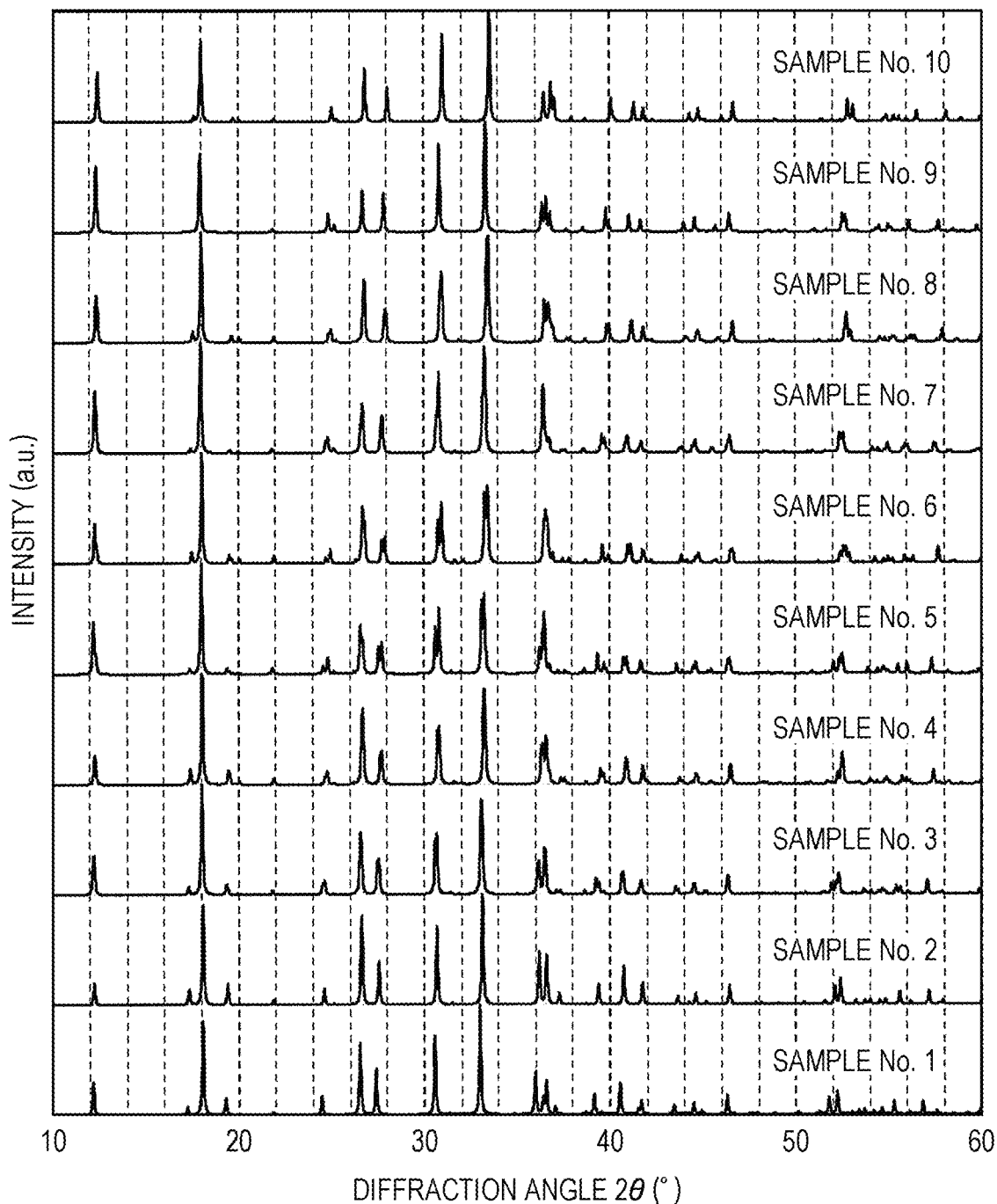
FIG. 9 is a graph of powder XRD diffraction patterns calculated from the crystal structures of the phosphors of the samples No. 1 to No. 10 illustrated in FIGS. 8A to 8J.

A new composition $(La,Y)_3Si_6N_{11}$:Ce phosphor was studied by the calculation technique. The phosphor of this composition includes substitution of $Y^{3+}$ at a $La^{3+}$ site of $La_3Si_6N_{11}$:Ce. $Y^{3+}$ has a smaller ionic radius than $La^{3+}$. Thus, the ligand distance of $Ce^{3+}$ is smaller in $(La,Y)_3Si_6N_{11}$ than in $La_3Si_6N_{11}$. This is expected to increase the emission wavelength. Table 2 shows the calculation results of the average coordination distance $r_{ave}$ between Ce and N, the excitation wavelength $\lambda_{ex}$, and the emission wavelength $\lambda_{em}$ with different $Y^{3+}$ substitution rates. FIG. 4 is a graph showing the relationship between the excitation wavelength and the emission wavelength. FIG. 5 shows the relationship between the $Y^{3+}$ substitution rate x and the lattice constant of the a-axis and the relationship between the $Y^{3+}$ substitution rate x and the lattice constant of the c-axis. FIG. 6 shows the relationship between the average coordination distance $r_{ave}$ and the excitation wavelength $\lambda_{ex}$ and the relationship between the average coordination distance $r_{ave}$ and the emission wavelength $\lambda_{em}$. FIG. 7 illustrates a $La_3Si_6N_{11}$ crystal structure and two different sites of La. In FIG. 7, La(2a) sites are indicated by broken lines, and La(4c) sites are indicated by dash-dot lines. FIGS. 8A to 8J illustrate the crystal structures of samples No. 1 to No. 10. FIG. 9 shows powder XRD diffraction patterns calculated from the crystal structures of the samples No. 1 to No. 10. The symbol * in Table 2 shows that the sample is a comparative example. In the column "Y substitution site and substitution rate" of Table 2, the Y substitution site and the substitution rate are represented by "Y substitution site←Y substitution rate".

TABLE 2

| Sample No. | Composition formula | Y substitution site and substitution rate | $r_{ave}$ (Å) | $\lambda_{ex}$ (nm) | $\lambda_{em}$ (nm) |
|---|---|---|---|---|---|
| *1 | $(La_{2.5},Ce_{0.5})Si_6N_{11}$ | — | 2.5984 | 470 | 543 |
| *2 | $(La_2,Y_{0.5},Ce_{0.5})Si_6N_{11}$ | La(2a)←$Y_{0.5}$ | 2.5976 | 467 | 549 |
| *3 | $(La_2,Y_{0.5},Ce_{0.5})Si_6N_{11}$ | La(4c)←$Y_{0.5}$ | 2.5913 | 481 | 568 |
| *4 | $(La_{1.5},Y_1,Ce_{0.5})Si_6N_{11}$ | La(2a)←$Y_{0.5}$, La(4c)←$Y_{0.5}$ | 2.5905 | 473 | 559 |
| *5 | $(La_{1.5},Y_1,Ce_{0.5})Si_6N_{11}$ | La(4c)←$Y_1$ | 2.5832 | 490 | 577 |
| *6 | $(La_1,Y_{1.5},Ce_{0.5})Si_6N_{11}$ | La(2a)←$Y_{0.5}$, La(4c)←$Y_1$ | 2.5808 | 487 | 578 |
| 7 | $(La_1,Y_{1.5},Ce_{0.5})Si_6N_{11}$ | La(4c)←$Y_{1.5}$ | 2.5774 | 498 | 605 |
| 8 | $(La_{0.5},Y_2,Ce_{0.5})Si_6N_{11}$ | La(2a)←$Y_{0.5}$, La(4c)←$Y_{1.5}$ | 2.5761 | 495 | 605 |
| 9 | $(La_{0.5},Y_2,Ce_{0.5})Si_6N_{11}$ | La(4c)←$Y_2$ | 2.5707 | 508 | 633 |
| 10 | $(Y_{2.5},Ce_{0.5})Si_6N_{11}$ | La(2a)←$Y_{0.5}$, La(4c)←$Y_2$ | 2.5698 | 507 | 636 |

Table 2 and FIG. 4 show that the emission wavelength tends to increase with the $Y^{3+}$ substitution rate. The excitation peak wavelength also increases with the emission wavelength. In the compositions of the samples 7 to 10 that emit red light at an emission wavelength of 600 nm or more, the peak excitation wavelength is in a green region of 490 nm or more. As is clear from FIG. 5, an increase in $Y^{3+}$ substitution rate results in a decrease in the lattice constant of the a-axis and an increase in the lattice constant of the c-axis. As is clear from Table 2 and FIG. 6, an increase in $Y^{3+}$ substitution rate results in a decrease in the average coordination distance $r_{ave}$ between Ce and N, and a decrease in $r_{ave}$ results in an increase in emission wavelength and excitation wavelength.

$Eu^{2+}$ has a much longer emission lifetime than $Ce^{3+}$. The emission lifetime correlates with the 4f-5d transition probability of $Eu^{2+}$ and $Ce^{3+}$, and a longer emission lifetime results in a lower transition probability. Thus, the excitation probability of 4f-5d transition of $Eu^{2+}$ is much lower than the excitation probability of 4f-5d transition of $Ce^{3+}$. However, the 5d excitation level of $Eu^{2+}$ is likely to overlap the conduction band of the host material $((La,Y)_3Si_6N_{11})$. This enables efficient energy absorption between the 4f ground level of $Eu^{2+}$ and the conduction band of the host material. The absorbed energy corresponds to energy in a blue light region. $Eu^{2+}$ has seven electrons in the 4f orbital. Each of the electrons has a wide energy level, and $Eu^{2+}$ therefore has a broad excitation wavelength. Thus, a red phosphor with a $Eu^{2+}$ luminescent center has a broad excitation wavelength with a peak in a blue region. Thus, a light source containing the red phosphor with the $Eu^{2+}$ luminescent center includes an excitation light source that can emit blue light with the highest absorption efficiency.

By contrast, the 5d excitation level of a phosphor with a $Ce^{3+}$ luminescent center is less likely to overlap the conduction band of the host material. Energy absorption between the 4f ground level and the conduction band of the host material is therefore not expected. Thus, 4f-5d transition is main energy absorption.

On the basis of the study results, the present inventors proved that the energy difference in 4f-5d transition of a red phosphor with $Ce^{3+}$ corresponds to the energy difference in a green light region. Thus, a red phosphor with $Ce^{3+}$ has higher absorption efficiency with an excitation light source of green light than with an excitation light source of blue light. The use of green light can increase light output. A method for converting green light to red light according to the present application can have a smaller energy conversion loss (e.g., Stokes' loss) and can emit higher-power light than a known method for converting blue light to red light.

From these results, the present inventors have developed a new red phosphor containing a crystal phase having the chemical composition of $Ce_xY_pLa_{3-x-p}Si_6N_{11}$, where $0<x\le0.6$ and $(1.5-x)\le p\le(3-x)$ are satisfied. This new red phosphor is hereinafter referred to as a red phosphor of a second example in the first embodiment and will be described in detail below.

In the chemical composition of the red phosphor of the second example in the first embodiment, x satisfies $0<x\le0.6$. Since x is more than 0, Ce can emit light. In order to increase emission intensity, x is desirably 0.0003 or more, more desirably 0.015 or more. The maximum value of x is not particularly limited as long as the phosphor can emit light. However, an excessively large x results in low emission intensity due to concentration quenching. Thus, the decrease in emission intensity can be reduced when x is 0.6 or less. In order to increase emission intensity, x is desirably 0.3 or less, more desirably 0.15 or less.

In the red phosphor of the second example in the first embodiment, in order to increase the emission wavelength and the excitation wavelength, it is desirable to increase substitution of Y for La. Thus, in the chemical composition of the red phosphor of the second example in the first embodiment, x and p desirably satisfy $(1.5-0.5x)\le p\le(3-x)$, more desirably $1.5\le p\le(3-x)$.

The red phosphor of the second example in the first embodiment has an emission spectrum peak in the wavelength range of 600 to 660 nm. The red phosphor of the second example in the first embodiment may have an emission spectrum peak with a wavelength of 605 nm or more, for example. The red phosphor of the second example in the first embodiment may have an emission spectrum peak with a wavelength of 640 nm or less or an emission spectrum peak with a wavelength of 636 nm or less, for example.

The red phosphor of the second example in the first embodiment has an excitation spectrum peak in the wavelength range of 480 to 550 nm. The red phosphor of the second example in the first embodiment may have an excitation spectrum peak with a wavelength of 490 nm or more or an excitation spectrum peak with a wavelength of 495 nm or more, for example. The red phosphor of the second example in the first embodiment may have an excitation spectrum peak with a wavelength of 530 nm or less or an excitation spectrum peak with a wavelength of 508 nm or less, for example.

When the excitation spectrum peak in the wavelength range of 480 to 550 nm is referred to as a first excitation spectrum peak, the red phosphor of the second example in the first embodiment may further have a second excitation spectrum peak in the wavelength range of 350 nm or more and less than 480 nm. The first or second excitation spectrum peak may be the maximum peak of the excitation spectrum.

The crystal phase of the red phosphor of the second example in the first embodiment may have a lie emission lifetime of 100 ns or less. The emission lifetime has an influence on the luminance saturation characteristics. Phosphors containing Eu, such as a known red phosphor CASN:Eu, have a longer emission lifetime than phosphors containing Ce. Thus, phosphors containing Eu are likely to reach luminance saturation due to a decrease in quantum efficiency during high-energy excitation. Thus, the red phosphor including the Ce luminescent center of the first embodiment is expected to be a red phosphor with higher quantum efficiency than known red phosphors even at high power.

The host material of the red phosphor of the second example in the first embodiment may contain a tetragonal crystal. In other words, a crystal phase having the chemical composition of $Ce_xY_pLa_{3-x-p}Si_6N_{11}$ in the red phosphor of the second example in the first embodiment may have a tetragonal crystal structure. The crystal phase may have almost the same crystal structure as a crystal represented by the general formula $La_3Si_6N_{11}$.

The crystal phase of the red phosphor of the second example in the first embodiment may have a crystal structure in which Ce substitutes at least part of the La(2a) sites of the $La_3Si_6N_{11}$ crystal structure. The crystal phase of the red phosphor of the second example in the first embodiment may have a crystal structure in which Y substitutes at least part of the La(4c) sites of the $La_3Si_6N_{11}$ crystal structure or a crystal structure in which Y substitutes the majority of the La(4c) sites of the $La_3Si_6N_{11}$ crystal structure.

As illustrated in FIG. 7, La in the $La_3Si_6N_{11}$ crystal structure has two coordination states: the La(2a) sites and the La(4c) sites. The La(2a) sites have high symmetry, and the La(4c) sites have low symmetry. For example, substitution of Ce with a large ionic radius for La at a La(2a) site with high symmetry decreases the enthalpy of formation by approximately 48 meV as determined by first principle calculation and is thermodynamically stable. From this standpoint, the crystal phase of the phosphor of the first embodiment desirably has a crystal structure in which Ce substitutes at least part of the La(2a) sites of the $La_3Si_6N_{11}$ crystal structure. Furthermore, for example, substitution of Y for La at a La(4c) site with low symmetry enlarges the splitting of the 5d orbital of Ce due to large lattice distortion. This decreases the energy difference between the 4f orbital and the 5d orbital and can shift the excitation wavelength and the emission wavelength to the long wavelength side. From this standpoint, the crystal phase of the phosphor of the first embodiment desirably has a crystal structure in which Y substitutes at least part of the La(4c) sites of the $La_3Si_6N_{11}$ crystal structure. Furthermore, the crystal phase of the phosphor of the first embodiment more desirably has a crystal structure in which Y substitutes the majority of the La(4c) sites of the $La_3Si_6N_{11}$ crystal structure.

Method for Producing Red Phosphor of Second Example in First Embodiment

A method for producing the red phosphor of the second example in the first embodiment will be described below.

For example, a Ce compound, a La compound, a Si compound, and a Y compound may be used as raw materials, or each of Ce, La, Si, and Y may be used as a raw material. The compound may be a compound that can be converted into a nitride by firing in a nitrogen atmosphere, a high-purity (purity of 99% or more) nitride, or a metal alloy. A small amount of fluoride (such as ammonium fluoride) may be added to promote the reaction.

For example, a Ce compound, a La compound, a Si compound, and a Y compound may be prepared at a chemical composition ratio represented by $Ce_xY_yLa_{3-x-y}Si_6N_{11}$, where $0<x\le0.6$, and $(1.5-x)\le y\le(3-x)$ are satisfied. The Si compound may be replaced by Si alone. Specific raw materials may be a $CeF_3$ powder, a LaN powder, a $Si_3N_4$ powder, and a YN powder, for example. The CeF$_3$ powder may be replaced by a CeN powder. The Si$_3$N$_4$ powder may be replaced by a powder of Si alone. The amount of the LaN powder may be approximately 24% more than the theoretical value. LaN is likely to be decomposed during firing, and the addition of excess LaN in the preparation of the raw materials can reduce the production of a by-product LaSi$_3$N$_5$ crystals.

The red phosphor of the second example in the first embodiment is produced by firing a mixture of the raw materials. The raw materials may be mixed by wet blending in a solution or by dry blending of dry powders. Industrially commonly used ball mills, medium stirring mills, planetary mills, vibrating mills, jet mills, V-type mixers, and agitators may be used. The firing is performed in a high-pressure nitrogen atmosphere at a temperature in the range of 1500° C. to 2000° C. for approximately 1 to 50 hours. The pressure is typically 3 atm or more, desirably 4 atm or more, more desirably 8 atm or more. After firing, the phosphor may be washed in a 10% nitric acid solution for 1 hour, for example. The resulting phosphor powder may be ground again in a ball mill or a jet mill and, if necessary, may be washed or classified to adjust the particle size distribution and flowability of the phosphor powder.

<New Composition La$_3$(Si,Al)$_6$N$_{11}$:Ce Phosphor>

In order to increase the emission wavelength of a phosphor to provide a Ce red phosphor, the present inventors intended to reduce the symmetry of a ligand of Ce. More specifically, the present inventors intended to introduce Al$^{3+}$ into La$_3$Si$_6$N$_{11}$:Ce.

first principle calculation was used in substitution of Ce at a La site of La$_3$Si$_6$N$_{11}$ and in structural optimization. CASTEP available from Dassault Systemes Biovia K.K. was used for the first principle calculation. GGA was used as a functional, and PBE was used for exchange-correlation interaction.

Figure 10:
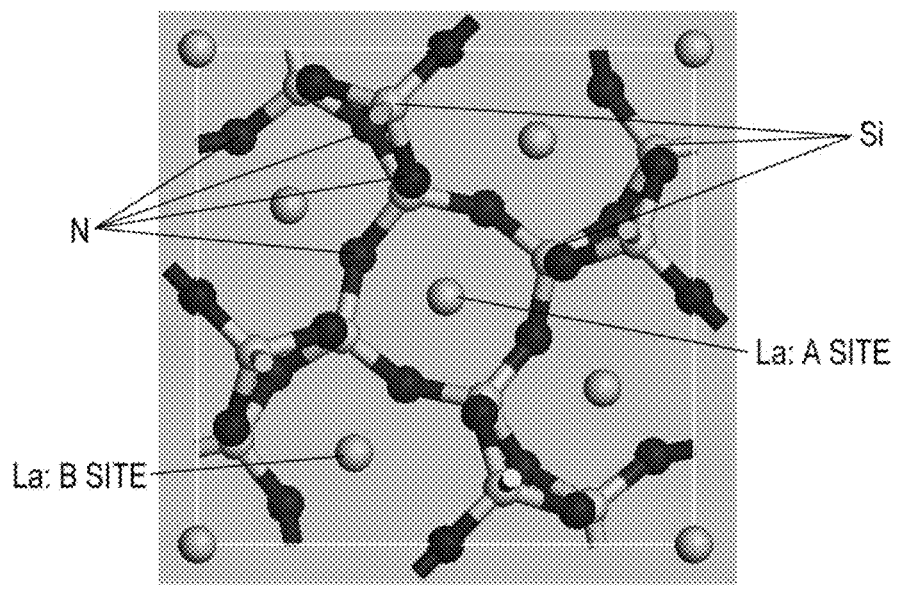
FIG. 10 is a schematic view of a 1×1×3 supercell structure of $La_3Si_6N_{11}$ after structural optimization.
Figure 11:
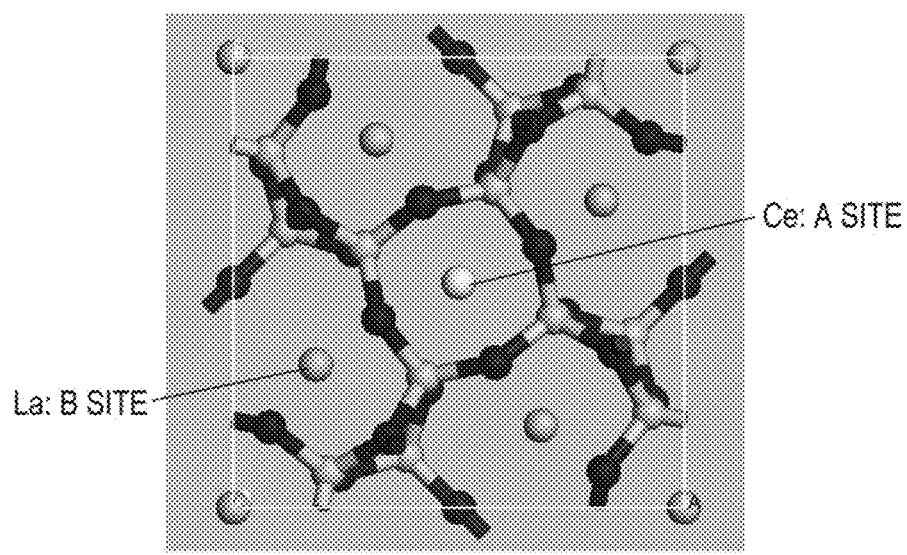
FIG. 11 is a schematic view of a 1×1×3 supercell structure of $La_3Si_6N_{11}:Ce$ after substitution of Ce for La at an A site and after structural optimization.
Figure 12:
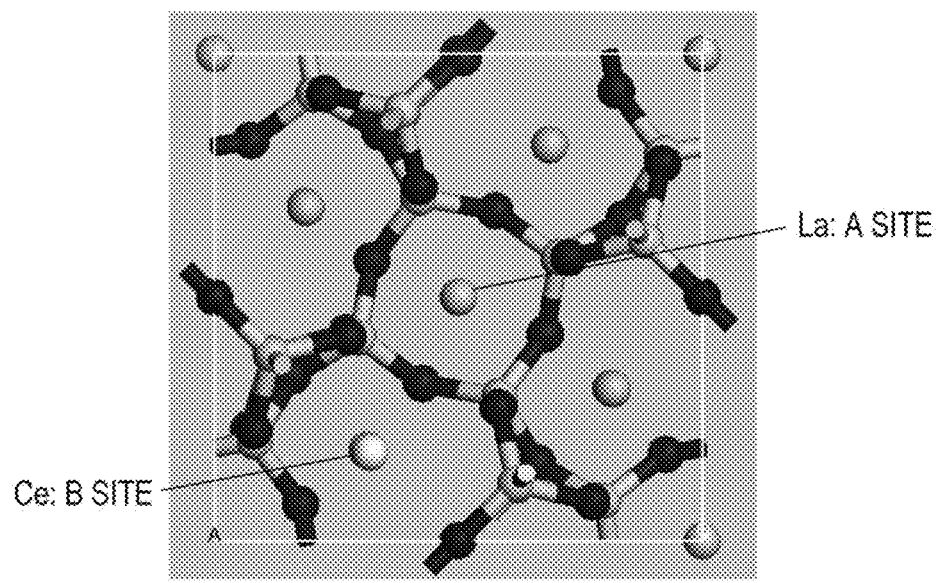
FIG. 12 is a schematic view of a 1×1×3 supercell structure of $La_3Si_6N_{11}:Ce$ after substitution of Ce for La at a B site and after structural optimization.

FIG. 10 illustrates the structural optimization results of the 1×1×3 supercell of La$_3$Si$_6$N$_{11}$. The space group of a unit cell of La$_3$Si$_6$N$_{11}$ is P4bm (#100). The coordination state of La includes an A site with high symmetry and a B site with low symmetry. FIG. 11 illustrates a crystal structure 1 including substitution of Ce for La at an A site and subjected to structural optimization. FIG. 12 illustrates a crystal structure 2 including substitution of Ce for La at a B site and subjected to structural optimization.

FIG. 11 shows that eight N atoms are located at almost equal distances around Ce at an A site. Two quadrangular pyramids with Ce at the vertex share the vertex and have eight coordination geometry with square bottoms twisted 45 degrees with respect to each other. The eight coordination geometry includes a ligand of Ce with high symmetry FIG. 12 shows that eight N atoms are located at different distances and angles around Ce at a B site. A ligand of Ce has lower symmetry at the B site than at the A site.

Table 3 lists the Ce—N distance and its standard deviation of the crystal structure 1 including substitution of Ce for La at an A site of the La$_3$Si$_6$N$_{11}$ crystal structure and the crystal structure 2 including substitution of Ce for La at a B site of the La$_3$Si$_6$N$_{11}$ crystal structure for quantification of symmetry.

TABLE 3

| | Ce—N distance (Å) | | | | | | | | Standard deviation |
|---|---|---|---|---|---|---|---|---|---|
| | Ce—N1 | Ce—N2 | Ce—N3 | Ce—N4 | Ce—N5 | Ce—N6 | Ce—N7 | Ce—N8 | σCe—N |
| Crystal structure 1 | 2.628 | 2.614 | 2.621 | 2.629 | 2.650 | 2.646 | 2.662 | 2.665 | 0.019 |
| Crystal structure 2 | 2.508 | 2.366 | 2.508 | 2.366 | 2.696 | 2.775 | 2.697 | 2.774 | 0.171 |
| Crystal structure 3 | 2.717 | 2.462 | 3.593 | 3.007 | 2.810 | 3.595 | 2.469 | 2.735 | 0.450 |
| Crystal structure 4 | 3.099 | 2.303 | 3.670 | 3.107 | 2.551 | 3.670 | 2.314 | 2.578 | 0.560 |

Al$^{3+}$ has a much smaller ionic radius than La$^{3+}$. Thus, substitution of Al$^{3+}$ at a La$^{3+}$ site greatly distorts the crystal and is expected to reduce the symmetry of the ligand. Alternatively, having an ionic radius similar to that of Si$^{4+}$, Al$^{3+}$ may occupy a Si$^{4+}$ site. In this case, N$^{3-}$ may be simultaneously substituted by O$^{2-}$ to adjust the valence. Furthermore, substitution of Al$^{3+}$ at three Si$^{4+}$ sites may be accompanied by a loss of N$^{3-}$. In both cases, the symmetry of the ligand is reduced.

On the basis of these findings, the present inventors have found a crystal structure that potentially includes a ligand with lower symmetry than a ligand of Ce in known LSN:Ce yellow phosphors, as described later. A phosphor having the chemical composition of LSN:Ce disclosed in Japanese Patent No. 4459941 as an example of known LSN:Ce yellow phosphors has an emission peak wavelength in the range of 574 to 594 nm and an excitation peak wavelength in the range of 455 to 460 nm.

The results and discussion of the crystal structure simulation will be described below. In order to examine a site of the La$_3$Si$_6$N$_{11}$ crystal structure that can be substituted by Ce, a The results also show that the Ce ligand has lower symmetry in the crystal structure 2 including substitution of Ce for La at a B site than in the crystal structure 1 including substitution of Ce for La at an A site.

In order to determine which of La at an A site or La at a B site is easy to substitute by Ce, the enthalpy of formation of each crystal was calculated by first principle calculation. It was found that the crystal structure 1 including substitution of Ce for La at an A site is more stable than the crystal structure 2 including substitution of Ce for La at a B site with the enthalpy of formation being lower by 48 meV in the crystal structure 1 than in the crystal structure 2.

Thus, in known LSN:Ce yellow phosphors, Ce is located at an energetically stable A site at which a ligand has high symmetry, for example, as in the crystal structure 1. This probably results in yellow light emission.

These analysis results show that the equilibrium point of the 4f orbital and the 5d orbital shifts due to low symmetry of a ligand of Ce in La$_3$Si$_6$N$_{11}$:Ce including substitution of Ce for La at a B site as in the crystal structure 2. Thus, it is possible to emit light with a longer wavelength than light emitted from known LSN:Ce yellow phosphors.

The red phosphor of the first embodiment may contain Al in the starting material, and therefore Al may be incorporated into the crystal phase of the phosphor. Furthermore, O in the raw materials may be incorporated into the phosphor crystal phase. Si and Al as well as N and O are interchangeable due to their similar ionic radii. The ionic radii are Al>Si and N>O. Thus, substitution of Al for Si increases the lattice constant, and substitution of O for N decreases the lattice constant. Simultaneous substitution of Al for Si and O for N can further stabilize the crystal. Simultaneous substitution of Al for Si and O for N can also maintain the valence of the crystal. Thus, the numbers of moles of Al and O in the crystal phase may be the same.

Figure 13:
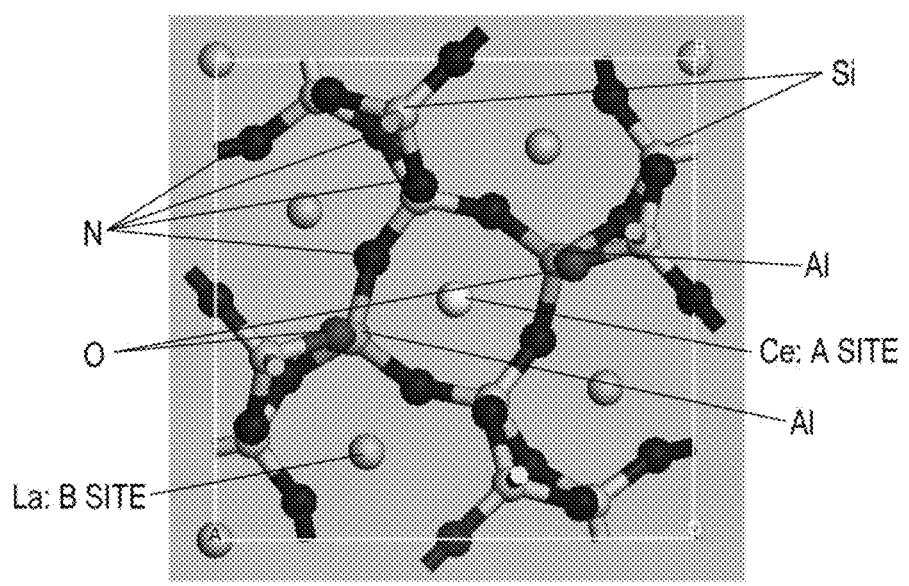
FIG. 13 is a schematic view of a 1×1×3 supercell structure of $La_3Si_6N_{11}:Ce$ after substitution of Ce for La at an A site, substitution of Al at a Si site, and substitution of O at a N site, and after structural optimization.
Figure 14:
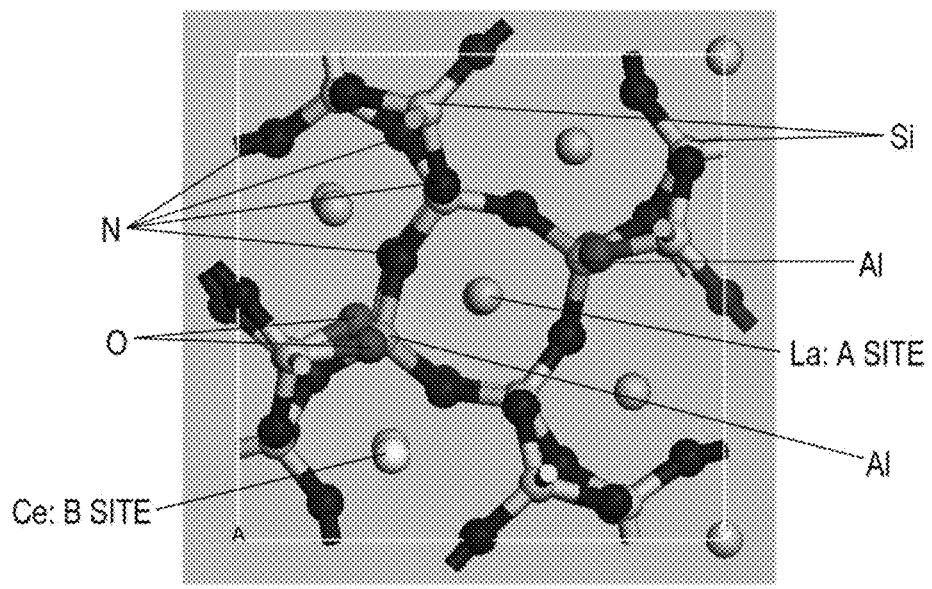
FIG. 14 is a schematic view of a 1×1×3 supercell structure of $La_3Si_6N_{11}:Ce$ after substitution of Ce for La at a B site, substitution of Al at a Si site, and substitution of O at a N site, and after structural optimization.

From these viewpoints, and in order to reduce symmetry, a crystal structure including substitution of Al at part of the Si sites and substitution of O at part of the N sites near Ce of $La_3Si_6N_{11}$:Ce was studied. FIG. 13 illustrates a crystal structure 3 including substitution of Ce for La at an A site in the original crystal structure and subjected to structural optimization. FIG. 14 illustrates a crystal structure 4 including substitution of Ce for La at a B site in the original crystal structure and subjected to structural optimization. Table 3 lists the Ce—N distance and its standard deviation of the crystal structure 3 and the crystal structure 4. The standard deviations of the crystal structure 3 and the crystal structure 4 are larger than that of the crystal structure 1, thus showing a decrease in the symmetry of a ligand of Ce.

These analysis results show that the equilibrium point of the 4f orbital and the 5d orbital of a crystal structure including substitution of Al at part of the Si sites and substitution of O at part of the N sites near Ce of $La_3Si_6N_{11}$: Ce, such as the crystal structure 3 or the crystal structure 4, shifts due to low symmetry of a ligand of Ce, and therefore such a structure can emit light with a longer wavelength than light emitted from known LSN:Ce yellow phosphors. In this case, in order to emit light with a longer wavelength than light emitted from known LSN:Ce yellow phosphors, it is desirable that the crystal phase contain a larger amount of Al or O or both than Ce.

Furthermore, a crystal structure including substitution of Al at part of the Si sites near Ce of $La_3Si_6N_{11}$:Ce and including a defect at a N site was examined. In order to adjust the valence in substitution of $Al^{3+}$ for $Si^{4+}$, it is desirable that substitution of three $Al^{3+}$ ions for three $Si^{4+}$ ions be simultaneously accompanied by a loss of one $N^{3-}$. Substitution of Al for coordinating Si near Ce simultaneous with a loss of N reduces the symmetry of a ligand of Ce. Thus, it is possible to emit light with a longer wavelength than light emitted from known LSN:Ce yellow phosphors.

In this case, in order to emit light with a longer wavelength than light emitted from known LSN:Ce yellow phosphors, it is desirable that at least the amount of Al be greater than or equal to the amount of Ce. Furthermore, substitution of Al at three Si sites can provide charge compensation for a N defect. Thus, it is desirable that the amount of Al be at least three times the amount of Ce.

The results of the crystal structure simulation show that a phosphor having any of the following crystal structures can emit light with a longer wavelength than light emitted from known LSN:Ce yellow phosphors: (1) a crystal structure including substitution of Ce for La at a B site of a $La_3Si_6N_{11}$ crystal, (2) a crystal structure including substitution of Ce at an A site and/or a B site of La of a $La_3Si_6N_{11}$ crystal and substitution of Al—O for part of Si—N near Ce, and (3) a crystal structure including substitution of Ce at an A site and/or a B site of La of a $La_3Si_6N_{11}$ crystal, substitution of Al for Si near Ce, and a loss of N.

The simulation results suggest the reason why the phosphor of the first embodiment emits red light with a longer wavelength than light emitted from known LSN:Ce yellow phosphors. The simulation results are described by way of example only and do not limit the crystal structure of the phosphor of the first embodiment.

From these results, the present inventors have found a new red phosphor containing a crystal phase having the chemical composition of $Ce_xLa_{3-x}Si_{6-q}Al_qN_{11-z}$. In the new red phosphor, x, q, and z satisfy $0<x\leq0.6$, $0<q\leq3.0$, and $0\leq z\leq1.0$. This new red phosphor is hereinafter referred to as a red phosphor of a third example in the first embodiment and will be further described in the following examples.

Examples 1 to 4 and Comparative Example 1

A method for producing a phosphor will be described below. A LaN powder, a $Si_3N_4$ powder, an AlN powder, and a $CeF_3$ powder were prepared as starting materials. First, the LaN powder, the $Si_3N_4$ powder, and the $CeF_3$ powder were weighed and mixed at a composition represented by the general formula $La_{2.91}Ce_{0.09}Si_6N_{11}$. The amount of the LaN powder was 24% more than the theoretical value. The mixed powder was mixed with the AlN powder in the amount listed in Table 4. In Comparative Example 1, no AlN powder was added. The mixing method was dry blending with a mortar in a glove box in a nitrogen atmosphere. The mixed raw powders were placed in a boron nitride crucible. The raw powders were fired in a 0.5 MPa nitrogen atmosphere at 1900° C. for 2 hours. The fired sample was washed in a 10% nitric acid solution for 1 hour. Examples 1 to 4 and Comparative Example 1 were produced from the starting materials listed in Table 4 in this way.

TABLE 4

|  | LaN | $Si_3N_4$ | AlN | $CeF_3$ | x | Emission peak wavelength | Excitation peak wavelength |
| --- | --- | --- | --- | --- | --- | --- | --- |
| Example 1 | 1.316 g | 0.659 g | 0.096 g | 0.042 g | 0.09 | 642 nm | 540 nm |
| Example 2 | 1.206 g | 0.604 g | 0.265 g | 0.038 g | 0.09 | 642 nm | 537 nm |
| Example 3 | 1.113 g | 0.557 g | 0.407 g | 0.035 g | 0.09 | 642 nm | 539 nm |
| Example 4 | 0.932 g | 0.467 g | 0.682 g | 0.030 g | 0.09 | 641 nm | 539 nm |
| Comparative example 1 | 1.380 g | 0.691 g | 0 g | 0.044 g | 0.09 | 536 nm | 450 nm |

Comparative Example 2

A $Ca_3N_2$ powder, a $Si_3N_4$ powder, an AlN powder, and a EuN powder were prepared as starting materials. The $Ca_3N_2$ powder, the $Si_3N_4$ powder, the AlN powder, and the EuN powder were weighed and mixed at a composition represented by the general formula $Ca_{0.97}Eu_{0.03}AlSiN_3$. The mixing method was dry blending with a mortar in a glove box in a nitrogen atmosphere. The mixed raw powders were placed in a boron nitride crucible. The raw powders were fired in a 0.5 MPa nitrogen atmosphere at 1600° C. for 2 hours. The fired sample was washed in a 10% nitric acid solution for 1 hour. Comparative Example 2 represented by CASN:Eu was produced in this way.

<Evaluation of Emission/Excitation Spectrum>

Figure 15:
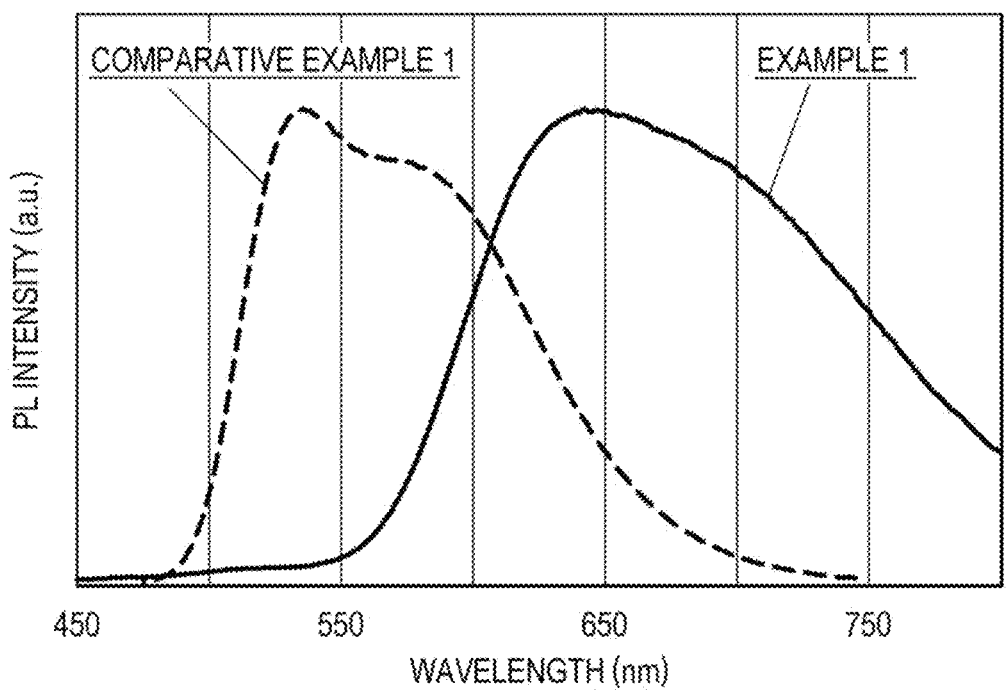
FIG. 15 is a graph of emission spectra of Example 1 and Comparative Example 1.
Figure 16:
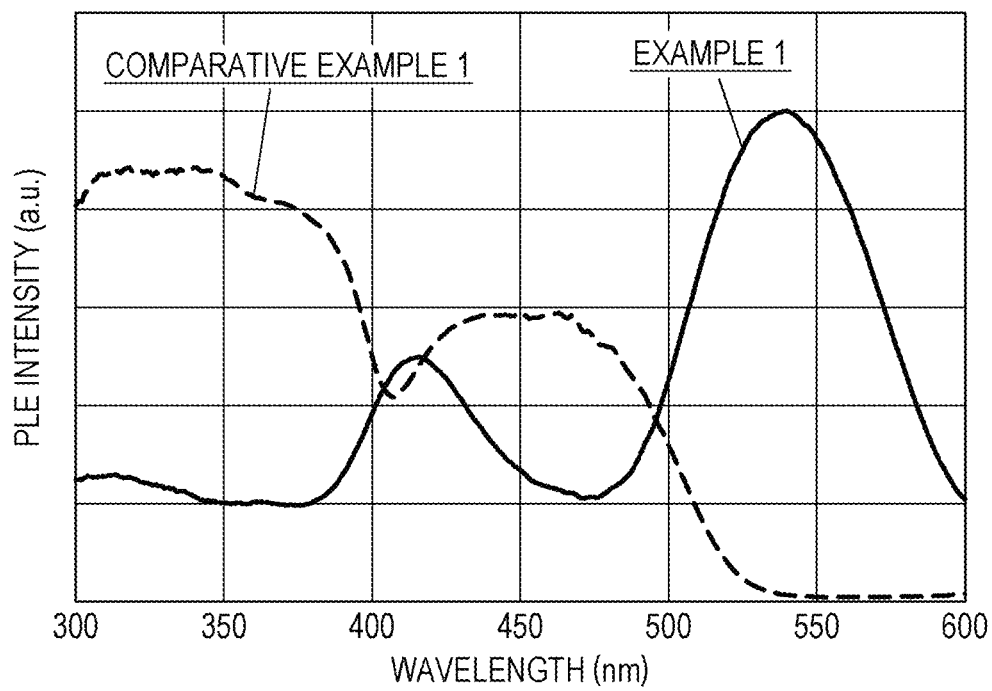
FIG. 16 is a graph of excitation spectra of Example 1 and Comparative Example 1.

The emission spectra and excitation spectra of Examples 1 to 4 and Comparative Example 1 were measured with a spectrofluorophotometer (FP-6500 manufactured by JASCO Corporation). FIG. 15 shows the emission spectra of Example 1 and Comparative Example 1. FIG. 16 shows the excitation spectra of Example 1 and Comparative Example 1. Table 4 lists the emission peak wavelength in the range of 450 to 800 nm and the excitation peak wavelength in the range of 400 to 600 nm. A Xe lamp was used as an excitation light source. The emission spectrum was measured while the excitation peak wavelength of each sample listed in Table 4 was used as the wavelength of the excitation light source. The excitation spectrum was measured while the emission peak wavelength of each sample listed in Table 4 was used as the monitor wavelength.

Comparative Example 1 containing no AlN in the starting materials emitted yellow light with an emission peak wavelength of 536 nm. The excitation peak wavelength was 450 nm. It is generally known that a phosphor crystal represented by $La_3Si_6N_{11}$ doped with Ce has an emission peak (approximately 535 nm) on the short wavelength side and an emission peak (approximately 580 nm) on the long wavelength side. These are almost the same as the emission peak on the short wavelength side and the emission peak on the long wavelength side of the phosphor described in Japanese Patent No. 4459941. The position of the excitation peak wavelength was also almost the same as in Japanese Patent No. 4459941.

Examples 1 to 4 emitted red light with an emission peak wavelength of approximately 640 nm. It was found that Examples 1 to 4 had an excitation peak at a wavelength of approximately 540 nm. These demonstrate that Examples 1 to 4 had different light-emitting properties from those of Comparative Example 1. Examples 1 to 4 had an additional excitation spectrum peak in the wavelength range of 350 nm or more and less than 500 nm.

<Evaluation of Emission Lifetime>

Figure 17:
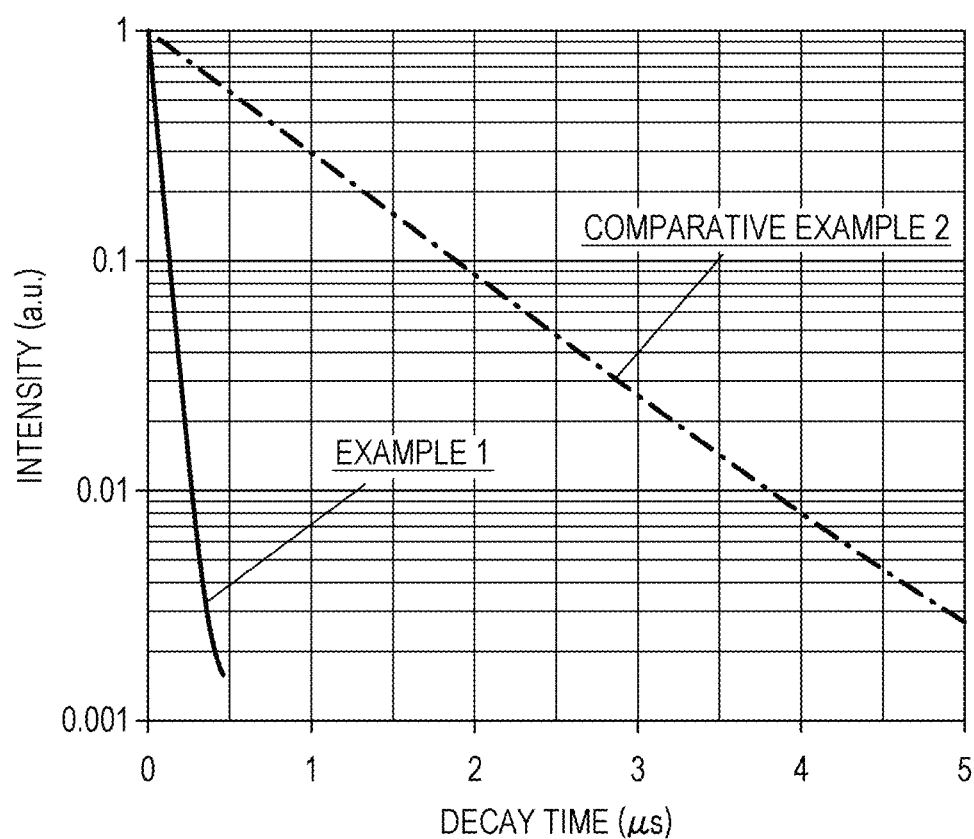
FIG. 17 is a graph of afterglow spectra of Example 1 and Comparative Example 2.

The emission lifetimes of Examples 1 to 4 and Comparative Examples 1 and 2 were measured with a fluorescence lifetime measuring apparatus (Quantaurus-Tau compact fluorescence lifetime measurement system manufactured by Hamamatsu Photonics K.K.). FIG. 17 shows the afterglow spectra of Example 1 and Comparative Example 2, wherein emission intensity changes are plotted as a function of time after the excitation light is blocked. Table 5 lists the 1/e emission lifetimes of Examples 1 to 4 and Comparative Examples 1 and 2.

TABLE 5

|  | 1/e emission lifetime |
|---|---|
| Example 1 | 54 ns |
| Example 2 | 55 ns |
| Example 3 | 54 ns |
| Example 4 | 53 ns |
| Comparative example 1 | 42 ns |
| Comparative example 2 | 820 ns |

Example 1 had a 1/e emission lifetime of 54 ns. Examples 1 to 4 and Comparative Example 1 had a 1/e emission lifetime of approximately 50 ns, thus confirming that the 1/e emission lifetime is 100 ns or less. It is known that the emission lifetime of Ce generally ranges from approximately 10 to 100 ns. Thus, the light emission in Examples 1 to 4 and Comparative Example 1 is probably emitted from Ce.

CASN:Eu of Comparative Example 2 had an emission lifetime of 820 ns. The emission lifetime has an influence on the luminance saturation characteristics. It is known that as compared with phosphors containing Ce, phosphors containing Eu are more likely to reach luminance saturation due to a decrease in quantum efficiency during high-energy excitation. The phosphors of Examples 1 to 4 and Comparative Example 1 have much shorter emission lifetimes than CASN:Eu and are less likely to reach luminance saturation. Thus, the phosphors of Examples 1 to 4 and Comparative Example 1 in combination with a high-power excitation light source can provide a high-power light-emitting device.

<Evaluation of Crystal Structure>

The X-ray powder diffraction patterns of Examples 1 to 4 and Comparative Example 1 were measured with an X-ray diffractometer (RINT2100 manufactured by Rigaku). The measurement was performed with Cu-Kα radiation under the conditions listed in Table 6.

TABLE 6

| Start angle | Final angle | Sampling width | Scanning speed | Tube voltage | Tube current | Divergence slit | Scattering slit | Light-receiving slit |
|---|---|---|---|---|---|---|---|---|
| 10° | 60° | 0.02° | 4°/min | 40 kV | 40 mA | 1° | 1° | 0.15 mm |

Figure 18:
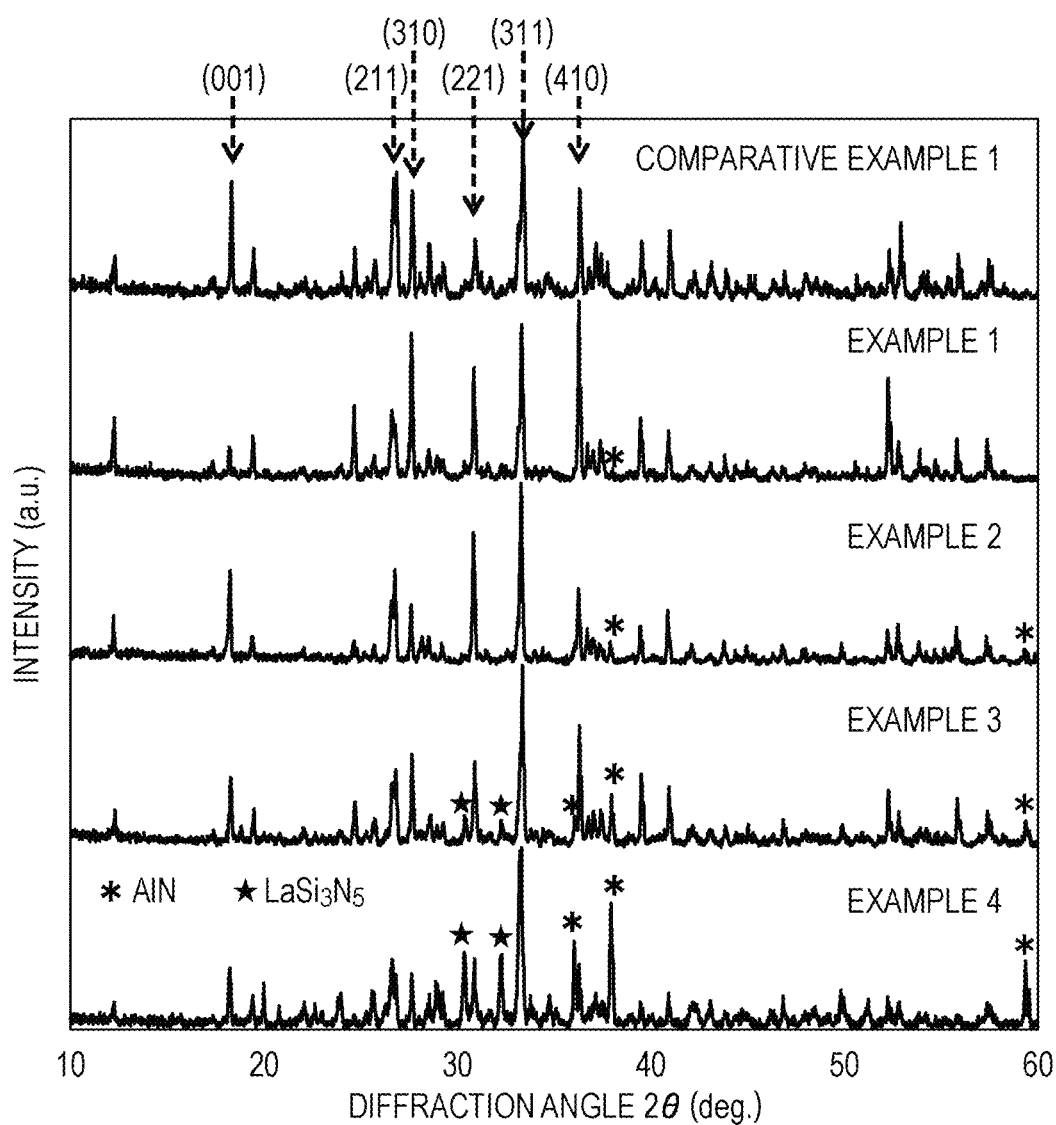
FIG. 18 is a graph of XRD diffraction patterns of Examples 1 to 4 and Comparative Example 1.
Figure 19A:
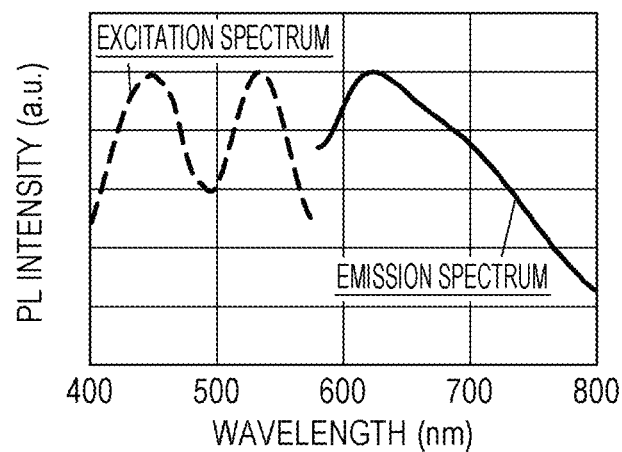
FIG. 19A is a graph of an emission spectrum and an excitation spectrum of Example 5.
Figure 19B:
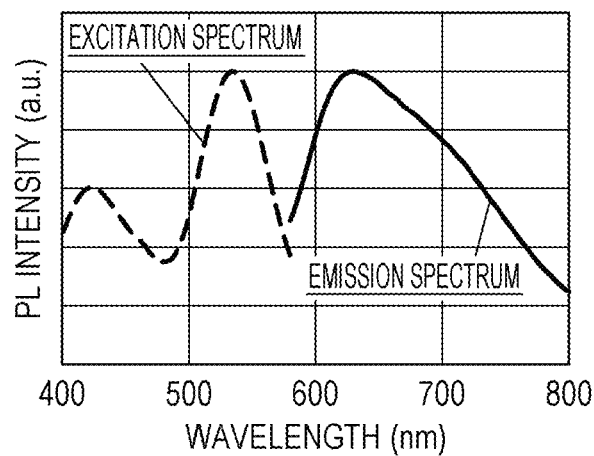
FIG. 19B is a graph of an emission spectrum and an excitation spectrum of Example 6.
Figure 19C:
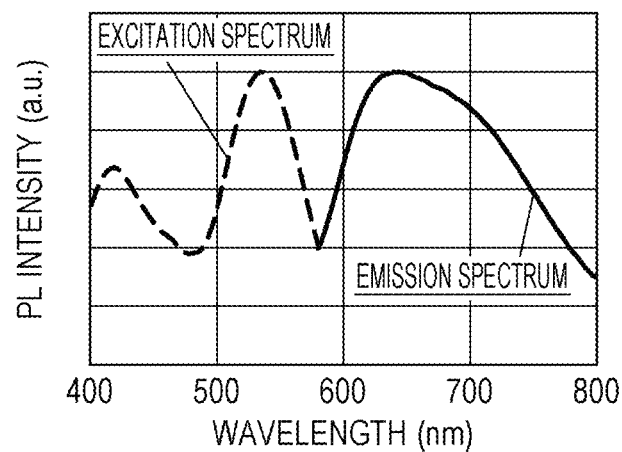
FIG. 19C is a graph of an emission spectrum and an excitation spectrum of Example 7.
Figure 19D:
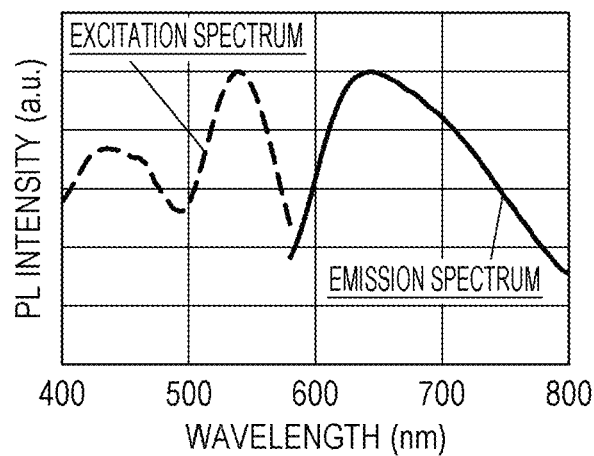
FIG. 19D is a graph of an emission spectrum and an excitation spectrum of Example 8.
Figure 19E:
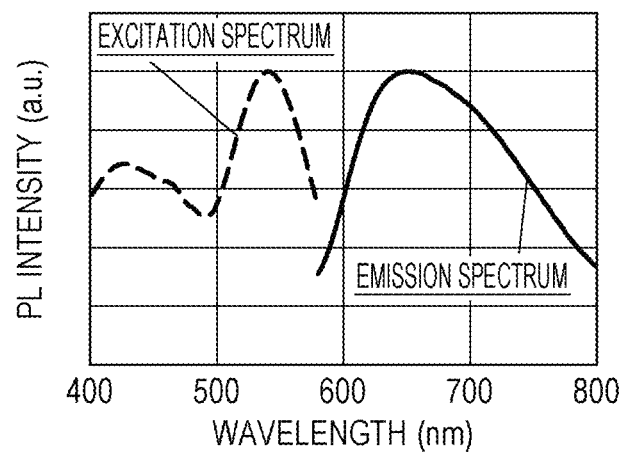
FIG. 19E is a graph of an emission spectrum and an excitation spectrum of Example 9.
Figure 19F:
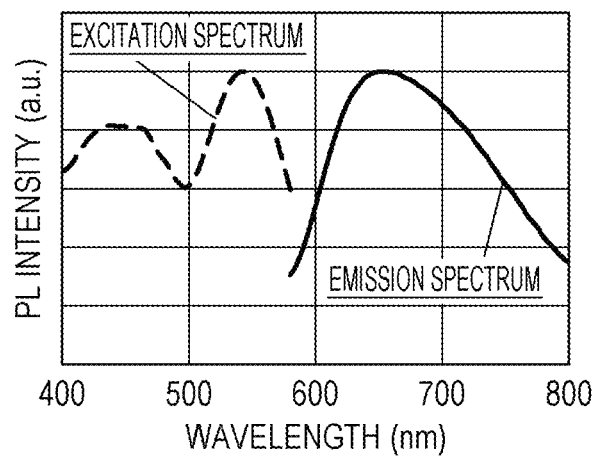
FIG. 19F is a graph of an emission spectrum and an excitation spectrum of Example 10.

FIG. 18 shows the X-ray diffraction patterns. FIG. 18 shows that although the X-ray diffraction patterns of Examples 1 to 4 slightly shift to the low angle side relative to the X-ray diffraction pattern of Comparative Example 1, these X-ray diffraction patterns are almost the same.

Among the diffraction peaks, six diffraction peaks corresponding to the $La_3Si_6N_{11}$ crystal type are designated as peaks 1 to 6 from the low angle side. Table 7 lists 2θ of each of the diffraction peaks.

TABLE 7

|  | Peak 1 | Peak 2 | Peak 3 | Peak 4 | Peak 5 | Peak 6 |
|---|---|---|---|---|---|---|
| Example 1 | 18.20° | 26.62° | 27.60° | 30.84° | 33.30° | 36.26° |
| Example 2 | 18.24° | 26.76° | 27.60° | 30.82° | 33.28° | 36.24° |
| Example 3 | 18.28° | 26.80° | 27.64° | 30.88° | 33.36° | 36.30° |
| Example 4 | 18.24° | 26.62° | 27.64° | 30.88° | 33.30° | 36.04° |
| Comparative example 1 | 18.32° | 26.84° | 27.68° | 30.90° | 33.38° | 36.30° |

Table 7 shows that the X-ray diffraction patterns of the phosphors had diffraction peaks in the range of (1) 2θ=17.8 to 18.8 degrees, (2) 2θ=26.2 to 27.2 degrees, (3) 2θ=27.2 to 28.2 degrees, (4) 2θ=30.5 to 31.5 degrees, (5) 2θ=32.8 to 33.8 degrees, and (6) 2θ=35.8 to 36.8 degrees, corresponding to the peaks 1 to 6, respectively. The peaks 1 to 6 had Miller indices of (001), (211), (310), (221), (311), and (410), respectively. Furthermore, FIG. 18 shows that the diffraction intensity of the diffraction peak corresponding to AlN or $LaSi_3N_5$ increases with the amount of AlN added. For AlN, this is probably because AlN added remained unreacted. For $LaSi_3N_5$, this is probably because a deviation from the stoichiometry composition of the $La_3Si_6N_{11}$ crystal facilitated the formation of the $LaSi_3N_5$ phase.

The space group of the phosphor of Example 1 was analyzed with a single-crystal X-ray structure analyzer (VariMax manufactured by Rigaku). As a result, it was found that the space group was a tetragonal crystal. Thus, Examples 1 to 4 and Comparative Example 1 have almost the same crystal structure as a crystal represented by the general formula $La_3Si_6N_{11}$.

Examples 5 to 10

A method for producing a phosphor will be described below. A LaN powder, a $Si_3N_4$ powder, an AlN powder, and a CeN powder were prepared as starting materials. First, the LaN powder, the $Si_3N_4$ powder, and the CeN powder were weighed and mixed at a composition represented by the general formula $La_{3-x}Ce_xSi_6N_{11}$. The amount of the LaN powder was 24% more than the theoretical value. The mixed powder was mixed with the AlN powder. The mixing method was dry blending with a mortar in a glove box in a nitrogen atmosphere. The mixed raw powders were placed in a boron nitride crucible. The raw powders were fired in a 0.5 MPa nitrogen atmosphere at 1900° C. for 2 hours. The fired sample was washed in a 10% nitric acid solution for 1 hour. Examples 5 to 10 were produced from the starting materials listed in Table 8 in this way.

All samples of Examples 5 to 10 had an excitation peak wavelength of 500 nm or more. The excitation peak wavelength ranged from 534 to 542 nm. An increase in the Ce concentration (x) of the phosphor results in an increase in overlap of the wave function of the excitation level between Ce atoms. This also results in an increase in excitation level energy width, formation of a band, and a decrease in energy difference from the ground level. Thus, an increase in Ce concentration caused a shift of the emission peak wavelength to the long wavelength side.

Examples 5 to 10 also had an additional excitation spectrum peak in the wavelength range of 350 nm or more and less than 500 nm.

<Evaluation of Internal Quantum Efficiency>

Figure 20:
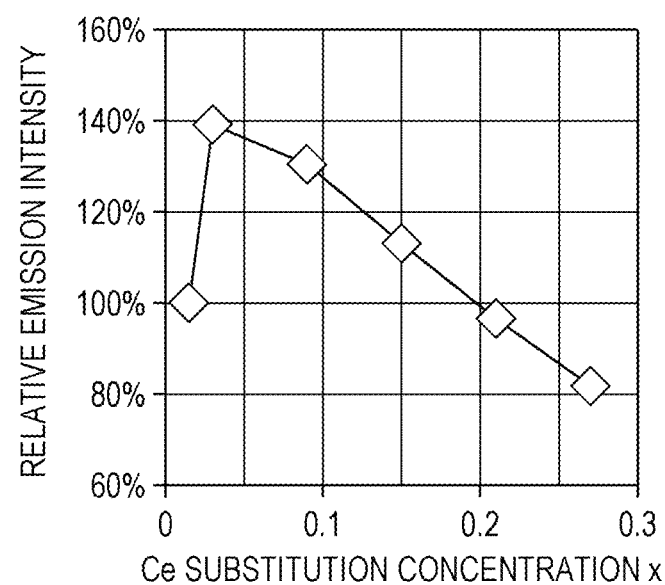
FIG. 20 is a graph showing the relationship between the Ce substitution concentration and the relative emission intensity of Examples 5 to 10.

The internal quantum efficiency (IQE) of Examples 5 to 10 was measured with an absolute PL quantum yield measurement system (C9920-02 manufactured by Hamamatsu Photonics K.K.). FIG. 20 shows the relative emission intensity of Examples 5 to 10. The relative emission intensity in the present example refers to the relative value of each sample with respect to the IQE of Example 5 (100%).

FIG. 20 shows that the relative emission intensity varies with the Ce concentration x of the phosphor. For example, at a Ce substitution concentration x of more than 0.03, the relative emission intensity decreases with increasing Ce substitution concentration x. This is probably due to concentration quenching. Since x is more than 0, Ce can emit light. FIG. 20 shows that x is desirably 0.015 or more, for example. The maximum value of x is not particularly limited as long as the phosphor can emit light. However, an excessively large x results in low emission intensity due to concentration quenching. Thus, x is desirably 0.6 or less. FIG. 20 shows that x is desirably 0.3 or less, more desirably 0.15 or less, for example. For example, at a Ce substitution concentration x in such a range, the phosphor can have higher emission intensity.

<Evaluation of Emission Lifetime>

The emission lifetimes of Examples 5 to 10 were measured with a fluorescence lifetime measuring apparatus

TABLE 8

| | LaN | $Si_3N_4$ | AlN | CeN | x | Emission peak wavelength | Excitation peak wavelength |
|---|---|---|---|---|---|---|---|
| Example 5 | 1.028 g | 0.505 g | 0.074 g | 0.004 g | 0.015 | 624 nm | 534 nm |
| Example 6 | 1.024 g | 0.505 g | 0.074 g | 0.008 g | 0.03 | 630 nm | 534 nm |
| Example 7 | 1.007 g | 0.505 g | 0.074 g | 0.025 g | 0.09 | 644 nm | 536 nm |
| Example 8 | 0.991 g | 0.505 g | 0.074 g | 0.042 g | 0.15 | 644 nm | 540 nm |
| Example 9 | 0.974 g | 0.505 g | 0.074 g | 0.058 g | 0.21 | 650 nm | 541 nm |
| Example 10 | 0.957 g | 0.504 g | 0.074 g | 0.075 g | 0.27 | 653 nm | 542 nm |

<Evaluation of Emission/Excitation Spectrum>

The emission spectra and excitation spectra of Examples 5 to 10 were measured with a spectrofluorophotometer (FP-6500 manufactured by JASCO Corporation). FIGS. 19A to 19F show the emission spectra and the excitation spectra of Examples 5 to 10, respectively. A Xe lamp was used as an excitation light source. The emission spectrum was measured while the excitation peak wavelength of each sample listed in Table 8 was used as the wavelength of the excitation light source. The excitation spectrum was measured while the emission peak wavelength of each sample listed in Table 8 was used as the monitor wavelength. All samples of Examples 5 to 10 emitted red light with an emission peak wavelength of 600 nm or more. The emission peak wavelength ranged from 624 to 653 nm.

(Quantaurus-Tau compact fluorescence lifetime measurement system manufactured by Hamamatsu Photonics K.K.). Table 9 lists the 1/e emission lifetimes of Examples 5 to 10.

TABLE 9

| | 1/e emission lifetime |
|---|---|
| Example 5 | 64 ns |
| Example 6 | 60 ns |
| Example 7 | 56 ns |
| Example 8 | 49 ns |
| Example 9 | 45 ns |
| Example 10 | 42 ns |

In Examples 5 to 10, the 1/e emission lifetime was 100 ns or less. Thus, the phosphors of Examples 5 to 10 in combination with a high-power excitation light source can provide a high-power light-emitting device. An increase in Ce concentration facilitates energy transfer between adjacent Ce atoms and causes energy migration. During energy migration, an electron trapped in a crystal defect is relaxed by non-radiative transition. Thus, an increase in Ce concentration results in an increase in the non-luminescence (non-radiative transition) probability of an electron with a relatively low transition probability, thus resulting in a shorter emission lifetime.

<Evaluation of Crystal Structure>

The X-ray powder diffraction patterns of Examples 5 to 10 and Comparative Example 1 were measured with an X-ray diffractometer (RINT2100 manufactured by Rigaku). The measurement was performed with Cu-Kα radiation under the conditions listed in Table 10.

TABLE 10

| Start angle | Final angle | Sampling width | Scanning speed | Tube voltage | Tube current | Divergence slit | Scattering slit | Light-receiving slit |
|---|---|---|---|---|---|---|---|---|
| 10° | 60° | 0.01° | 1°/min | 40 kV | 40 mA | 1° | 1° | 0.15 mm |

Figure 21:
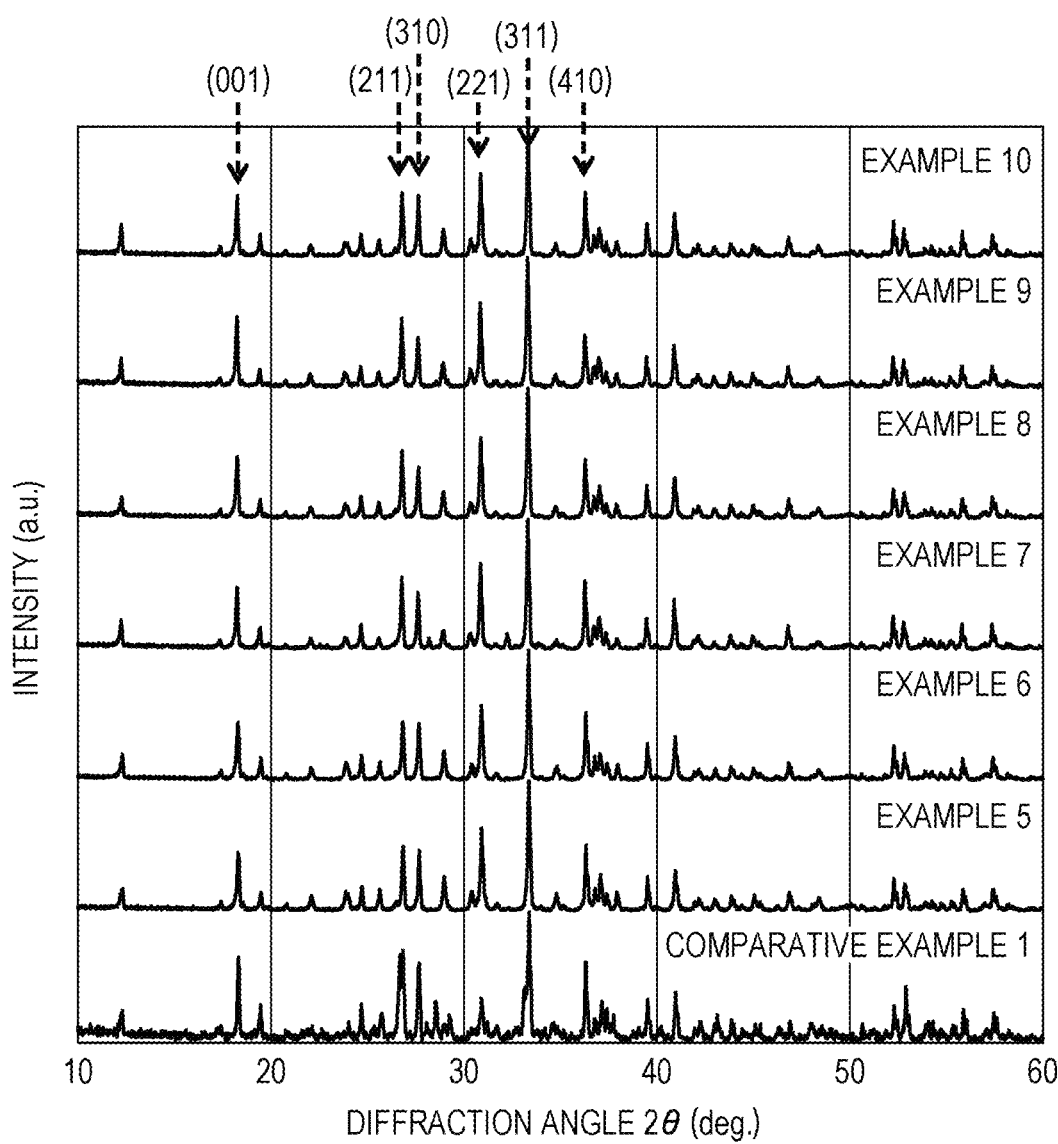
FIG. 21 is a graph of XRD diffraction patterns of Examples 5 to 10 and Comparative Example 1.

FIG. 21 shows the X-ray diffraction patterns. Although the X-ray diffraction patterns of Examples 5 to 10 slightly shift to the low angle side relative to the X-ray diffraction pattern of Comparative Example 1, these X-ray diffraction patterns are almost the same.

Among the diffraction peaks, six diffraction peaks corresponding to the $La_3Si_6N_{11}$ crystal type are referred to as peaks 1 to 6 from the low angle side. Table 11 lists 2θ of each of the diffraction peaks.

TABLE 11

|  | Peak 1 | Peak 2 | Peak 3 | Peak 4 | Peak 5 | Peak 6 |
|---|---|---|---|---|---|---|
| Example 5 | 18.31° | 26.85° | 27.68° | 30.92° | 33.37° | 36.32° |
| Example 6 | 18.30° | 26.84° | 27.67° | 30.91° | 33.36° | 36.32° |
| Example 7 | 18.25° | 26.78° | 27.62° | 30.86° | 33.32° | 36.27° |
| Example 8 | 18.25° | 26.80° | 27.65° | 30.86° | 33.31° | 36.29° |
| Example 9 | 18.24° | 26.78° | 27.61° | 30.84° | 33.30° | 36.27° |
| Example 10 | 18.26° | 26.81° | 27.64° | 30.87° | 33.33° | 36.29° |

Table 11 shows that the X-ray diffraction patterns of the phosphors had diffraction peaks in the range of (1) 2θ=17.8 to 18.8 degrees, (2) 2θ=26.2 to 27.2 degrees, (3) 2θ=27.2 to 28.2 degrees, (4) 2θ=30.5 to 31.5 degrees, (5) 2θ=32.8 to 33.8 degrees, and (6) 2θ=35.8 to 36.8 degrees, corresponding to the peaks 1 to 6, respectively. The peaks 1 to 6 had Miller indices of (001), (211), (310), (221), (311), and (410), respectively. These results show that the space group of the phosphors of Examples 5 to 10 is a tetragonal crystal, as in Examples 1 to 4 and Comparative Example 1, and has almost the same crystal structure as a crystal represented by the general formula $La_3Si_6N_{11}$.

Example 11 and Comparative Example 3

A method for producing a phosphor will be described below. A LaN powder, a $Si_3N_4$ powder, an AlN powder, and a CeN powder were prepared as starting materials. First, the LaN powder, the $Si_3N_4$ powder, and the CeN powder were weighed and mixed at a composition represented by the general formula $La_{3-x}Ce_xSi_6N_{11}$. The amount of the LaN powder was 24% more than the theoretical value. The mixed powder was mixed with the AlN powder. The mixing method was dry blending with a mortar in a glove box in a nitrogen atmosphere. The mixed raw powders were placed in a boron nitride crucible. The raw powders were fired in a 0.5 MPa nitrogen atmosphere at 1900° C. for 2 hours. The fired sample was washed in a 3% hydrochloric acid solution for 24 hours. Example 11 and Comparative Example 3 were produced from the starting materials listed in Table 12 in this way.

As in Examples 1 to 10, red-light emission with an emission peak wavelength of 600 nm or more was observed in Example 11. The excitation peak wavelength was 500 nm or more.

TABLE 12

|  | LaN | $Si_3N_4$ | AlN | CeN | x | Emission peak wavelength | Excitation peak wavelength |
|---|---|---|---|---|---|---|---|
| Example 11 | 6.271 g | 3.305 g | 0.483 g | 0.490 g | 0.27 | 642 nm | 531 nm |
| Comparative example 3 | 6.271 g | 3.305 g | 0 g | 0.490 g | 0.27 | 536 nm | 450 nm |

<Evaluation of Emission Lifetime>

The emission lifetimes of Example 11 and Comparative Example 3 were measured with a fluorescence lifetime measuring apparatus (Quantaurus-Tau compact fluorescence lifetime measurement system manufactured by Hamamatsu Photonics K.K.). Table 13 lists the 1/e emission lifetimes of Example 11 and Comparative Example 3.

TABLE 13

|  | 1/e emission lifetime |
|---|---|
| Example 11 | 49 ns |
| Comparative example 3 | 38 ns |

In Example 11, the 1/e emission lifetime was 100 ns or less.

<Evaluation of Crystal Structure>

Figure 22A:
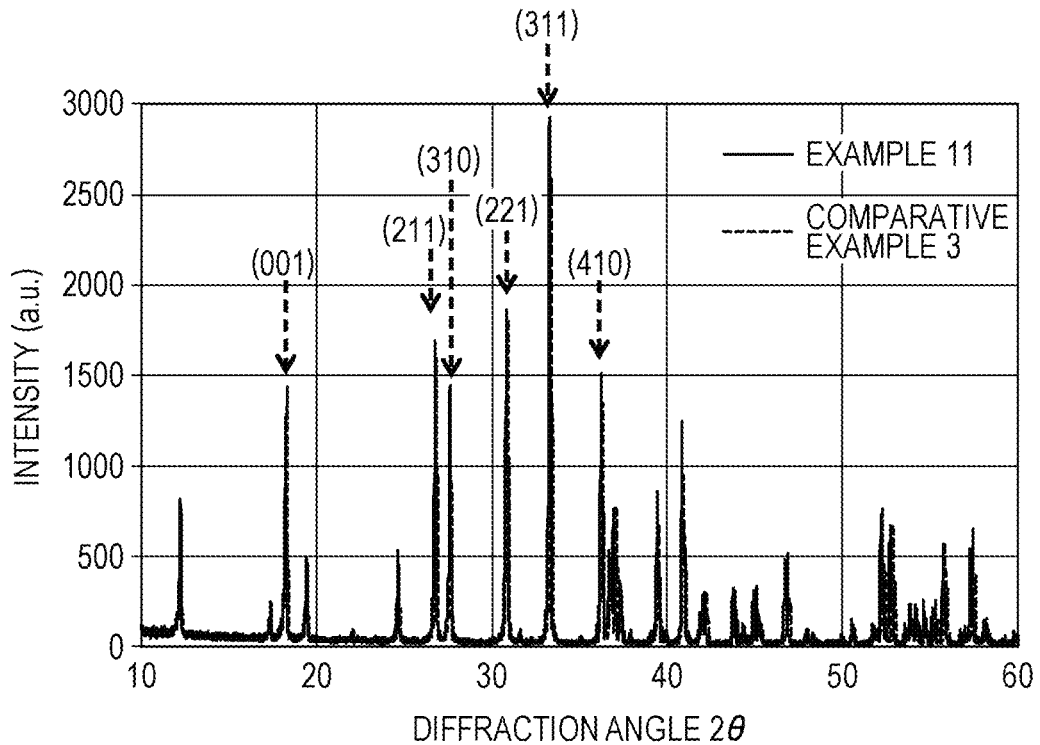
FIG. 22A is a graph of XRD diffraction patterns of Example 11 and Comparative Example 3.
Figure 22B:
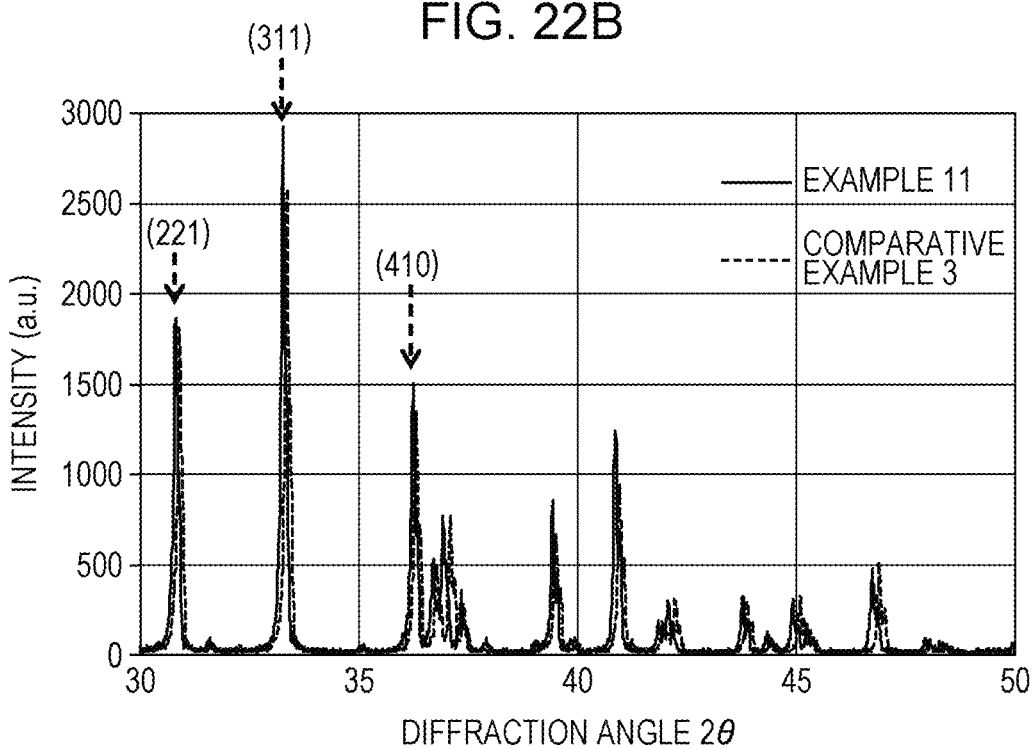
FIG. 22B is a graph of enlarged XRD diffraction patterns of Example 11 and Comparative Example 3.

The X-ray powder diffraction patterns of Example 11 and Comparative Example 3 were measured with an X-ray diffractometer (RINT2100 manufactured by Rigaku). The measurement was performed with Cu-Kα radiation under the conditions listed above in Table 12. FIGS. 22A and 22B show measured X-ray diffraction patterns.

The X-ray diffraction pattern of Example 11 was almost the same as the X-ray diffraction pattern of Comparative Example 3. The X-ray diffraction peaks in Example 11 shift slightly to the low-angle side with respect to the X-ray diffraction peaks in Comparative Example 3.

Among the diffraction peaks, six diffraction peaks corresponding to the $La_3Si_6N_{11}$ crystal type are referred to as peaks 1 to 6 from the low angle side. Table 14 lists $2\theta$ of each of the diffraction peaks.

TABLE 14

| | Peak 1 | Peak 2 | Peak 3 | Peak 4 | Peak 5 | Peak 6 |
|---|---|---|---|---|---|---|
| Example 11 | 18.23° | 26.75° | 27.60° | 30.82° | 33.28° | 36.25° |
| Comparative example 3 | 18.30° | 26.84° | 27.66° | 30.91° | 33.37° | 36.32° |

Table 14 shows that the X-ray diffraction patterns of the phosphors had diffraction peaks in the range of (1) $2\theta=17.8$ to 18.8 degrees, (2) $2\theta=26.2$ to 27.2 degrees, (3) $2\theta=27.2$ to 28.2 degrees, (4) $2\theta=30.5$ to 31.5 degrees, (5) $2\theta=32.8$ to 33.8 degrees, and (6) $2\theta=35.8$ to 36.8 degrees, corresponding to the peaks 1 to 6, respectively. The peaks 1 to 6 had Miller indices of (001), (211), (310), (221), (311), and (410), respectively. These results show that the space group of the phosphor of Example 11 is a tetragonal crystal, as in Examples 1 to 10 and Comparative Examples 1 and 3, and has almost the same crystal structure as a crystal represented by the general formula $La_3Si_6N_{11}$.

<Evaluation of Composition>

The composition analysis of Example 11 and Comparative Example 3 was performed by inductively coupled plasma-atomic emission spectrometry (ICP-AES). Pretreatment for measurement will be described below. After alkali fusion with sodium peroxide, the melt was dissolved in hydrochloric acid and was diluted with pure water to determine the Si content. After alkali fusion with lithium tetraborate and sodium carbonate, the melt was dissolved in hydrochloric acid and was diluted with pure water to determine the La, Al, and Ce contents. Table 15 shows the results.

TABLE 15

| | La | Ce | Al | Si |
|---|---|---|---|---|
| Example 11 | 48.5 mass % | 4.00 mass % | 4.89 mass % | 20.5 mass % |
| Comparative example 3 | 50.6 mass % | 4.26 mass % | 0 mass % | 23.1 mass % |

Table 15 shows that Example 11 contained Al.

Table 16 lists the mole fraction of each element when the total Al and Si content is assumed to be 6 mol.

TABLE 16

| | La | Ce | Al | Si |
|---|---|---|---|---|
| Example 11 | 2.30 mol | 0.19 mol | 1.19 mol | 4.81 mol |
| Comparative example 3 | 2.66 mol | 0.22 mol | 0 mol | 6 mol |

Table 16 shows that the total La and Ce content of each sample of Example 11 and Comparative Example 3 is smaller than the stoichiometric composition (3 mol). This is probably because the starting materials LaN and CeN are decomposed during firing. As long as light can be emitted, La and Ce may be less than the stoichiometric composition. For example, the total La and Ce content may be in a range of 2 to 3 mol.

The nitrogen and oxygen contents were then measured. The samples of Example 11 and Comparative Example 3 were melted at 2300° C. in an inert gas. The oxygen content was measured by a non-dispersive infrared absorption method (NDIR). The nitrogen content was measured by a thermal conductivity method (TCD). Table 17 shows the results.

TABLE 17

| | O | N |
|---|---|---|
| Example 11 | 0.5 mass % | 21.4 mass % |
| Comparative example 3 | 1.4 mass % | 20.6 mass % |

Table 17 shows that the sample of Example 11 contained O. As long as light can be emitted, O may be contained. Because it is difficult to simultaneously absolutely quantify anions and cations, the absolute value of each element content in Tables 15 to 17 includes an error. Thus, the composition of a phosphor of the present disclosure is not limited to the absolute value of each element content listed in Tables 15 to 17.

<Evaluation of Local Structure of Ce Ligand>

The local structure of each Ce ligand of Example 11 and Comparative Example 3 was analyzed by X-ray absorption fine structure spectroscopy (XAFS). The XAFS measurement was performed in National Research and Development Agency RIKEN (the Institute of Physical and Chemical Research), SPring 8 beam line 16B2.

Pretreatment for measurement will be described below. 0.16 g of the sample of Example 11 was mixed with 0.01 g of a BN powder in a mortar and was formed into pellets 8 mm in diameter using a mold. Likewise, 0.16 g of the sample of Comparative Example 3 was mixed with 0.01 g of a BN powder in a mortar and was formed into pellets 8 mm in diameter using a mold. An absorption spectrum near the K absorption edge of Ce was measured to determine the local structure of Ce and a ligand around the Ce. Extended X-ray absorption fine structure (EXAFS) oscillations were analyzed using open source EXAFS analysis software Athena to determine the radial distribution function around the Ce atom.

Table 18 lists the analysis parameters.

TABLE 18

| Background removal parameters | |
|---|---|
| E0 | 40463.755 |
| Algorithm | autobk |
| Rbkg | 1.000 |
| k-weight | 2 |
| Normalization order | 3 |
| Pre-edge range | [−150.000:−75.000] |
| Normalization range | [150.000:1400.778] |
| Spline range (k) | [0.000:12.000] |
| Spline range (E) | [0.000:548.638] |
| Edge step | 3.64E−01 |
| Standard | None |
| Lower clamp | None |
| Upper clamp | Strong |
| Forward Fourier transform parameters | |
| k-range | [3.000:17.847] |
| dk | 1.000 |
| Window | hanning |

TABLE 18-continued

| | |
|---|---|
| Arb. kw | 0.5 |
| Phase correction | no |
| Backward Fourier transform parameters | |
| R-range | [1.000:3.000] |
| dR | 0.000 |
| Window | hanning |
| Plotting parameters | |
| Plot multiplier | 1.00E+00 |
| y offset | 0.000 |

Figure 23:
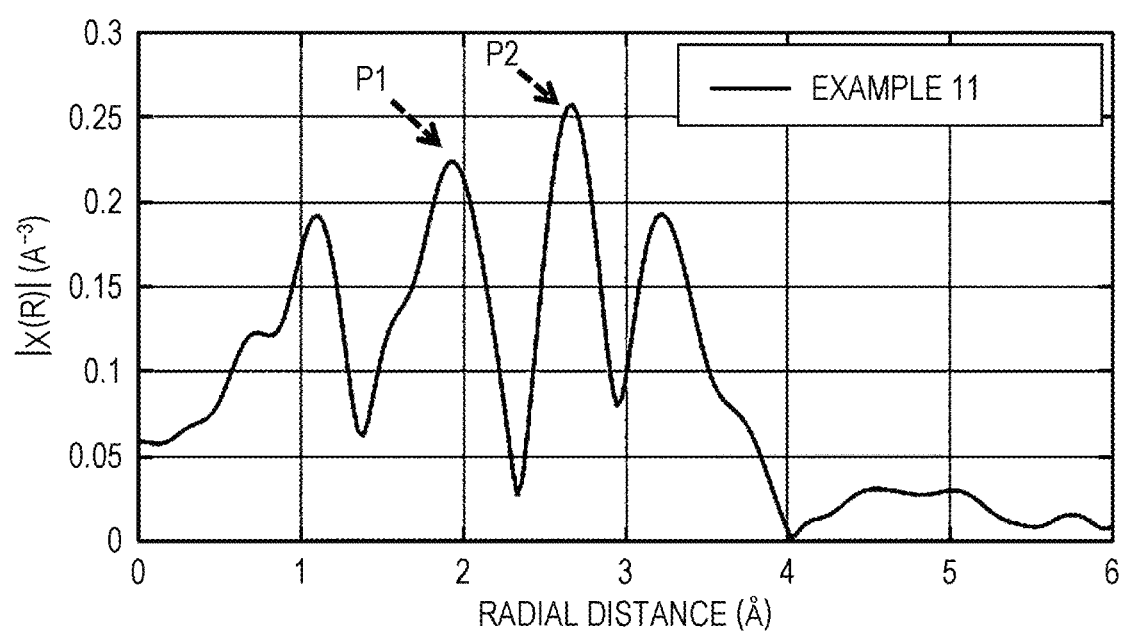
FIG. 23 is a graph of the radial distribution function around a Ce atom in Example 11.
Figure 24:
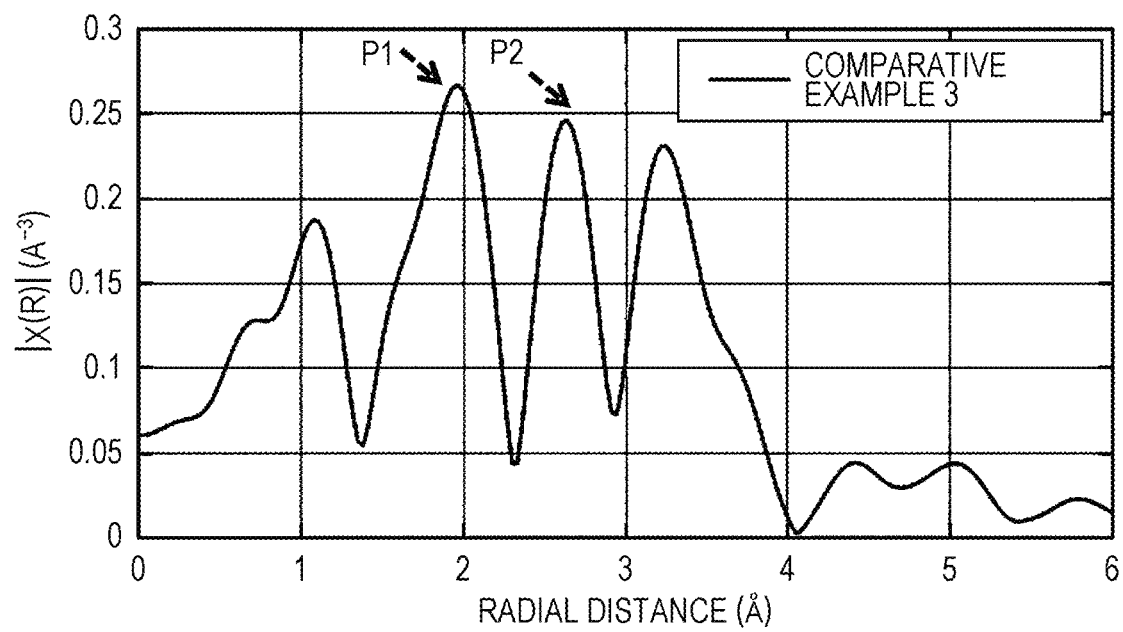
FIG. 24 is a graph of the radial distribution function around a Ce atom in Comparative Example 3.

FIG. 23 is a graph of the radial distribution function of Example 11. FIG. 24 is a graph of the radial distribution function of Comparative Example 3. In general, the horizontal axis (radial distance) of the radial distribution function corresponds to the distance to an adjacent atom. The vertical axis (peak height) represents the coordination number n. In FIGS. 23 and 24, the peak at approximately 1.1 angstroms is a ghost peak due to measurement signal noise. The peak at approximately 1.9 angstroms (P1) is a peak of the first neighbor shell of Ce. The peak at approximately 2.6 angstroms (P2) is a peak of the second neighbor shell of Ce. The peak at approximately 3.3 angstroms is a peak of the third neighbor shell of Ce.

As is clear from FIG. 24, in Comparative Example 3, the peak (P1) height of the first neighbor shell is higher than the peak (P2) height of the second neighbor shell. As is clear from FIG. 23, in Example 11, the peak (P1) height of the first neighbor shell is lower than the peak (P2) height of the second neighbor shell (approximately 0.84 times). The P2 height in Example 11 is almost the same as the P2 height in Comparative Example 3. On the other hand, the P1 height in Example 11 is obviously lower than the P1 height in Comparative Example 3.

These results show that the coordination number of the first neighbor shell of Ce in Example 11 is smaller than the coordination number of the first neighbor shell of Ce in Comparative Example 3.

The radial distribution functions in FIGS. 23 and 24 were analyzed with respect to the coordination atoms using open source EXAFS analysis software Artemis. It was found that both the Ce atom in Example 11 and the Ce atom in Comparative Example 3 are substituted for La at an A site of the crystal structure. It was also found that eight nitrogen atoms are coordinated to the first neighbor shell of Ce in Comparative Example 3, but only seven nitrogen atoms are coordinated to the first neighbor shell of Ce in Example 11.

These results show that the coordination structure around Ce in Comparative Example 3 includes coordination of eight nitrogen atoms as in an A site of La in $La_3Si_6N_{11}$ and has relatively high symmetry. It was also found that the coordination structure around Ce in Example 11 has a nitrogen defect around an A site of La in $La_3Si_6N_{11}$ and is a coordination structure of seven coordination with low symmetry.

Thus, in Example 11, low symmetry of the coordination structure around Ce, for example, due to a Frenkel defect probably resulted in large splitting of the 5d orbital and a decreased energy difference from the 4f orbital. This increased the emission wavelength and provided a Ce phosphor that can emit red light.

The phosphors of Examples 1 to 11 had almost the same crystal structure as a crystal represented by the general formula $La_3Si_6N_{11}$ but emitted red light with a longer wavelength than light emitted from known LSN:Ce yellow phosphors. Although the reason for this is not clear, for example, the following is a possible reason. The phosphors of Examples 1 to 11 might have emitted red light, unlike known phosphors, due to Al (for example, an AlN powder) contained in the raw materials. The phosphors of Examples 1 to 11 might have emitted red light, for example, because the phosphors have a crystal structure including substitution of Ce for part of the A sites of La in the $La_3Si_6N_{11}$ crystal, substitution of Al for part of Si around Ce (or substitution of Al—O for part of Si—N), and a loss of part of N.

<Light-Emitting Apparatus>

The light-emitting apparatus according to the first embodiment will be described below. As described above, the light-emitting apparatus according to the first embodiment includes the solid-state light source and the wavelength convertor, which converts the wavelength of output light emitted from the solid-state light source.

The solid-state light source emits at least green light. The green light has a peak wavelength in the range of 480 to 550 nm, desirably 510 to 540 nm.

The solid-state light source is a LED or LD, for example. The solid-state light source may be a GaN LED or LD, desirably a GaN LD.

The wavelength convertor contains at least a red phosphor including Ce as a luminescent center. The red phosphor including the Ce luminescent center has been described in detail above.

Such components can constitute a light-emitting apparatus with high quantum efficiency even at high power.

When the red phosphor including the Ce luminescent center is referred to as a first phosphor, the wavelength convertor in the present embodiment may further contain a second phosphor having an emission peak wavelength in the range of 500 to 600 nm. The second phosphor may be a phosphor containing a crystal phase having the chemical composition of $Y_3Al_5O_{12}$:Ce (YAG:Ce) or a phosphor containing a crystal phase having the chemical composition of $La_3Si_6N_{11}$:Ce (LSN:Ce).

The second phosphor may be a phosphor that emits yellow light and may be combined with a third phosphor that emits green light. More specifically, in addition to the red phosphor including the Ce luminescent center and the second phosphor that emits yellow light, the wavelength convertor in the present embodiment may further contain the third phosphor that emits green light. Upon irradiation with light emitted from a solid-state light source, the third phosphor produces fluorescence with a longer wavelength than the light emitted from the solid-state light source. The third phosphor may be a phosphor containing a crystal phase having the chemical composition of $Lu_3Al_5O_{12}$:Ce (LuAG:Ce) or a phosphor containing a crystal phase having the chemical composition of $Y_3(Al,Ga)_5N_{12}$:Ce (YAGG:Ce).

Light from the second phosphor or the third phosphor may be utilized to excite the red phosphor including the Ce luminescent center.

The third phosphor, that is, the green phosphor may be combined instead of the second phosphor, that is, the yellow phosphor. More specifically, the wavelength convertor in the present embodiment may contain the third phosphor that emits green light in addition to the red phosphor including the Ce luminescent center. The peak wavelength of an emission spectrum of a green phosphor in the present disclosure may be longer than the peak wavelength of green light emitted from a solid-state light source. The peak wavelength of light emitted from a green phosphor in the present disclosure ranges from 500 nm or more to less than 560 nm, for example. The green phosphor may be replaced by a yellow phosphor having an emission spectrum with a peak wavelength in the range of 560 to 600 nm.

The solid-state light source, the red phosphor, and the second and third phosphors in the light-emitting apparatus of the present embodiment can be freely chosen within the limits described above in accordance with the intended use of the light-emitting apparatus.

As described above, the light-emitting apparatus of the present embodiment includes the solid-state light source that emits green light and the red phosphor including the Ce luminescent center, unlike known light-emitting apparatuses. The light-emitting apparatus of the present embodiment with such a structure can be used as a high-efficiency light-emitting apparatus.

The red phosphor including the Ce luminescent center in the wavelength convertor in the present embodiment may have a 1/e emission lifetime of 100 ns or less. The emission lifetime has an influence on the luminance saturation characteristics. Phosphors containing Eu, such as a known red phosphor CASN:Eu, have a longer emission lifetime than phosphors containing Ce. Thus, phosphors containing Eu are likely to reach luminance saturation due to a decrease in quantum efficiency during high-energy excitation. Thus, the red phosphor including the Ce luminescent center is expected to be a red phosphor with higher quantum efficiency than known red phosphors even at high power. All phosphors in the wavelength convertor in the present embodiment may have a lie emission lifetime of 100 ns or less. In this case, the wavelength convertor does not contain a phosphor that has decreased emission quantum efficiency when excited by high-power light and therefore can further increase the power of the light-emitting apparatus of the present embodiment.

Second Embodiment

Figure 25:
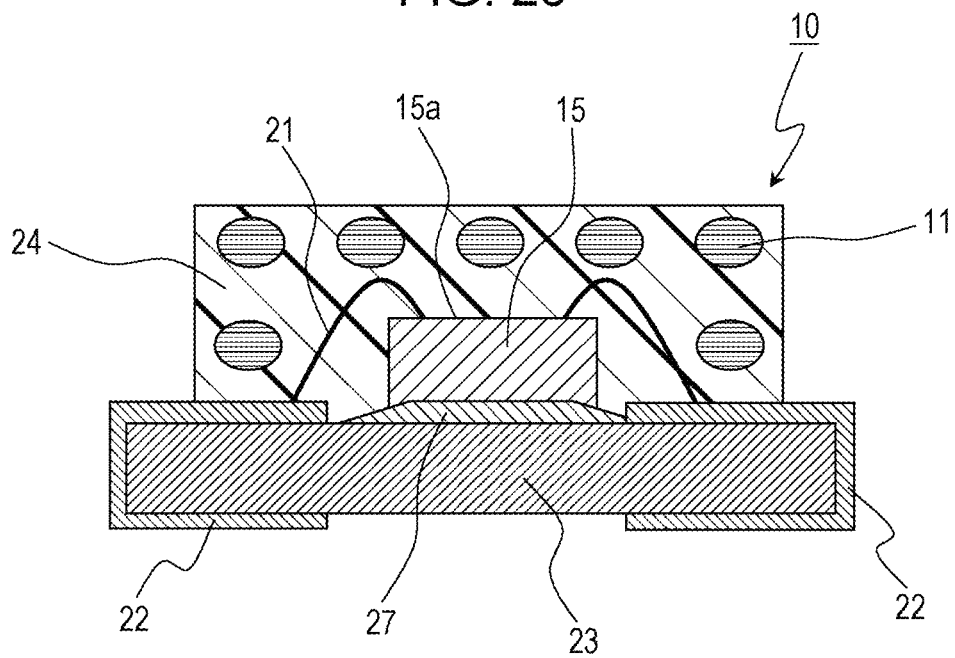
FIG. 25 is a schematic cross-sectional view of a LED light-emitting apparatus according to a second embodiment.

A LED light-emitting apparatus that includes a light-emitting device LED chip as a light source will be described below as an example of a light-emitting apparatus of a second embodiment. FIG. 25 is a schematic cross-sectional view of the LED light-emitting apparatus of the second embodiment. As illustrated in FIG. 25, a LED light-emitting apparatus 10 includes a phosphor 11, a LED chip (an example of a solid-state light source) 15, and a LED sealing member 24. The LED light-emitting apparatus 10 may include a support 23. The support 23 supports the LED chip 15. In the present embodiment, the LED light-emitting apparatus 10 has a structure for surface mounting, and the support 23 is a substrate. In the LED light-emitting apparatus 10, the phosphor 11 and the LED sealing member 24 constitute a wavelength convertor.

The present embodiment can be applied to a high-brightness LED light-emitting apparatus. For example, the support 23 has high thermal conductivity so as to efficiently dissipate heat generated by the LED chip 15. For example, the support 23 may be a ceramic substrate formed of alumina or aluminum nitride.

The LED chip 15 emits at least green light. More specifically, the LED chip 15 has at least an emission spectrum peak in the wavelength range of 480 to 550 nm, desirably 510 to 540 nm. The LED chip 15 is fixed to the support 23, for example, with solder 27 such that an output surface 15a is not contact with the support 23. The LED chip 15 is electrically connected to an electrode 22 on the support 23 via a bonding wire 21. The LED chip 15 is covered with the LED sealing member 24.

The LED sealing member 24 is formed of a silicone resin, for example. The phosphor 11 is dispersed in the LED sealing member 24. The silicone resin may be one of silicone resins with structures represented by various chemical formulae used as sealing resins of semiconductor light-emitting devices. The silicone resin contains color-fast dimethyl silicone, for example. Heat-resistant methylphenyl silicone may also be used as a silicone resin. The silicone resin may be a homopolymer with a siloxane-bonded main skeleton represented by one chemical formula. Alternatively, the silicone resin may be a copolymer with structural units containing a siloxane bond represented by two or more chemical formulae or may be an alloy of two or more silicone polymers.

In the present embodiment, the silicone resin in the LED sealing member 24 has a cured state. Thus, the LED sealing member 24 also has a cured state. As described below, the LED sealing member 24 can be produced from an uncured silicone resin. In general, silicone resins are of two-component type in which a major agent and a curing agent are mixed to promote curing. However, a thermosetting silicone resin or an energy-curable silicone resin, which can be cured by irradiation with energy, such as light, may also be used. The LED sealing member 24 may be formed of a material other than silicone resins. For example, glass, an epoxy resin, or an inorganic material composed of ZnO may be used. Instead of being dispersed in the LED sealing member 24, the phosphor 11 may be disposed in the form of a phosphor plate on the LED sealing member 24.

Although the LED chip is wire-bonded in the example, the LED chip used in the present embodiment may have another structure. More specifically, the LED chip used in the present embodiment may be face-up mounted or flip-chip mounted. The LED chip used in the present embodiment may include a light-emitting layer formed of a nitride semiconductor with a growth surface of a general polar face (c face).

<Outline of Phosphor>

The phosphor 11 absorbs part or all of the wavelength components of light emitted from the LED chip 15 and produces fluorescence. The wavelength of light to be absorbed and the wavelength of fluorescence depend on the type of fluorescent material contained in the phosphor 11. The phosphor 11 may be a mixed phosphor containing different color phosphors so as to produce white light by color mixing. The phosphor 11 may be a mixed phosphor of a green phosphor and a red phosphor. The red phosphor is the red phosphor including the Ce luminescent center described in the first embodiment.

Examples of the green phosphor include $M^{II}_2MgSi_2O_7$:$Eu^{2+}$ ($M^{II}$=at least one selected from Ba, Sr, and Ca), $SrSi_5AlO_2N_7$:$Eu^{2+}$, $SrSi_2O_2N_2$:$Eu^{2+}$, $BaAl_2O_4$:$Eu^{2+}$, $BaZrSi_3O_9$:$Eu^{2+}$, $M^{II}_2SiO_4$:$Eu^{2+}$ ($M^{II}$=at least one selected from Ba, Sr, and Ca), $BaSi_3O_4N_2$:$Eu^{2+}$, $Ca_8Mg(SiO_4)_4Cl_2$:$Eu^{2+}$, $Ca_3SiO_4Cl_2$:$Eu^{2+}$, and β-SiAlON:$Eu^{2+}$ phosphors.

In another embodiment, the phosphor 11 may be a mixed phosphor of a yellow phosphor and a red phosphor. The red phosphor is the phosphor of the first embodiment. Examples of the yellow phosphor include $Y_3Al_5O_{12}$:$Ce^{2+}$, $CaSi_2O_2N_2$:$Eu^{2+}$, $(Ba,Sr)Si_2O_2N_2$:$Eu^{2+}$, $Ca_3Sc_2Si_3O_{12}$:$Ce^{3+}$, $CaSc_2O_4$:$Ce^{3+}$, α-SiAlON:$Eu^{2+}$, and $La_3Si_6N_{11}$:$Ce^{3+}$ phosphors.

The phosphor 11 has a particle size in the range of 1 to 80 μm, for example. The term "particle size", as used herein, refers to the equivalent circular diameter determined by microscopy.

For example, the LED sealing member 24 contains 3 to 70 parts by weight of the phosphor 11 per 100 parts by weight of the sealing member. Less than 3 parts by weight of the phosphor 11 cannot produce fluorescence of sufficient intensity, thus possibly failing to provide the LED light-emitting apparatus 10 that emits light of a desired wavelength. The weight ratio of color phosphors in the phosphor 11 depends on the desired color tone and the emission intensity of each of the color phosphors. The LED light-emitting apparatus can be configured to produce a desired color by using the phosphor 11 composed of the red phosphor of the first embodiment alone or in combination with another color phosphor.

The phosphors other than the red phosphor including the Ce luminescent center described in the first embodiment can be produced by a known method. More specifically, a raw material used to produce an oxide phosphor may be a compound that forms an oxide by firing, such as a hydroxide, oxalate, or nitrate, or may be an oxide. A small amount of fluoride (for example, calcium fluoride) or chloride (for example, calcium chloride) may be added to promote the reaction. A phosphor is produced by firing a mixture of the raw materials.

The raw materials may be mixed by wet blending in a solvent or by dry blending of dry powders. Industrially commonly used ball mills, medium stirring mills, planetary mills, vibrating mills, jet mills, V-type mixers, and agitators may be used. The phosphor raw materials are fired in the air or in a reducing atmosphere at a temperature in the range of 1100° C. to 1700° C. for approximately 1 to 50 hours. The firing furnace may be an industrially commonly used furnace. For example, a continuous or batch-wise electric furnace or gas furnace, such as a pusher furnace, or a high-pressure furnace of plasma sintering (SPS) or hot isostatic pressing sintering (HIP) may be used. The resulting phosphor powder may be ground again in a ball mill or a jet mill and, if necessary, may be washed or classified to adjust the particle size distribution and flowability of the phosphor powder.

As described above, the light-emitting apparatus of the second embodiment includes the solid-state light source that emits green light and the red phosphor including the Ce luminescent center, unlike known light-emitting apparatuses. The light-emitting apparatus of the second embodiment with such a structure can be used as a high-efficiency light source.

Third Embodiment

Figure 26:
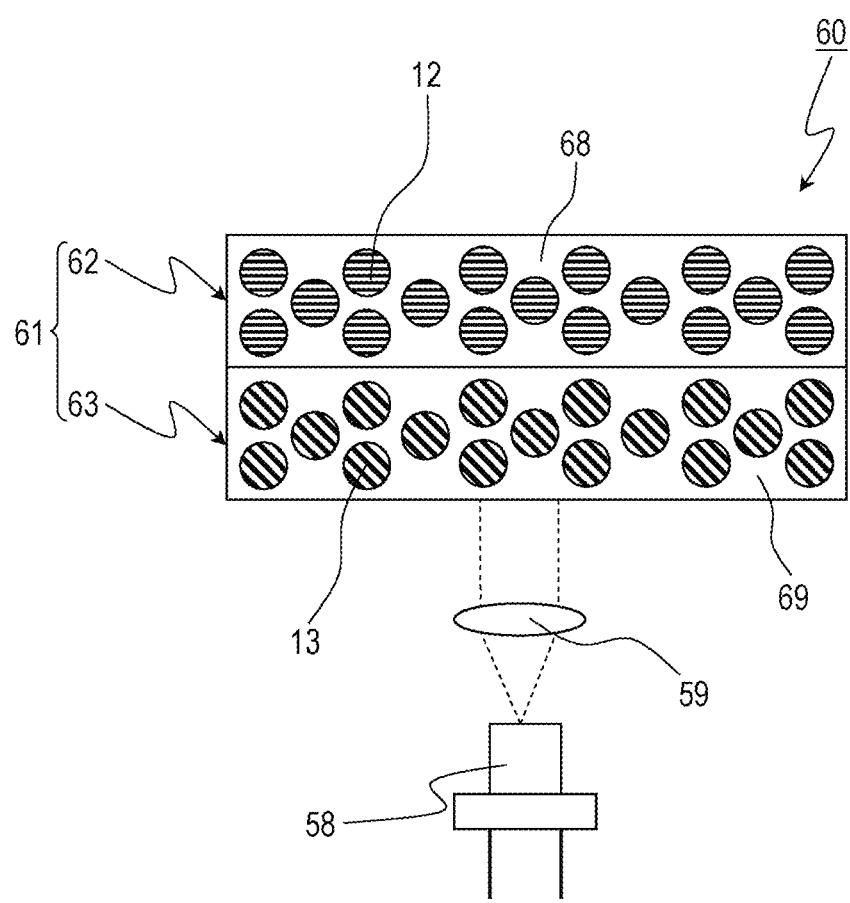
FIG. 26 is a schematic cross-sectional view of a LD light-emitting apparatus according to a third embodiment.

A third embodiment describes as an example of a light-emitting apparatus of the present disclosure a LD light-emitting apparatus that includes a light-emitting device LD as a light source. FIG. 26 is a schematic view of a LD light-emitting apparatus 60 according to the third embodiment. The LD light-emitting apparatus 60 includes a LD device (an example of a solid-state light source) 58 and a wavelength conversion member (an example of a wavelength convertor) 61. The wavelength conversion member 61 contains a phosphor. The phosphor converts output light emitted from the LD device 58 to light with a longer wavelength.

The LD device 58 can emit light with a higher light power density than LEDs. Thus, the LD device 58 can constitute the LD light-emitting apparatus 60 with high power. In order to increase the power of the LD light-emitting apparatus 60, the light power density of the LD device 58 to irradiate the phosphor is 0.5 W/mm$^2$ or more, for example. The light power density for irradiation of the phosphor may be 2 W/mm$^2$ or more, 3 W/mm$^2$ or more, or 10 W/mm$^2$ or more. However, an excessively high light power density for irradiation of the phosphor may result in an increased amount of heat generation by the phosphor and may adversely affect the LD light-emitting apparatus 60. Thus, the light power density for irradiation of the phosphor may be 150 W/mm$^2$ or less, 100 W/mm$^2$ or less, 50 W/mm$^2$ or less, or 20 W/mm$^2$ or less.

The LD device 58 may be a LD device that emits green light. More specifically, the LD device 58 has at least an emission spectrum peak in the wavelength range of 480 to 550 nm, desirably 510 to 540 nm.

The LD device 58 may be composed of one LD or optically coupled LDs. For example, the LD device 58 may include a light-emitting layer formed of a nitride semiconductor with a growth surface of a nonpolar face or semipolar face.

The phosphor of the wavelength conversion member 61 includes a red phosphor including Ce as a luminescent center. The red phosphor including the Ce luminescent center is described in the first embodiment and is not described in detail here. Depending on the desired emission color of the light-emitting apparatus, the wavelength conversion member 61 may further contain a phosphor other than the red phosphor including the Ce luminescent center. For example, the wavelength conversion member 61 may further contain a yellow phosphor and a green phosphor. The yellow phosphor and the green phosphor may be those exemplified in the second embodiment. The wavelength conversion member 61 may be a wavelength conversion layer containing a mixture of phosphors or may be at least two wavelength conversion layers each containing one or more phosphors. The present embodiment particularly describes the wavelength conversion member 61 with a layered structure composed of a first phosphor layer 62 containing a red phosphor 12 including Ce as a luminescent center and a second phosphor layer 63 containing a yellow phosphor 13.

The first phosphor layer 62 and the second phosphor layer 63 contain binders 68 and 69, respectively. The binders 68 and 69 may be a medium such as a resin, glass, or transparent crystal. The binders 68 and 69 may be the same material or different materials. The phosphor layers may be composed of phosphor particles alone.

An incident optical system 59 for directing light from the LD device 58 to the second phosphor layer 63 may be disposed between the wavelength conversion member 61 and the LD device 58. The incident optical system 59 includes a lens, a mirror, or an optical fiber, for example.

The operation of the LD light-emitting apparatus 60 of the present embodiment will be described below. Green light emitted from the LD device 58 is incident on the second phosphor layer 63 of the wavelength conversion member 61 through the incident optical system 59. The incident light excites the yellow phosphors 13 in the second phosphor layer 63 and induces the emission of yellow light. Green light emitted from the LD device 58 and passing through the second phosphor layer 63 without absorption is incident on the first phosphor layer 62. The incident light excites the red phosphors 12 in the first phosphor layer 62 and induces the emission of red light. The yellow light emitted from the second phosphor layer 63 is incident on the first phosphor layer 62. Part of the incident light may excite the red phosphors 12 in the first phosphor layer 62 and induce the emission of red light. Green light emitted from the LD device 58 and passing through the first phosphor layer 62 and the second phosphor layer 63 without absorption is emitted outward. Mixed light of the red light, yellow light, and green light is emitted from the LD light-emitting apparatus 60.

The thickness of each phosphor layer may be adjusted such that green light emitted from the LD device 58 does not pass through the first phosphor layer 62. The thickness of each phosphor layer may also be adjusted such that yellow light emitted from the second phosphor layer 63 does not pass through the first phosphor layer 62. In this case, only red light is emitted outward. In another embodiment, the yellow phosphor 13 in the second phosphor layer 63 may be substituted by the green phosphor described in the second embodiment.

As described above, the light-emitting apparatus of the third embodiment includes the solid-state light source that emits green light and the red phosphor including the Ce luminescent center, unlike known light-emitting apparatuses. The light-emitting apparatus of the third embodiment with such a structure can be used as a high-efficiency light source.

Fourth Embodiment

Figure 27:
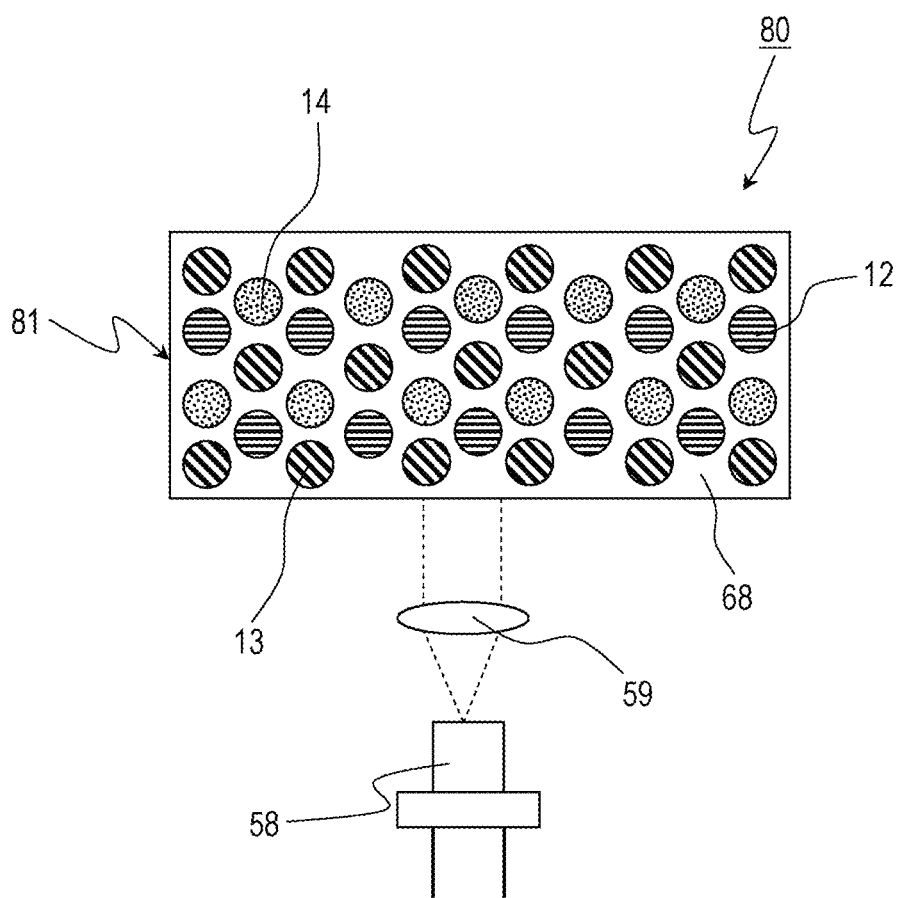
FIG. 27 is a schematic cross-sectional view of a LD light-emitting apparatus according to a fourth embodiment.

In a fourth embodiment, a LD light-emitting apparatus that includes a light-emitting device LD as a light source will be described below as an example of a light-emitting apparatus of the present disclosure. FIG. 27 is a schematic view of a LD light-emitting apparatus 80 according to the fourth embodiment. The components described in the third embodiment are denoted by the same reference numerals in the present embodiment and will not be described again. The LD light-emitting apparatus 80 includes the LD device 58 and a wavelength conversion member 81.

The wavelength conversion member 81 contains a phosphor. The phosphor converts output light emitted from the LD device 58 to light with a longer wavelength. The phosphor in the wavelength conversion member 81 includes a wavelength conversion layer containing a mixture of the red phosphor 12 and at least one selected from the group consisting of the yellow phosphor 13 and a green phosphor 14. The red phosphor 12 is a red phosphor including Ce as a luminescent center. The red phosphor including the Ce luminescent center is described in the first embodiment and is not described in detail here. The yellow phosphor and the green phosphor may be those exemplified in the second embodiment. The present embodiment particularly describes the wavelength conversion member 81 including a phosphor layer containing a mixture of the red phosphor 12, the yellow phosphor 13, and the green phosphor 14. The mixing ratio of three phosphors can be appropriately adjusted according to the desired color tone of light and the emission intensity of each phosphor.

The phosphor layer of the wavelength conversion member 81 contains a binder 68. The binder 68 may be a medium such as a resin, glass, or transparent crystal. The binder 68 may be of uniform quality or of different qualities at different portions. The phosphor layer may be composed of phosphor particles alone.

Green light emitted from the LD device 58 and passing through the incident optical system 59 is converted to red light, yellow light, and green light by the red phosphor 12, the yellow phosphor 13, and the green phosphor 14, respectively, in the wavelength conversion member 81. The LD light-emitting apparatus 80 emits a mixture of green light emitted from the LD device 58 and not absorbed by the phosphors and red light, yellow light, and green light converted by the red phosphor 12, the yellow phosphor 13, and the green phosphor 14, respectively. The red phosphor 12 may be excited by part of green light emitted from the green phosphor 14 and may emit red light.

As described above, the light-emitting apparatus of the fourth embodiment includes the solid-state light source that emits green light and the red phosphor including the Ce luminescent center, unlike known light-emitting apparatuses. The light-emitting apparatus of the fourth embodiment with such a structure can be used as a high-efficiency light source.

Fifth Embodiment

A light-emitting apparatus according to a fifth embodiment includes a solid-state light source and a wavelength convertor, which converts the wavelength of output light emitted from the solid-state light source.

The solid-state light source emits green light and blue light. The green light has a peak wavelength in the range of 480 to 550 nm, desirably 510 to 540 nm. The blue light may have a peak wavelength in the range of 430 to 470 nm.

The solid-state light source is a LED or LD, for example. The solid-state light source may be a GaN LED or LD, desirably a GaN LD. The solid-state light source may include a GaN semiconductor laser that emits blue light and a YAG:Nd solid-state laser that emits green light and that includes a second harmonic generator.

The wavelength convertor contains at least a red phosphor including Ce as a luminescent center. The red phosphor including the Ce luminescent center is described in the first embodiment and is not described in detail here.

Such components can constitute a light-emitting apparatus with high quantum efficiency even at high power.

When the red phosphor including the Ce luminescent center is referred to as a first phosphor, the wavelength convertor in the present embodiment may further contain a second phosphor having an emission peak wavelength in the range of 500 to 600 nm. Upon irradiation with light emitted from a blue excitation light source, the second phosphor produces fluorescence with a longer wavelength than the light emitted from the blue excitation light source. The second phosphor may be a phosphor containing a crystal phase having the chemical composition of $Y_3Al_5O_{12}$:Ce (YAG:Ce) or a phosphor containing a crystal phase having the chemical composition of $La_3Si_6N_{11}$:Ce (LSN:Ce).

The second phosphor may be a phosphor that emits yellow light and may be combined with a third phosphor that emits green light. More specifically, in addition to the red phosphor including the Ce luminescent center and the second phosphor that emits yellow light, the wavelength convertor in the present embodiment may further contain the third phosphor that emits green light. Upon irradiation with light emitted from a solid-state light source, the third phosphor produces fluorescence with a longer wavelength than light emitted from the excitation light source. The third phosphor may be a phosphor containing a crystal phase having the chemical composition of $Lu_3Al_5O_{12}$:Ce (LuAG:Ce) or a phosphor containing a crystal phase having the chemical composition of $Y_3(Al,Ga)_5N_{12}$:Ce (YAGG:Ce).

Light from the second phosphor or the third phosphor may be utilized to excite the red phosphor including the Ce luminescent center.

The third green phosphor may be combined instead of the second yellow phosphor. More specifically, the wavelength convertor in the present embodiment may contain the third phosphor that emits green light in addition to the red phosphor including the Ce luminescent center.

The solid-state light source, the red phosphor, and the second and third phosphors in the light-emitting apparatus of the present embodiment can be freely chosen within the limits described above in accordance with the intended use of the light-emitting apparatus.

All phosphors in the wavelength convertor in the present embodiment may have a 1/e emission lifetime of 100 ns or less. The emission lifetime has an influence on the luminance saturation characteristics. Phosphors containing Eu, such as a known red phosphor CASN:Eu, have a longer emission lifetime than phosphors containing Ce. Thus, phosphors containing Eu are likely to reach luminance saturation due to a decrease in quantum efficiency during high-energy excitation. Thus, the red phosphor including the Ce luminescent center is expected to be a red phosphor with higher quantum efficiency than known red phosphors even at high power.

As described above, the light-emitting apparatus of the present embodiment includes the solid-state light source that emits green light and blue light and the red phosphor including the Ce luminescent center, unlike known light-emitting apparatuses. The light-emitting apparatus of the present embodiment with such a structure can be used as a high-power light-emitting apparatus with good color rendering properties or a high-power light-emitting apparatus that emits incandescent lamp color light.

Sixth Embodiment

A sixth embodiment describes as an example of a light-emitting apparatus of the present disclosure a LED light-emitting apparatus that includes a light-emitting device LED chip as a light source.

Figure 28:
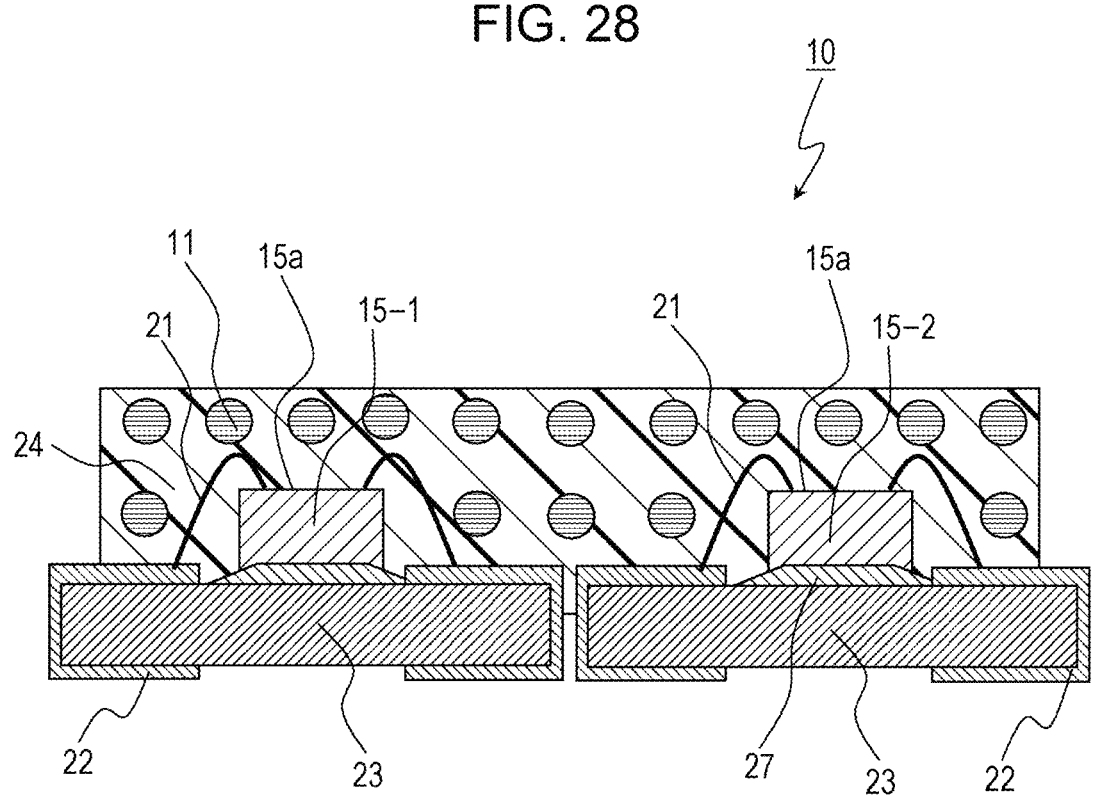
FIG. 28 is a schematic cross-sectional view of a LED light-emitting apparatus according to a sixth embodiment.

FIG. 28 is a schematic cross-sectional view of the LED light-emitting apparatus of the sixth embodiment. As illustrated in FIG. 28, a LED light-emitting apparatus 10 includes a phosphor 11, a LED chip 15-1, a LED chip 15-2, and a LED sealing member 24. The LED light-emitting apparatus 10 may include a support 23. The support 23 supports the LED chips 15. In the present embodiment, the LED light-emitting apparatus 10 has a structure for surface mounting, and the support 23 is a substrate. In the present embodiment, the LED chips 15 refer to both the LED chip 15-1 and the LED chip 15-2.

The present embodiment can be applied to a high-brightness LED light-emitting apparatus. For example, the support 23 has high thermal conductivity so as to efficiently dissipate heat generated by the LED chips 15. For example, the support 23 may be a ceramic substrate formed of alumina or aluminum nitride.

The LED chip 15-1 emits light in a blue region and has an emission spectrum peak in the wavelength range of 430 to 470 nm. More specifically, the LED chip 15-1 is a blue LED chip.

The LED chip 15-2 emits light in a green region and has an emission spectrum peak in the wavelength range of 480 to 550 nm, desirably 510 to 540 nm. More specifically, the LED chip 15-2 is a green LED chip.

The LED chips 15 are fixed to the support 23, for example, with solder 27 such that an output surface 15a is not contact with the support 23. The LED chips 15 are electrically connected to an electrode 22 on the support 23 via a bonding wire 21. The LED chips 15 are covered with the LED sealing member 24.

The LED sealing member 24 is formed of a silicone resin. The phosphor 11 is dispersed in the LED sealing member 24. The silicone resin may be one of silicone resins with structures represented by various chemical formulae used as sealing resins of semiconductor light-emitting devices. The silicone resin contains color-fast dimethyl silicone, for example. Heat-resistant methylphenyl silicone may also be used as a silicone resin. The silicone resin may be a homopolymer with a siloxane-bonded main skeleton represented by one chemical formula. Alternatively, the silicone resin may be a copolymer with structural units containing a siloxane bond represented by two or more chemical formulae or may be an alloy of two or more silicone polymers.

In the present embodiment, the silicone resin in the LED sealing member 24 has a cured state. Thus, the LED sealing member 24 also has a cured state. As described below, the LED sealing member 24 can be produced from an uncured silicone resin. In general, silicone resins are of two-component type in which a major agent and a curing agent are mixed to promote curing. However, a thermosetting silicone resin or an energy-curable silicone resin, which can be cured by irradiation with energy, such as light, may also be used. The LED sealing member 24 may be formed of a material other than silicone resins. For example, glass, an epoxy resin, or an inorganic material composed of ZnO may be used. Instead of being dispersed in the LED sealing member 24, the phosphor 11 may be disposed in the form of a phosphor plate on the LED sealing member 24.

Although the LED chip is wire-bonded in the example, the LED chip used in the present embodiment may have another structure. More specifically, the LED chip used in the present embodiment may be face-up mounted or flip-chip mounted. The LED chip used in the present embodiment may include a light-emitting layer formed of a nitride semiconductor with a growth surface of a general polar face (c face).

<Outline of Phosphor>

The phosphor 11 absorbs part or all of the wavelength components of light in a blue region emitted from the LED chip 15-1 and light in a green region emitted from the LED chip 15-2 and produces fluorescence. The wavelength of light to be absorbed and the wavelength of fluorescence depend on the type of fluorescent material contained in the phosphor 11. The phosphor 11 may be a mixed phosphor containing different color phosphors so as to produce white light by color mixing. The phosphor 11 may be a mixed phosphor of a green phosphor and a red phosphor. The red phosphor is the red phosphor including the Ce luminescent center described in the first embodiment.

The green phosphor may be a $Lu_3Al_5O_{12}$:Ce or $Y_3(Al, Ga)_5N_{12}$:Ce phosphor.

In another embodiment, the phosphor 11 may be a mixed phosphor of a yellow phosphor and a red phosphor. The yellow phosphor may be a $Y_3Al_5O_{12}$:Ce (YAG:Ce) or $La_3Si_6N_{11}$:Ce phosphor.

The phosphor 11 has a particle size in the range of 1 to 80 µm, for example. The term "particle size", as used herein, refers to the equivalent circular diameter determined by microscopy.

For example, the LED sealing member 24 contains 3 to 70 parts by weight of the phosphor 11 per 100 parts by weight of the sealing member. Less than 3 parts by weight of the phosphor 11 cannot produce fluorescence of sufficient intensity, thus possibly failing to provide the LED light-emitting apparatus 10 that emits light of a desired wavelength. The weight ratio of color phosphors in the phosphor 11 depends on the desired color tone of white light and the emission intensity of each of the color phosphors. The LED light-emitting apparatus can also be configured to produce a color other than white by using the phosphor 11 composed of the red phosphor of the first embodiment alone or in combination with other color phosphor(s).

In the light-emitting apparatus of the sixth embodiment, the red phosphor including the Ce luminescent center is excited by green light with high absorption efficiency. Thus, the light-emitting apparatus of the sixth embodiment can have higher quantum efficiency than known light-emitting apparatuses. Furthermore, the light-emitting apparatus of the sixth embodiment configured as a white-light-emitting apparatus can exhibit good color rendering properties and color reproducibility.

Seventh Embodiment

Figure 29:
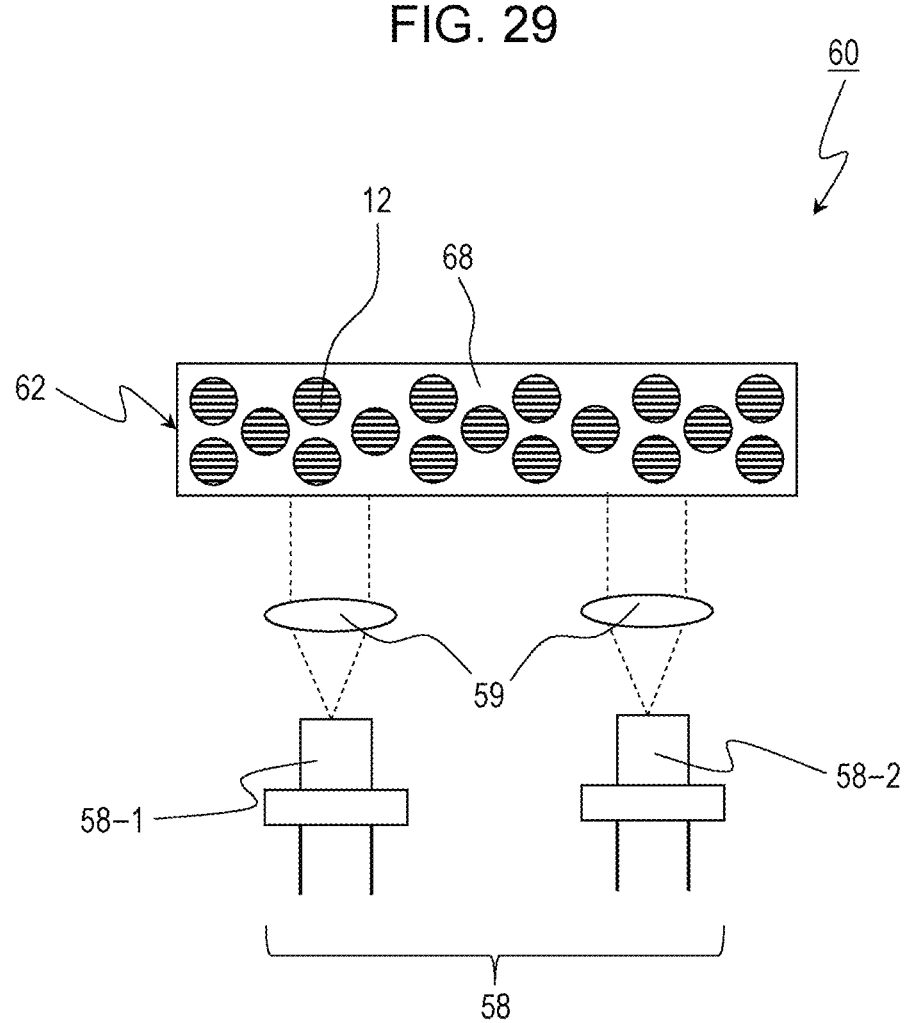
FIG. 29 is a schematic cross-sectional view of a LD light-emitting apparatus according to a seventh embodiment.

A seventh embodiment describes as an example of a light-emitting apparatus of the present disclosure a LD light-emitting apparatus that includes a light-emitting device LD as a light source. FIG. 29 is a schematic view of a LD light-emitting apparatus 60 according to the seventh embodiment. The LD light-emitting apparatus 60 includes a LD device (an example of solid-state light source) 58-1, a LD device (another example of solid-state light source) 58-2, and a phosphor layer 62 as a wavelength conversion member (an example of wavelength convertor). The LD device 58-1 is a LD that emits blue light. The LD device 58-2 is a LD that emits green light. The phosphor layer 62 contains a phosphor. The phosphor converts output light from the LD devices 58 to light with a longer wavelength. In the present embodiment, the LD devices 58 refer to the LD device 58-1 and the LD device 58-2.

The LD devices 58 can emit light with a higher light power density than LEDs. Thus, the LD devices 58 can constitute the LD light-emitting apparatus 60 with high power. In order to increase the power of the LD light-emitting apparatus 60, the light power density of the LD devices 58 to irradiate the phosphor is 0.5 W/mm$^2$ or more, for example. The light power density for irradiation of the phosphor may be 2 W/mm$^2$ or more, 3 W/mm$^2$ or more, or 10 W/mm$^2$ or more. However, an excessively high light power density for irradiation of the phosphor may result in an increased amount of heat generation by the phosphor and may adversely affect the LD light-emitting apparatus 60. Thus, the light power density for irradiation of the phosphor may be 150 W/mm$^2$ or less, 100 W/mm$^2$ or less, 50 W/mm$^2$ or less, or 20 W/mm$^2$ or less.

The LD device 58-1 emits light in a blue region and has an emission spectrum peak in the wavelength range of 430 to 470 nm. More specifically, the LD device 58-1 is a LD device that emits blue light. The LD device 58-1 may be a GaN semiconductor laser, that is, a GaN LD.

The LD device 58-2 emits light in a green region and has an emission spectrum peak in the wavelength range of 480 to 550 nm, desirably 510 to 540 nm. More specifically, the LD device 58-2 is a LD device that emits green light. The LD device 58-2 may be a GaN semiconductor laser, that is, a GaN LD. The LD device 58-2 may also be a YAG:Nd solid-state laser with a second harmonic generator.

For example, the LD devices 58 may include a light-emitting layer formed of a nitride semiconductor with a growth surface of a nonpolar face or semipolar face.

The phosphor layer 62 of the wavelength conversion member contains the red phosphor 12 including the Ce luminescent center. The red phosphor 12 including the Ce luminescent center is described in the first embodiment and is not described in detail here.

The phosphor layer 62 contains the binder 68. The binder 68 may be a medium such as a resin, glass, or transparent crystal. The phosphor layer 62 may be composed of phosphor particles alone.

The incident optical systems 59 for directing light from the LD devices 58 to the phosphor layer 62 may be disposed between the phosphor layer 62 and the LD device 58-1 and between the phosphor layer 62 and the LD device 58-2. The incident optical systems 59 include a lens, a mirror, or an optical fiber, for example.

The operation of the LD light-emitting apparatus 60 of the present embodiment will be described below. Blue light emitted from the LD device 58-1 is incident on the phosphor layer 62 through the incident optical system 59. The incident light excites the red phosphors 12 in the phosphor layer 62 and induces the emission of red light. Blue light emitted from the LD device 58-1 and passing through the phosphor layer 62 without absorption is emitted outward.

Green light emitted from the LD device 58-2 is incident on the phosphor layer 62 through the incident optical system 59. The incident light excites the red phosphors 12 in the phosphor layer 62 and induces the emission of red light. Green light emitted from the LD device 58-2 and passing through the phosphor layer 62 without absorption is emitted outward.

The red light, green light, and blue light emitted outward from the phosphor layer 62 are mixed to produce white light.

The thickness of the phosphor layer 62 may be adjusted such that blue light emitted from the LD device 58-1 and green light emitted from the LD device 58-2 do not pass through the phosphor layer 62. In this case, only red light is emitted outward.

Modified examples of the LD light-emitting apparatus 60 of the present embodiment will be described below with reference to FIGS. 30A to 30H. In the following description, the structure of the LD light-emitting apparatus 60 illustrated in FIG. 29 is also referred to as the basic structure.

Figure 30A:
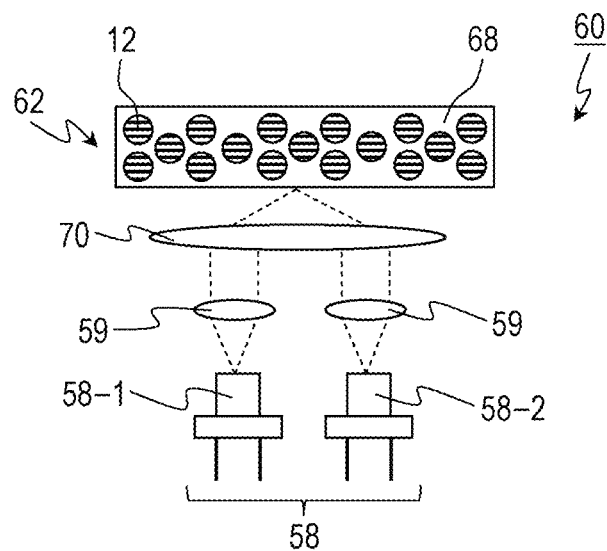
FIG. 30A is a schematic cross-sectional view of a first modified example of the LD light-emitting apparatus according to the seventh embodiment.

FIG. 30A is a schematic view of a first modified example of the LD light-emitting apparatus 60 of the present embodiment. The LD light-emitting apparatus 60 of the first modified example includes a condenser lens 70 between the incident optical systems 59 and the phosphor layer 62. Blue light and green light emitted from the incident optical systems 59 are condensed by the condenser lens 70 on the phosphor layer 62. The other components of the first modified example are the same as those in the basic structure.

Figure 30B:
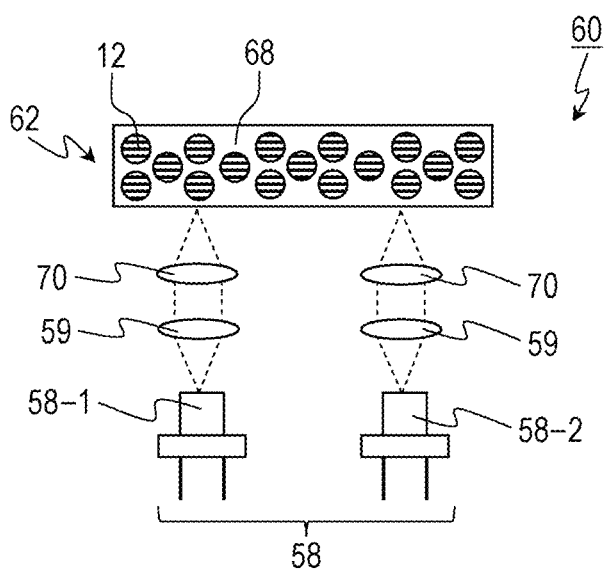
FIG. 30B is a schematic cross-sectional view of a second modified example of the LD light-emitting apparatus according to the seventh embodiment.

FIG. 30B is a schematic view of a second modified example of the LD light-emitting apparatus 60 of the present embodiment. The LD light-emitting apparatus 60 of the second modified example includes a condenser lens 70 between the incident optical system 59 and the phosphor layer 62 for the LD device 58-1. Blue light emitted from the incident optical system 59 is condensed by the condenser lens 70 on the phosphor layer 62. The LD light-emitting apparatus 60 of the second modified example further includes a condenser lens 70 between the incident optical system 59 and the phosphor layer 62 for the LD device 58-2. Green light emitted from the incident optical system 59 is condensed by the condenser lens 70 on the phosphor layer 62. The other components of the second modified example are the same as those in the basic structure.

Figure 30C:
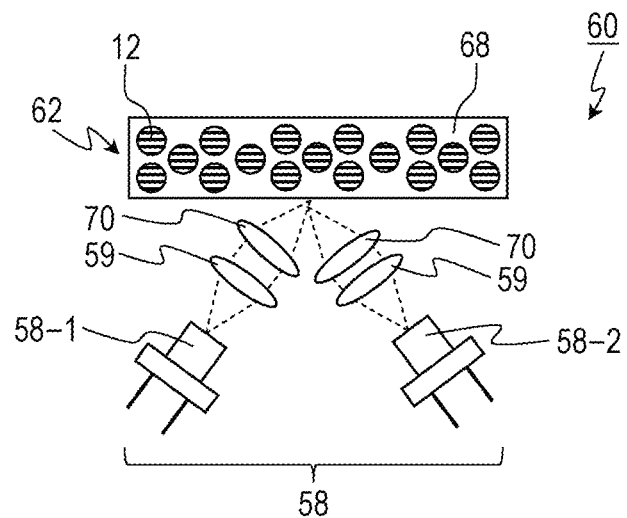
FIG. 30C is a schematic cross-sectional view of a third modified example of the LD light-emitting apparatus according to the seventh embodiment.

FIG. 30C is a schematic view of a third modified example of the LD light-emitting apparatus 60 of the present embodiment. The structure of the second modified example is further modified in the LD light-emitting apparatus 60 of the third modified example. In the LD light-emitting apparatus 60 of the third modified example, the LD device 58-1 and the LD device 58-2 in the structure of the second modified example are tilted with respect to the surface of the phosphor layer 62 to be irradiated. This structure can make the blue light irradiated region and the green light irradiated region coincide on the phosphor layer 62.

Figure 30D:
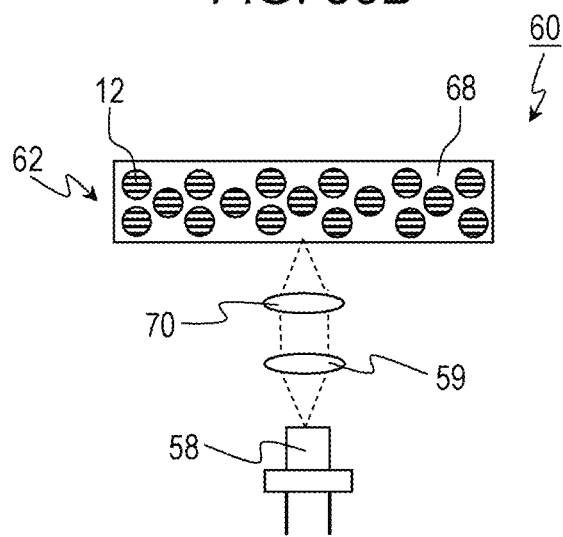
FIG. 30D is a schematic cross-sectional view of a fourth modified example of the LD light-emitting apparatus according to the seventh embodiment.

FIG. 30D is a schematic view of a fourth modified example of the LD light-emitting apparatus 60 of the present embodiment. The LD light-emitting apparatus 60 of the fourth modified example includes one LD device 58 that includes both a blue LD and a green LD. The other components of the fourth modified example are the same as those in the basic structure. This structure enables one LD device to emit both green light and blue light and can decrease the size of a light-emitting apparatus, for example.

Figure 30E:
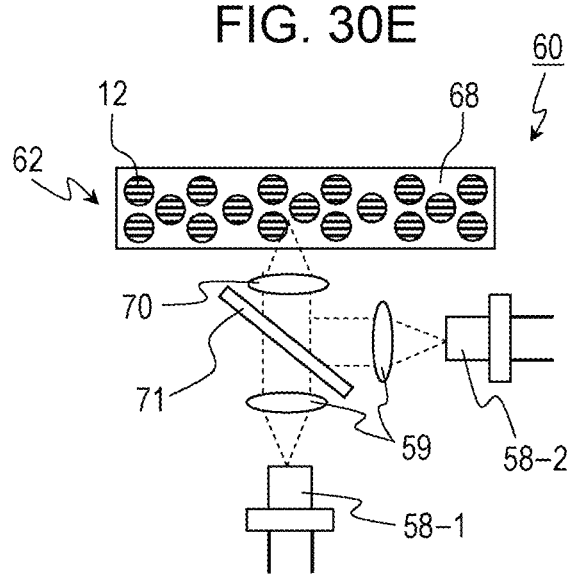
FIG. 30E is a schematic cross-sectional view of a fifth modified example of the LD light-emitting apparatus according to the seventh embodiment.

FIG. 30E is a schematic view of a fifth modified example of the LD light-emitting apparatus 60 of the present embodiment. The LD light-emitting apparatus 60 of the fifth modified example includes a dichroic mirror 71 for directing blue light emitted from the LD device 58-1 and green light emitted from the LD device 58-2 to the phosphor layer 62. The LD light-emitting apparatus 60 of the fifth modified example further includes a condenser lens 70 between the dichroic mirror 71 and the phosphor layer 62. Blue light and green light emitted from the dichroic mirror 71 are condensed by the condenser lens 70 on the phosphor layer 62. The other components of the fifth modified example are the same as those in the basic structure.

Figure 30F:
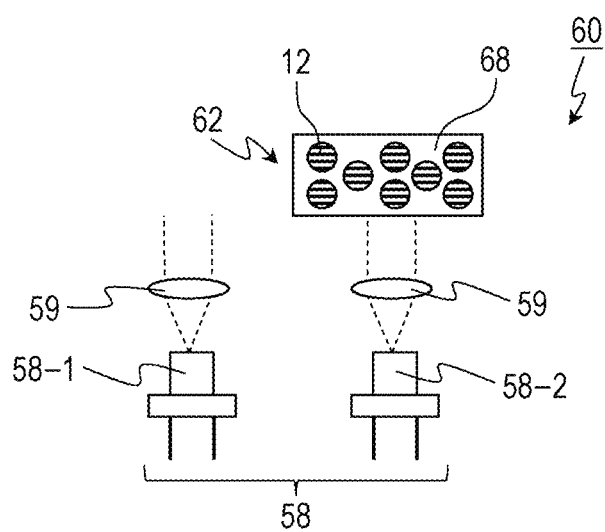
FIG. 30F is a schematic cross-sectional view of a sixth modified example of the LD light-emitting apparatus according to the seventh embodiment.

FIG. 30F is a schematic view of a sixth modified example of the LD light-emitting apparatus 60 of the present embodiment. In the LD light-emitting apparatus 60 of the sixth modified example, blue light emitted from the LD device 58-1 is not incident on the phosphor layer 62. In other words, in the LD light-emitting apparatus 60 of the sixth modified example, only green light emitted from the LD device 58-2 is incident on the phosphor layer 62. The other components of the sixth modified example are the same as those in the basic structure. In the sixth modified example, green light emitted from the LD device 58-2 is incident on the phosphor layer 62 through the incident optical system 59. The incident light excites the red phosphors 12 in the phosphor layer 62 and induces the emission of red light. Green light emitted from the LD device 58-2 and passing through the phosphor layer 62 without absorption is emitted outward. Red light and green light emitted outward from the phosphor layer 62 and blue light emitted from the LD device 58-1 are mixed to produce white light.

Figure 30G:
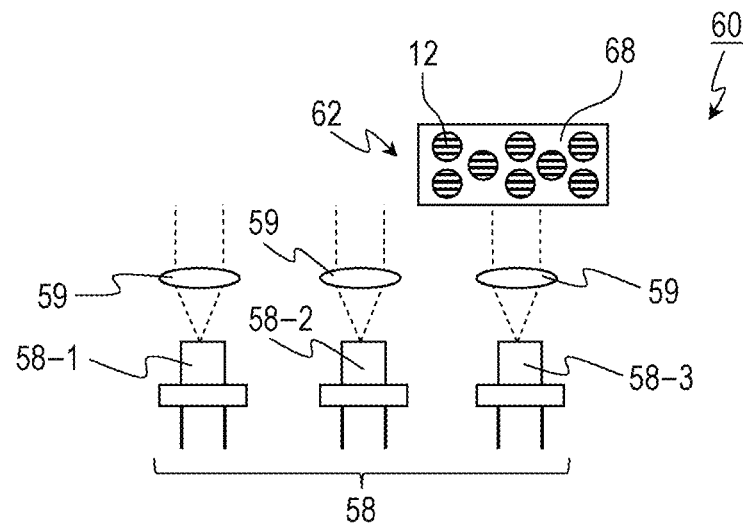
FIG. 30G is a schematic cross-sectional view of a seventh modified example of the LD light-emitting apparatus according to the seventh embodiment.

FIG. 30G is a schematic view of a seventh modified example of the LD light-emitting apparatus 60 of the present embodiment. The LD light-emitting apparatus 60 of the seventh modified example includes a LD device 58-3 in addition to the basic structure. The LD device 58-3 emits light in a green region and has an emission spectrum peak in the wavelength range of 480 to 550 nm, desirably 510 to 540 nm. In the LD light-emitting apparatus 60 of the seventh modified example, only green light emitted from the LD device 58-3 is incident on the phosphor layer 62. Blue light emitted from the LD device 58-1 and green light emitted from the LD device 58-2 are not incident on the phosphor layer 62 and are directly used. In the seventh modified example, green light emitted from the LD device 58-3 is incident on the phosphor layer 62 through the incident optical system 59. The incident light excites the red phosphors 12 in the phosphor layer 62 and induces the emission of red light. Green light emitted from the LD device 58-2 and passing through the phosphor layer 62 without absorption is emitted outward. Red light and green light emitted outward from the phosphor layer 62, blue light emitted from the LD device 58-1, and green light emitted from the LD device 58-2 are mixed to produce white light.

Figure 30H:
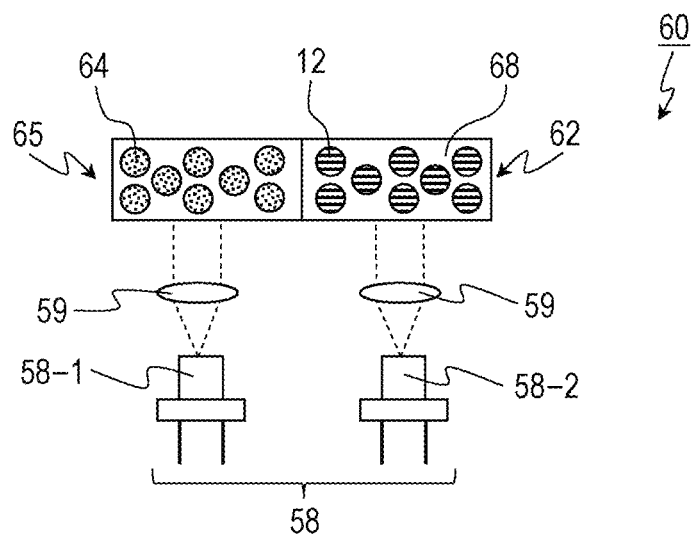
FIG. 30H is a schematic cross-sectional view of an eighth modified example of the LD light-emitting apparatus according to the seventh embodiment.

FIG. 30H is a schematic view of an eighth modified example of the LD light-emitting apparatus 60 of the present embodiment. In the LD light-emitting apparatus 60 of the eighth modified example, only green light emitted from the LD device 58-2 is incident on the phosphor layer 62. Blue light emitted from the LD device 58-1 is incident on a scatterer layer 65 containing a scatterer 64. In the eighth modified example, green light emitted from the LD device 58-2 is incident on the phosphor layer 62 through the incident optical system 59. The incident light excites the red phosphors 12 in the phosphor layer 62 and induces the emission of red light. Green light emitted from the LD device 58-2 and passing through the phosphor layer 62 without absorption is emitted outward. Blue light emitted from the LD device 58-1 is incident on the scatterer layer 65, is scattered by the scatterer 64, and is emitted outward as incoherent light. Red light and green light emitted outward from the phosphor layer 62 and blue light emitted from the scatterer layer 65 are mixed to produce white light.

Figure 30I:
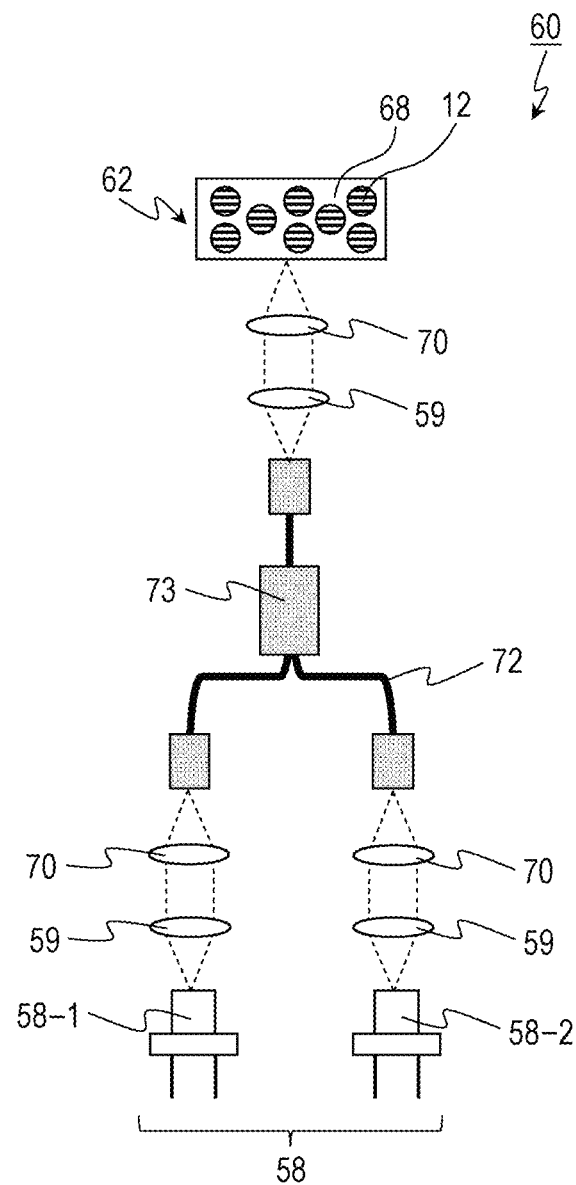
FIG. 30I is a schematic cross-sectional view of a ninth modified example of the LD light-emitting apparatus according to the seventh embodiment.

FIG. 30I is a schematic view of a ninth modified example of the LD light-emitting apparatus 60 of the present embodiment. In the LD light-emitting apparatus 60 of the ninth modified example, blue light emitted from the LD device 58-1 and green light emitted from the LD device 58-2 are incident on the phosphor layer 62 through an optical fiber. The LD light-emitting apparatus 60 of the ninth modified example includes an optical fiber 72, on which blue light emitted from the LD device 58-1 and green light emitted from the LD device 58-2 are incident, and a multiplexer 73 for multiplexing blue light and green light. In the LD light-emitting apparatus 60 of the ninth modified example, multiplexed light is incident on the phosphor layer 62 via the incident optical system 59 and the condenser lens 70.

In the light-emitting apparatus of the seventh embodiment, the red phosphor including the Ce luminescent center is excited by green light with high absorption efficiency. Thus, the light-emitting apparatus of the seventh embodiment can have higher quantum efficiency than known light-emitting apparatuses. Furthermore, the light-emitting apparatus of the seventh embodiment configured as a white-light-emitting apparatus can exhibit good color rendering properties and color reproducibility.

Eighth Embodiment

Figure 31:
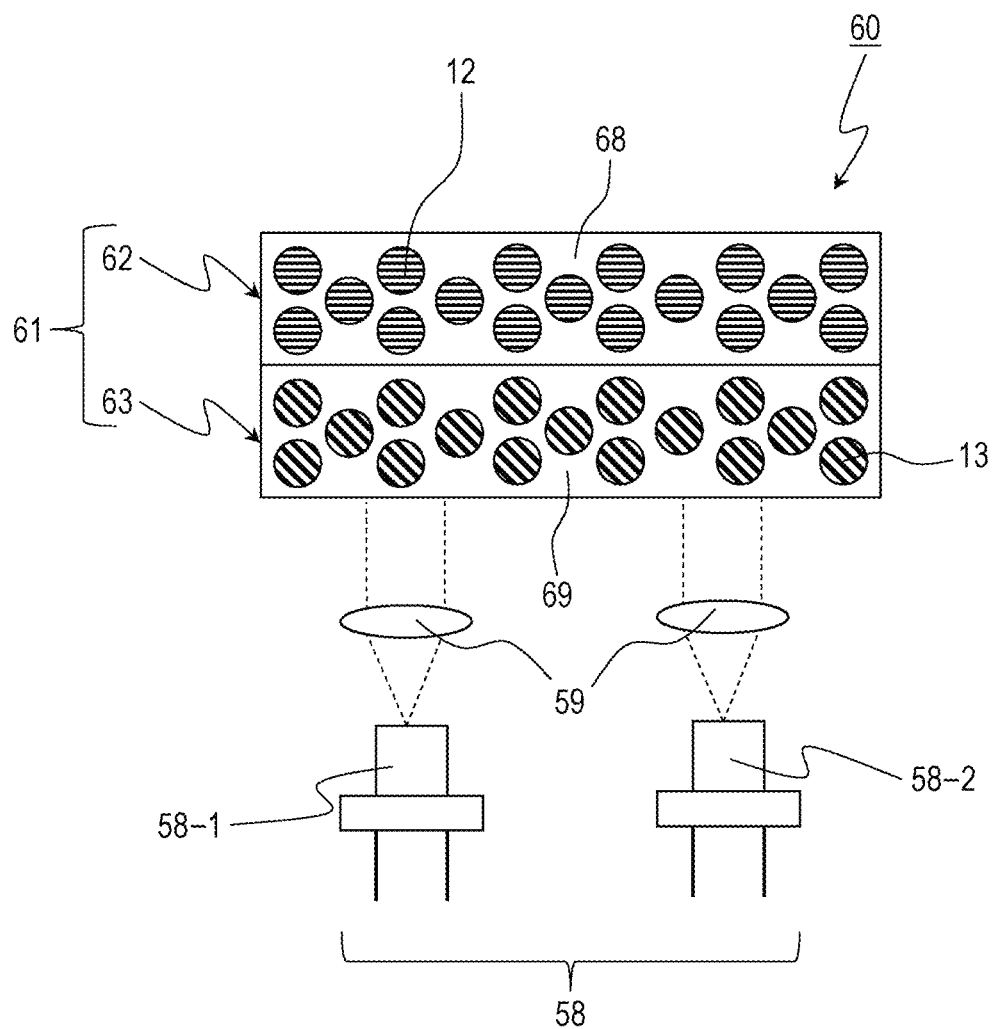
FIG. 31 is a schematic cross-sectional view of a LD light-emitting apparatus according to an eighth embodiment.

An eighth embodiment describes as an example of a light-emitting apparatus of the present disclosure a LD light-emitting apparatus that includes a light-emitting device LD as a light source. FIG. 31 is a schematic view of a LD light-emitting apparatus 60 according to the eighth embodiment. The LD light-emitting apparatus of the eighth embodiment has the same structure as the LD light-emitting apparatus 60 of the seventh embodiment illustrated in FIG. 29 except that the wavelength conversion member (wavelength convertor) is composed of two phosphor layers. Thus, only the wavelength conversion member is described below.

The phosphor of the wavelength conversion member 61 includes a red phosphor including Ce as a luminescent center. The red phosphor including the Ce luminescent center is described in the first embodiment and is not described in detail here. Depending on the desired emission color of the light-emitting apparatus, the wavelength conversion member 61 may further contain a phosphor other than the red phosphor including the Ce luminescent center. The wavelength conversion member 61 in the present embodiment has a layered structure composed of the first phosphor layer 62 containing the red phosphor 12 including the Ce luminescent center and the second phosphor layer 63 containing the yellow phosphor 13.

The first phosphor layer 62 and the second phosphor layer 63 contain binders 68 and 69, respectively. The binders 68 and 69 may be a medium such as a resin, glass, or transparent crystal. The binders 68 and 69 may be the same material or different materials. The phosphor layers may be composed of phosphor particles alone.

The operation of the LD light-emitting apparatus 60 of the present embodiment will be described below.

Blue light emitted from the LD device 58-1 is incident on the second phosphor layer 63 of the wavelength conversion member 61 through the incident optical system 59. The incident light excites the yellow phosphors 13 in the second phosphor layer 63 and induces the emission of yellow light. Blue light emitted from the LD device 58-1 and passing through the second phosphor layer 63 without absorption is incident on the first phosphor layer 62. The incident light excites the red phosphors 12 in the first phosphor layer 62 and induces the emission of red light. Yellow light emitted from the second phosphor layer 63 is incident on the first phosphor layer 62. Part of the incident light may excite the red phosphors 12 in the first phosphor layer 62 and induce the emission of red light. Blue light emitted from the LD device 58-1 and passing through the first phosphor layer 62 and the second phosphor layer 63 without absorption is emitted outward.

Green light emitted from the LD device 58-2 is incident on the second phosphor layer 63 of the wavelength conversion member 61 through the incident optical system 59. The incident light excites the yellow phosphors 13 in the second phosphor layer 63 and induces the emission of yellow light. Green light emitted from the LD device 58-1 and passing through the second phosphor layer 63 without absorption is incident on the first phosphor layer 62. The incident light excites the red phosphors 12 in the first phosphor layer 62 and induces the emission of red light. The yellow light emitted from the second phosphor layer 63 is incident on the first phosphor layer 62. Part of the incident light may excite the red phosphors 12 in the first phosphor layer 62 and induce the emission of red light. Green light emitted from the LD device 58-1 and passing through the first phosphor layer 62 and the second phosphor layer 63 without absorption is emitted outward.

These red light, yellow light, blue light, and green light are mixed to produce white light.

The thickness of each phosphor layer may be adjusted such that blue light emitted from the LD device 58 does not pass through the first phosphor layer 62. The thickness of each phosphor layer may also be adjusted such that yellow light emitted from the second phosphor layer 63 does not pass through the first phosphor layer 62. In this case, only red light is emitted outward. In another embodiment, the yellow phosphor 13 in the second phosphor layer 63 may be substituted by the green phosphor described in the second embodiment.

In the light-emitting apparatus of the eighth embodiment, the red phosphor including the Ce luminescent center is excited by green light with high absorption efficiency. Thus, the light-emitting apparatus of the eighth embodiment can have higher quantum efficiency than known light-emitting apparatuses. Furthermore, the light-emitting apparatus of the eighth embodiment configured as a white-light-emitting apparatus can exhibit good color rendering properties and color reproducibility.

Ninth Embodiment

Figure 32:
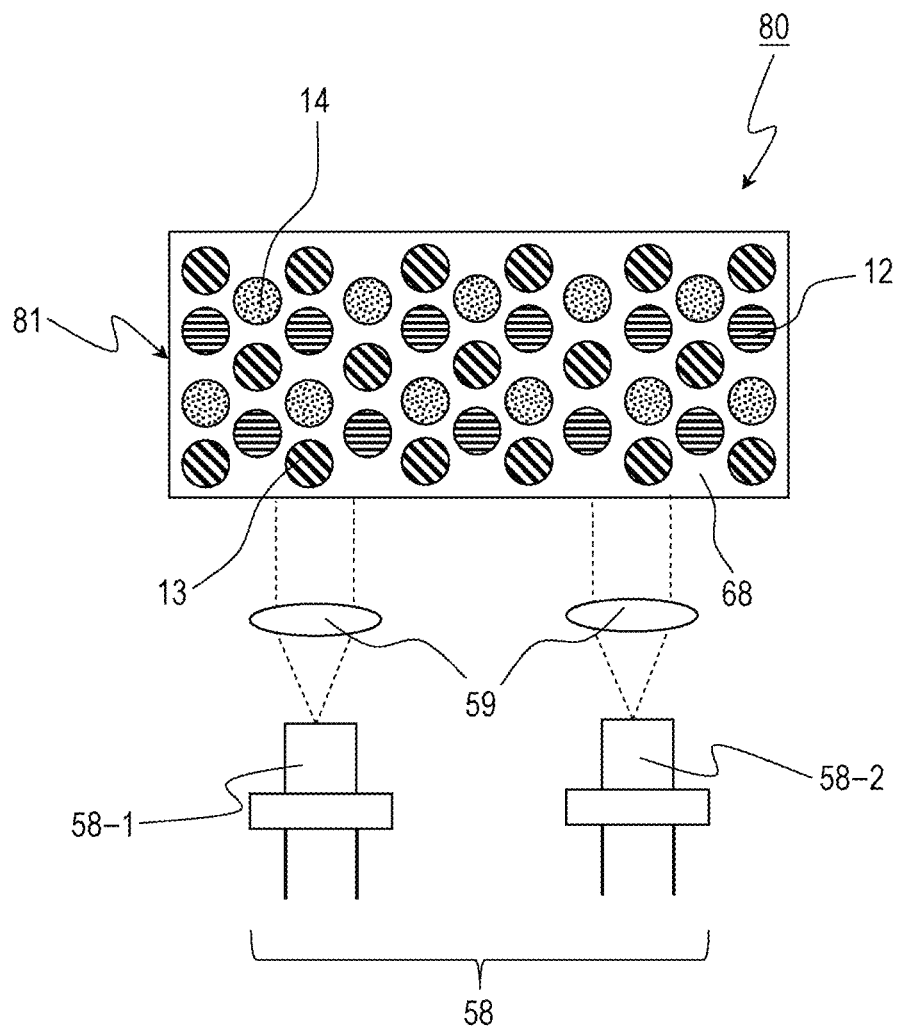
FIG. 32 is a schematic cross-sectional view of a LD light-emitting apparatus according to a ninth embodiment.

In a ninth embodiment, a LD light-emitting apparatus that includes a light-emitting device LD as a light source will be described below as an example of a light-emitting apparatus of the present disclosure. FIG. 32 is a schematic view of a LD light-emitting apparatus 80 according to the ninth embodiment. The components described in the seventh and eighth embodiments are denoted by the same reference numerals in the present embodiment and will not be described again.

The LD light-emitting apparatus 80 includes the LD device 58-1, the LD device 58-2, and the wavelength conversion member 81. The phosphor in the wavelength conversion member 81 includes a wavelength conversion layer containing a mixture of the red phosphor 12 and at least one selected from the group consisting of the yellow phosphor 13 and the green phosphor 14. The red phosphor 12 is a red phosphor including Ce as a luminescent center. The red phosphor including the Ce luminescent center is described in the first embodiment and is not described in detail here. The yellow phosphor and the green phosphor may be those exemplified in the second embodiment. The present embodiment particularly describes the wavelength conversion member 81 including a phosphor layer containing a mixture of the red phosphor 12, the yellow phosphor 13, and the green phosphor 14. The mixing ratio of three phosphors can be appropriately adjusted according to the desired color tone of white light and the emission intensity of each phosphor.

The phosphor layer of the wavelength conversion member 81 contains the binder 68. The binder 68 may be a medium such as a resin, glass, or transparent crystal. The binder 68 may be of uniform quality or of different qualities at different portions. The phosphor layer may be composed of phosphor particles alone.

Blue light emitted from the LD device 58-1 and passing through the incident optical system 59 is converted to red light, yellow light, and green light by the red phosphor 12, the yellow phosphor 13, and the green phosphor 14, respectively, in the wavelength conversion member 81. Green light emitted from the LD device 58-1 and passing through the incident optical system 59 is converted to red light and yellow light by the red phosphor 12 and the yellow phosphor 13, respectively, in the wavelength conversion member 81. Blue light emitted from the LD device 58-1 and not absorbed by the phosphor, green light emitted from the LD device 58-2 and not absorbed by the phosphor, and red light, yellow light, and green light converted by the red phosphor 12, the yellow phosphor 13, and the green phosphor 14, respectively, are mixed to produce white light. The red phosphor 12 may be excited by part of green light emitted from the green phosphor 14 and may emit red light. The thickness of the wavelength conversion member 81 may be adjusted such that blue light emitted from the LD device 58-1 and green light emitted from the LD device 58-2 do not pass through the wavelength conversion member 81. In this case, only red light is emitted outward.

Modified examples of the LD light-emitting apparatus 80 of the present embodiment will be described below with reference to FIGS. 33A to 33C. In the following description, the structure of the LD light-emitting apparatus 80 illustrated in FIG. 32 is also referred to as the basic structure.

Figure 33A:
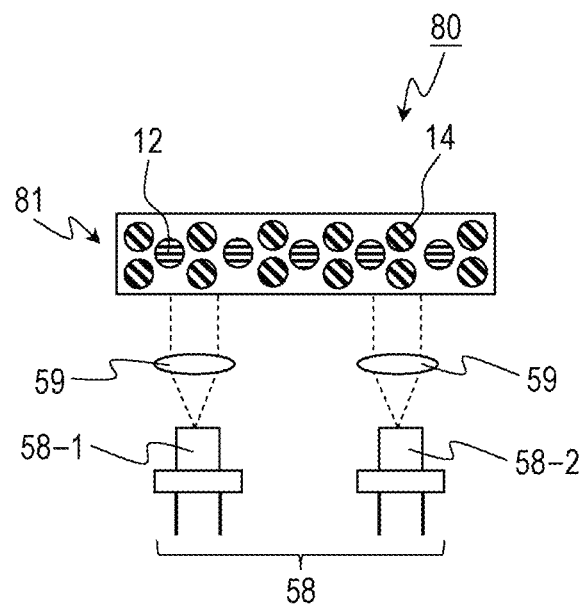
FIG. 33A is a schematic cross-sectional view of a first modified example of the LD light-emitting apparatus according to the ninth embodiment.

FIG. 33A is a schematic view of a first modified example of the LD light-emitting apparatus 80 of the present embodiment. In the LD light-emitting apparatus 80 of the first modified example, the wavelength conversion member 81 is a phosphor layer containing a mixture of the red phosphor 12 and the green phosphor 14. The other components of the first modified example are the same as those in the basic structure. In this structure, blue light emitted from the LD device 58-1 is incident on the wavelength conversion member 81 through the incident optical system 59. The incident light excites the red phosphors 12 in the wavelength conversion member 81 and induces the emission of red light. Blue light emitted from the LD device 58-1 and passing through the wavelength conversion member 81 without absorption is emitted outward. Green light emitted from the LD device 58-2 is incident on the wavelength conversion member 81 through the incident optical system 59. The incident light excites the red phosphors 12 in the wavelength conversion member 81 and induces the emission of red light. Green light emitted from the LD device 58-2 and passing through the wavelength conversion member 81 without absorption is emitted outward. These red light, green light, and blue light are mixed to produce white light.

Figure 33B:
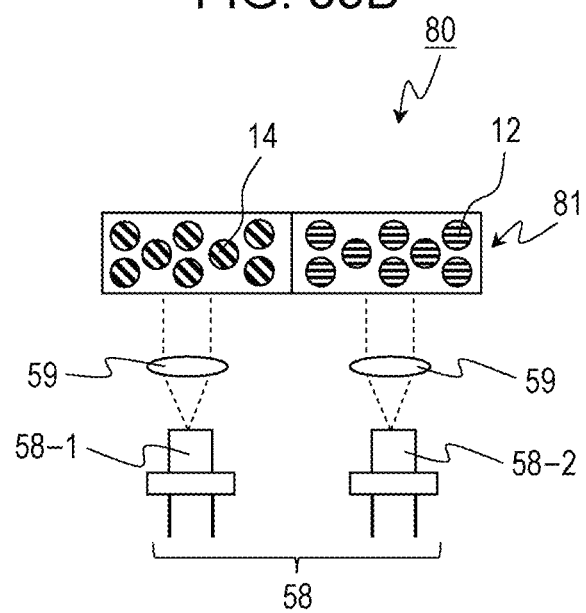
FIG. 33B is a schematic cross-sectional view of a second modified example of the LD light-emitting apparatus according to the ninth embodiment.

FIG. 33B is a schematic view of a second modified example of the LD light-emitting apparatus 80 of the present embodiment. In the LD light-emitting apparatus 80 of the second modified example, the wavelength conversion member 81 is divided into two regions: a region containing the red phosphor 12 and a region containing the green phosphor 14. More specifically, a region in the wavelength conversion member 81 irradiated with blue light emitted from the LD device 58-1 is the region containing the green phosphor 14. A region irradiated with green light emitted from the LD device 58-2 is the region containing the red phosphor 12. The other components of the second modified example are the same as those in the basic structure. In this structure, blue light emitted from the LD device 58-1 is incident on the wavelength conversion member 81 through the incident optical system 59. The incident light excites the green phosphors 14 in the wavelength conversion member 81 and induces the emission of green light. Blue light emitted from the LD device 58-1 and passing through the wavelength conversion member 81 without absorption is emitted outward. Green light emitted from the LD device 58-2 is incident on the wavelength conversion member 81 through the incident optical system 59. The incident light excites the red phosphors 12 in the wavelength conversion member 81 and induces the emission of red light. Green light emitted from the LD device 58-2 and passing through the wavelength conversion member 81 without absorption is emitted outward. These red light, green light, and blue light are mixed to produce white light.

Figure 33C:
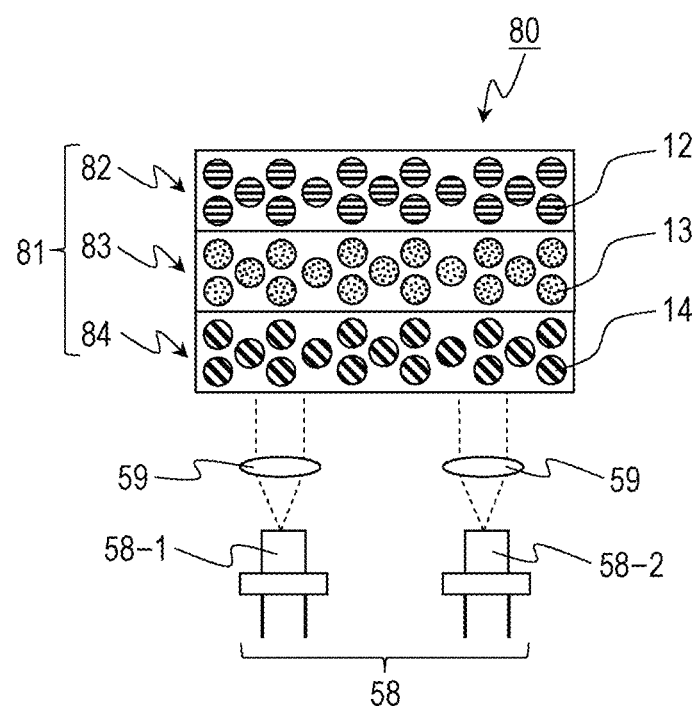
FIG. 33C is a schematic cross-sectional view of a third modified example of the LD light-emitting apparatus according to the ninth embodiment.

FIG. 33C is a schematic view of a third modified example of the LD light-emitting apparatus 80 of the present embodiment. In the LD light-emitting apparatus 80 of the third modified example, the wavelength conversion member 81 has a layered structure composed of a first phosphor layer 82 containing the red phosphor 12, a second phosphor layer 83 containing the yellow phosphor 13, and a third phosphor layer 84 containing the green phosphor 14. The other components of the third modified example are the same as those in the basic structure. In this structure, blue light emitted from the LD device 58-1 is incident on the third phosphor layer 84 of the wavelength conversion member 81 through the incident optical system 59. The incident light excites the green phosphors 14 in the third phosphor layer 84 and induces the emission of green light. Blue light emitted from the LD device 58-1 and passing through the third phosphor layer 84 without absorption is incident on the second phosphor layer 83. The incident light excites the yellow phosphors 13 in the second phosphor layer 83 and induces the emission of yellow light. Blue light emitted from the LD device 58-1 and passing through the second phosphor layer 83 without absorption is incident on the first phosphor layer 82. The incident light excites the red phosphors 12 in the first phosphor layer 82 and induces the emission of red light. Green light emitted from the LD device 58-2 is incident on the third phosphor layer 84 of the wavelength conversion member 81 through the incident optical system 59. Green light emitted from the LD device 58-1 and passing through the third phosphor layer 84 without absorption is incident on the second phosphor layer 83. The incident light excites the yellow phosphors 13 in the second phosphor layer 83 and induces the emission of yellow light. Green light emitted from the LD device 58-2 and passing through the second phosphor layer 83 without absorption is incident on the first phosphor layer 82. The incident light excites the red phosphors 12 in the first phosphor layer 82 and induces the emission of red light. The red phosphor in the first phosphor layer 82 may be excited by green light emitted from the third phosphor layer 84 and may emit red light. These red light, yellow light, blue light, and green light are mixed to produce white light.

In the light-emitting apparatus of the ninth embodiment, the red phosphor including the Ce luminescent center is excited by green light with high absorption efficiency. Thus, the light-emitting apparatus of the ninth embodiment can have higher quantum efficiency than known light-emitting apparatuses. Furthermore, the light-emitting apparatus of the ninth embodiment configured as a white-light-emitting apparatus can exhibit good color rendering properties and color reproducibility.

Tenth Embodiment

A tenth embodiment describes an example of a lighting apparatus of the present disclosure. FIG. 34 is a schematic view of a lighting apparatus 120 according to the tenth embodiment. The lighting apparatus 120 includes a light source 121 and an output optical system 122 for directing light from the light source 121 forward. In order to adjust the color of light from the light source, the lighting apparatus 120 may include a wavelength cut filter 123 for absorbing or reflecting light from the light source. The light source 121 contains a red phosphor including Ce as a luminescent center. The light source 121 may be one of the light-emitting apparatuses 10, 60, and 80 of the second to ninth embodiments. The output optical system 122 may be a reflector, for example. The output optical system 122 may include a metal film, such as Al or Ag, or an Al film with a surface protective film, for example.

Due to the red phosphor including the Ce luminescent center, the lighting apparatus of the tenth embodiment can have higher quantum efficiency than known lighting apparatuses at high power. Furthermore, the lighting apparatus of the tenth embodiment configured as a white-lighting apparatus can exhibit good color rendering properties and color reproducibility.

Eleventh Embodiment

Figure 35:
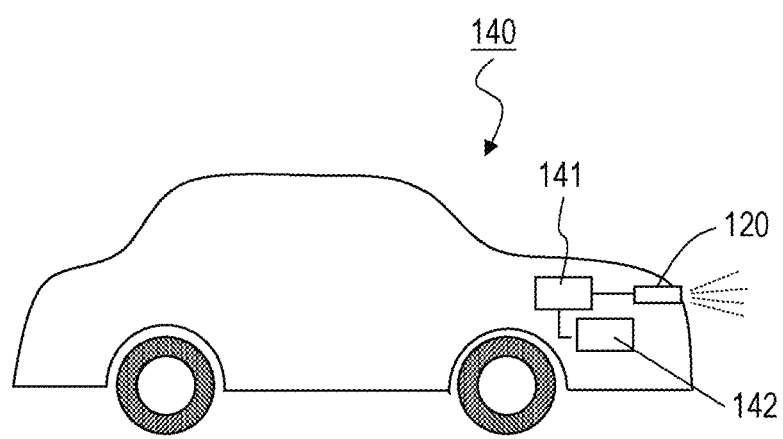
FIG. 35 is a schematic cross-sectional view of a vehicle according to an eleventh embodiment.

An eleventh embodiment describes a vehicle including a lighting apparatus as an application example of a lighting apparatus of the present disclosure. FIG. 35 is a schematic view of a vehicle 140 according to the eleventh embodiment. The vehicle 140 includes a vehicle headlight, which is the lighting apparatus 120 of the tenth embodiment, and an electricity supply source 141. The vehicle 140 may include an electric generator 142, which is rotated by a driving source, such as an engine, and generates electric power. Electric power generated by the electric generator 142 may be stored in the electricity supply source 141. The electricity supply source 141 may be a chargeable/dischargeable secondary battery. The lighting apparatus 120 turns on a light using electric power supplied from the electricity supply source 141. The vehicle 140 is an automobile, a two-wheeled vehicle, or a special-purpose vehicle, for example. The vehicle 140 may also be an engine vehicle, an electric vehicle, or a hybrid vehicle.

Due to the vehicle headlight including the red phosphor including the Ce luminescent center, the vehicle of the eleventh embodiment can more brightly illuminate the front than before at high power. Furthermore, the lighting apparatus configured as a white-lighting apparatus can exhibit good color rendering properties and color reproducibility.

Twelfth Embodiment

Figure 36:
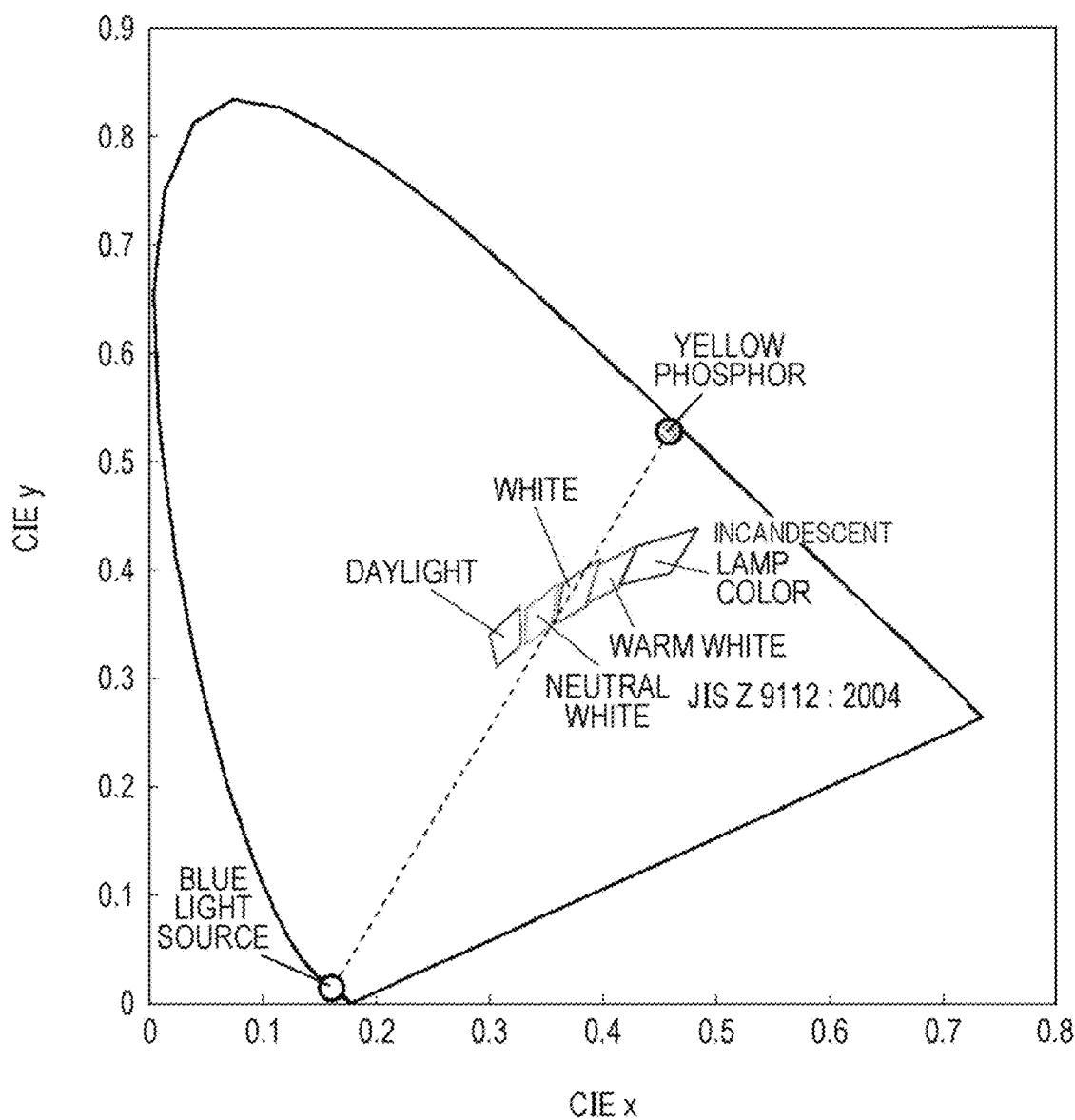
FIG. 36 is a graph of CIE chromaticity coordinates.
Figure 37:
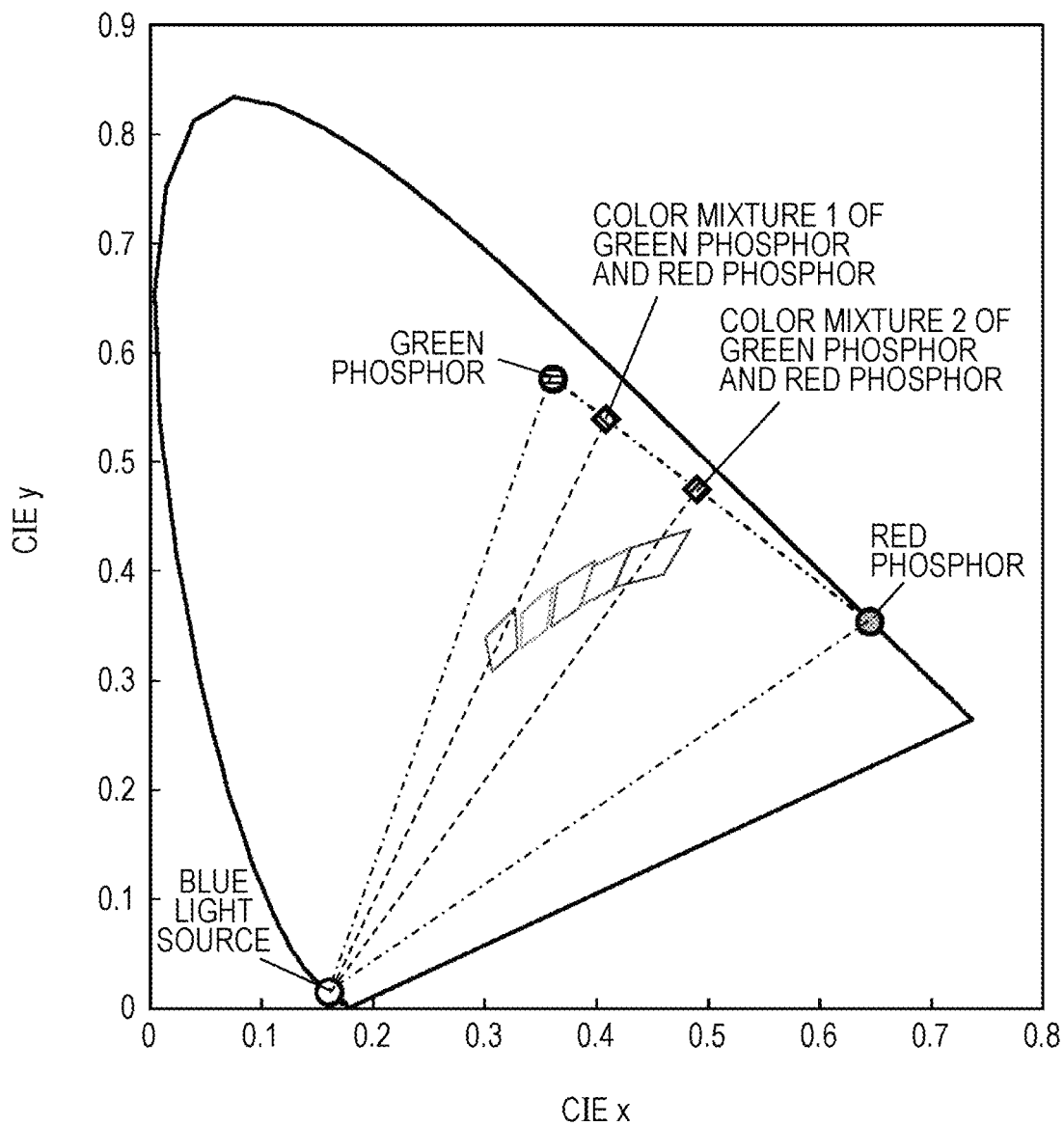
FIG. 37 is a graph of CIE chromaticity coordinates.
Figure 38:
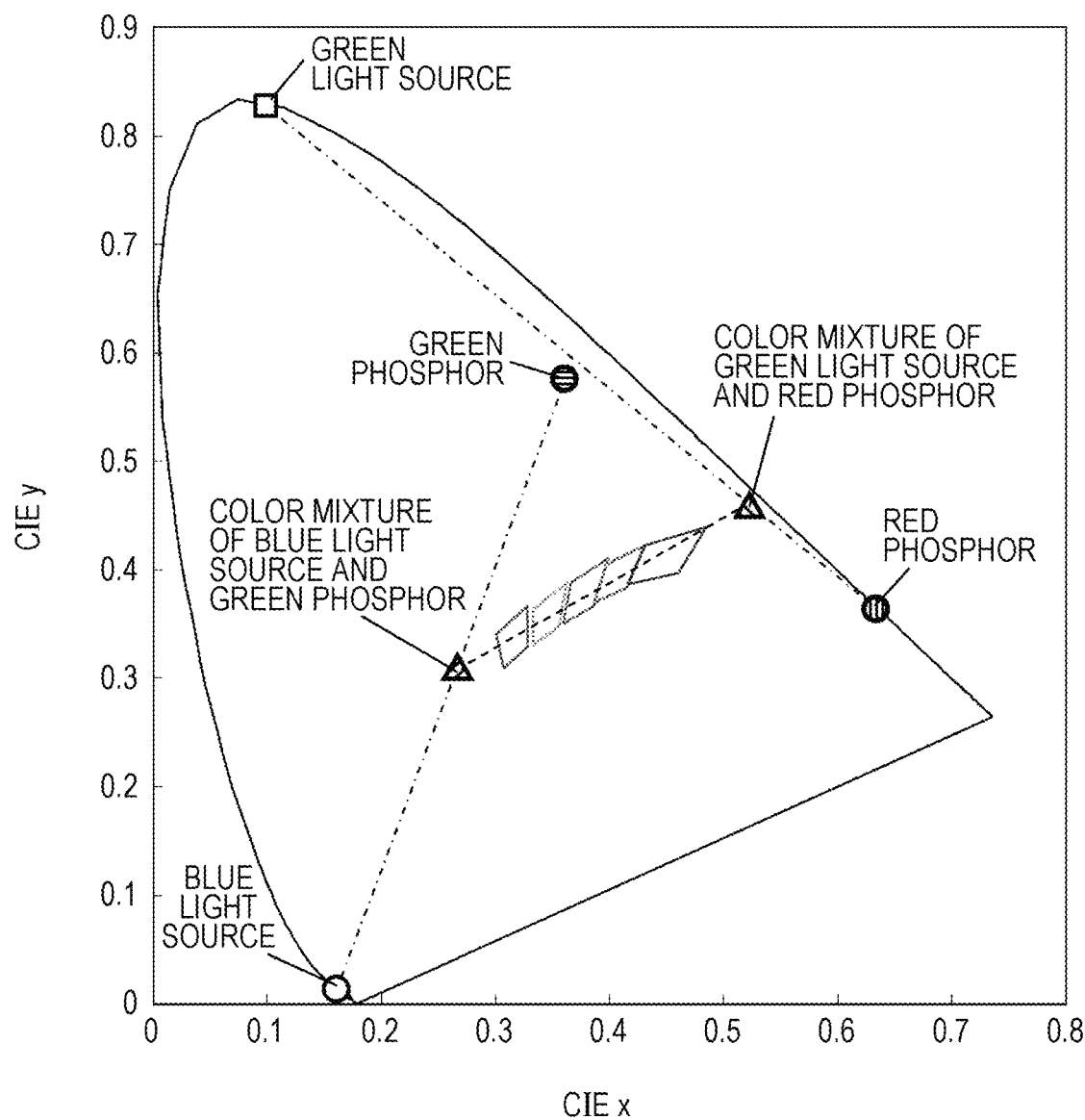
FIG. 38 is a graph of CIE chromaticity coordinates.

FIGS. 36 to 38 illustrate CIE chromaticity coordinates. White colors include incandescent lamp color, warm white, white, neutral white, and daylight. JIS Z 9112:2004 defines the chromaticity coordinates of these white colors listed in Table 19.

TABLE 19

| Daylight D | | Neutral white N | | White W | | Warm white WW | | Incandescent lamp color L | |
|---|---|---|---|---|---|---|---|---|---|
| CIE x | CIE y | CIE x | CIE y | CIE x | CIE y | CIE x | CIE y | CIE x | CIE y |
| 0.2998 | 0.3396 | 0.3616 | 0.3875 | 0.3985 | 0.4102 | 0.4305 | 0.4218 | 0.4834 | 0.4382 |
| 0.3064 | 0.3091 | 0.3552 | 0.3476 | 0.3849 | 0.3668 | 0.4141 | 0.3834 | 0.4594 | 0.3971 |
| 0.3282 | 0.3297 | 0.3324 | 0.3296 | 0.3584 | 0.3499 | 0.3856 | 0.3693 | 0.4153 | 0.3862 |
| 0.3274 | 0.3673 | 0.3326 | 0.3635 | 0.3652 | 0.388 | 0.3966 | 0.4044 | 0.4305 | 0.4218 |

An artificial white light source including a combination of a yellow phosphor and a blue light source can reproduce only colors on the straight line between the chromaticity point of the yellow phosphor and the chromaticity point of the blue light source. Thus, for example, an artificial white light source including a combination of a yellow phosphor (CIEx=0.458, CIEy=0.528) and a blue light source (CIEx=0.161, CIEy=0.014) illustrated in FIG. 36 can produce only white.

By contrast, an RGB white light source including a combination of a green phosphor, a red phosphor, and a blue light source can reproduce colors in the triangular area formed by the straight lines between the chromaticity point of the green phosphor, the chromaticity point of the red phosphor, and the chromaticity point of the blue light source. Thus, the mixing ratio of the green phosphor to the red phosphor can be changed to produce all white lights of incandescent lamp color, warm white, white, neutral white, and daylight. For example, at the chromaticity point of a color mixture 1 of the green phosphor (CIEx=0.361, CIEy=0.576) and the red phosphor (CIEx=0.645, CIEy=0.353) illustrated in FIG. 37, the green phosphor and the red phosphor can be mixed to produce daylight. At the chromaticity point of a color mixture 2 of the green phosphor and the red phosphor in the figure, the green phosphor and the red phosphor can be mixed to produce the incandescent lamp color.

However, the RGB white light source system cannot alter the hue of white light unless the blend ratio of phosphors is changed. More specifically, a white light source configured to produce daylight cannot produce the incandescent lamp color. Thus, in order to produce a light-emitting device that can alter the hue, for example, a light source device that produces daylight and a light source device that produces the incandescent lamp color are combined, and the brightness of each of the light source devices is changed to alter the hue. Thus, light source devices that can alter the hue are larger than light source devices that produce a single hue.

A white light source system of the present embodiment can freely alter the hue of the white light source. A light-emitting apparatus of a white light source of the present embodiment includes the red phosphor, the green phosphor, the blue light source, and the green light source described in any of the embodiments, modified examples, and examples, for example. The white light source includes a wavelength convertor containing the red phosphor and other phosphor(s) (for example, the green phosphor), a blue light source that emits blue light, and a green light source that emits green light. The red phosphor is excited by at least part of the green light to emit second light. The second light has a spectrum with a peak wavelength in the range of 600 to 700 nm. Another phosphor is excited by at least part of the blue light to emit third light. The third light has a spectrum with a peak wavelength in the range of 500 to 600 nm. Synthesized light of the green light passing through the wavelength convertor and the second light emitted from the wavelength convertor has a chromaticity point satisfying 0.48<CIEx<0.6 and 0.4<CIEy<0.49. Synthesized light of the blue light passing through the wavelength convertor and the third light emitted from the wavelength convertor has a chromaticity point satisfying 0.15<CIEx<0.3 and 0.2<CIEy<0.36.

For example, in a white light source system of the present embodiment, for example, as illustrated in FIG. 38, a blue light source (CIEx=0.161, CIEy=0.014) can be used to induce the light emission of a green phosphor (CIEx=0.361, CIEy=0.576), thereby reproducing the chromaticity point of a color mixture of the blue light source and the green phosphor. Alternatively, a green light source (CIEx=0.098, CIEy=0.828) can be used to induce the light emission of a red phosphor (CIEx=0.634, CIEy=0.364), thereby reproducing the chromaticity point of a color mixture of the green light source and the red phosphor. Because colors on the straight lines between these chromaticity points can be reproduced, the outputs of the blue light source and the green light source can be changed to produce all white lights of incandescent lamp color, warm white, white, neutral white, and daylight. Thus, the white light source system of the present embodiment can alter the hue without an increase in its size.

The light-emitting apparatus of the present embodiment may include a control circuit that controls a solid-state light source to change the intensity of blue light and the intensity of green light. The control circuit controls a solid-state light source to change synthesized light of green light and blue light passing through the wavelength convertor and second light and third light emitted from the wavelength convertor from one selected from the group consisting of daylight, neutral white, white, warm white, and incandescent lamp color to another selected from the group. Thus, synthesized light emitted from the light-emitting apparatus is changed from one white (for example, daylight) to another white (for example, warm white).

Figure 39:
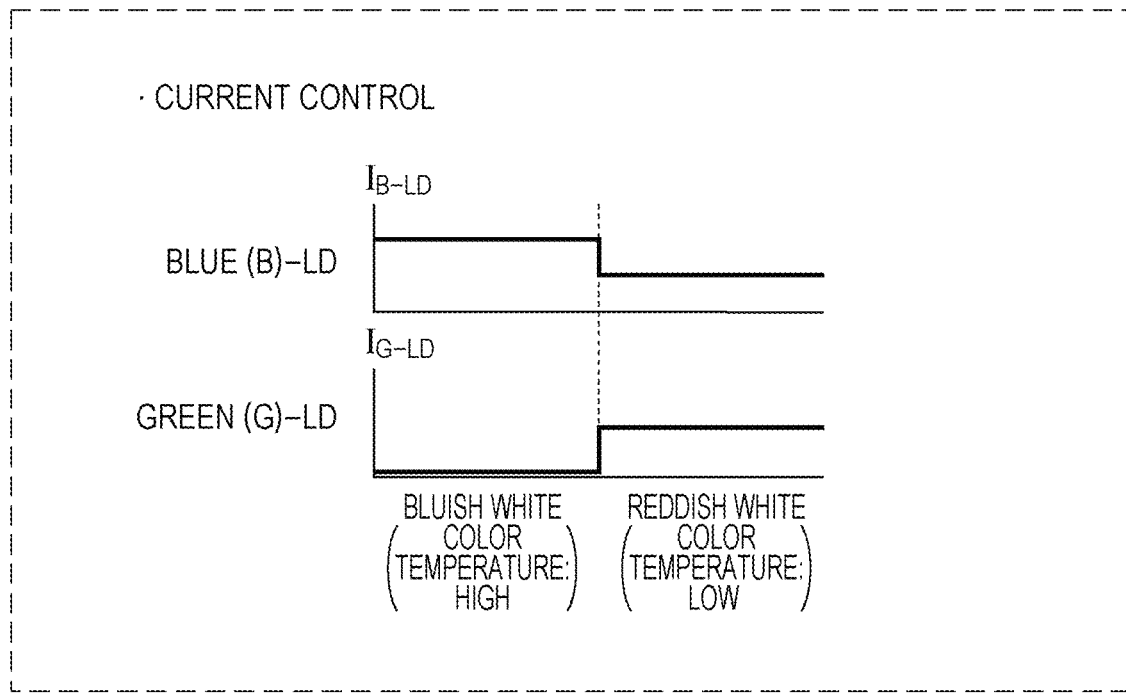
FIG. 39 is a current timing chart for illustrating an example of a method for driving a light-emitting apparatus by current control.
Figure 41:
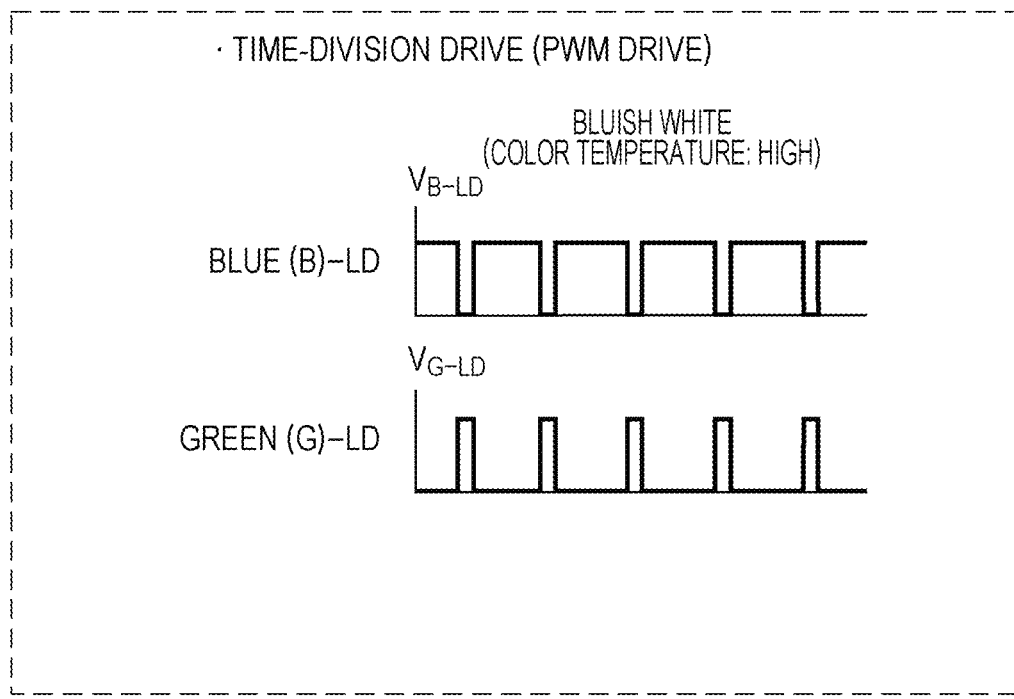
FIG. 41 is a voltage timing chart for illustrating an example of a method for driving a light-emitting apparatus by PWM control.
Figure 42:
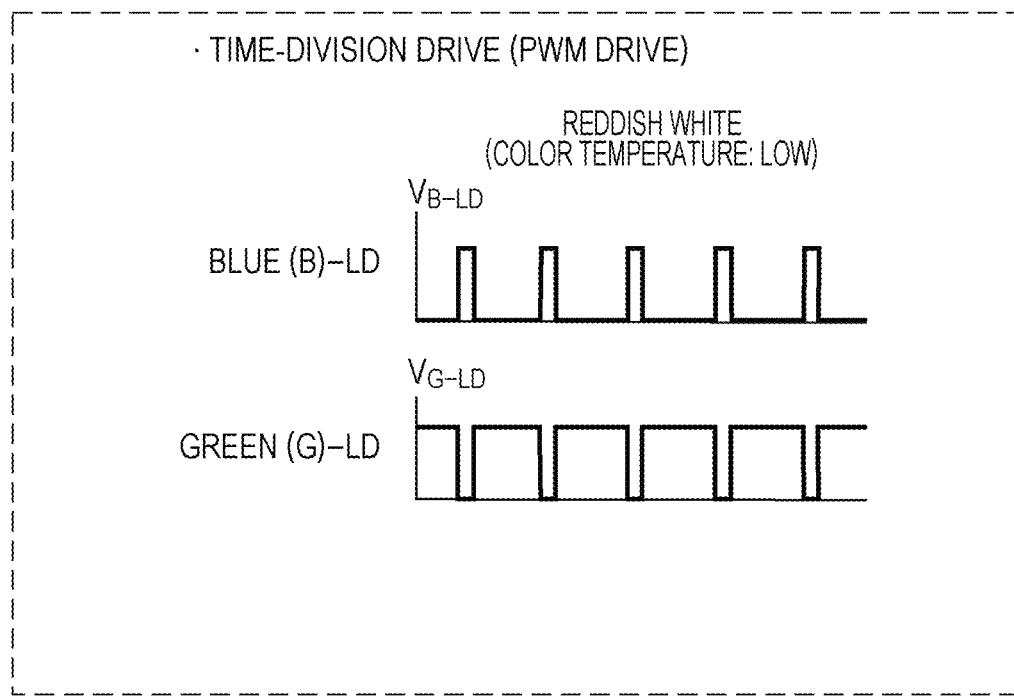
FIG. 42 is a voltage timing chart for illustrating another example of the method for driving a light-emitting apparatus by PWM control.

FIG. 39 illustrates a control method for controlling the color tone of output light of the light-emitting apparatus of the present embodiment. FIGS. 41 and 42 illustrate another control method for controlling the color tone of output light of the light-emitting apparatus of the present embodiment. As described in the first embodiment, the red phosphor used in the light-emitting apparatus of the present embodiment has low excitation efficiency and weak light emission for blue light. Thus, the main use of blue light as excitation light mainly induces the light emission of the green phosphor. Thus, the output white light is of white mainly including a mixture of blue and green and is bluish white light with high color temperature. In contrast, the use of blue and green in excitation light induces the light emission of the red phosphor. Thus, the output white light is of white including a mixture of blue, green, and red and is reddish white light with low color temperature.

In this case, as illustrated in FIG. 39, the drive current of a blue (B)-LD, which emits blue excitation light, and the drive current of a green (G)-LD, which emits green excitation light, can be controlled to alter the color tone of output white light. More specifically, the drive current of the blue (B)-LD can be increased and the drive current of the green (G)-LD can be decreased to output bluish white light with high color temperature. The drive current of the blue (B)-LD can be decreased and the drive current of the green (G)-LD can be increased to output reddish white light with low color temperature. In another control method, as illustrated in FIGS. 41 and 42, the drive voltage of the blue (B)-LD, which emits blue excitation light, and the drive voltage of the green (G)-LD, which emits green excitation light, are pulse-driven, and the color tone of output white light can be altered by pulse width modulation drive (PWM drive), in which the pulse width of each of the drive voltages is changed. More specifically, as illustrated in FIG. 41, the pulse width of the drive voltage of the blue (B)-LD can be increased, and the pulse width of the green (G)-LD can be decreased to output bluish white light with high color temperature. Alternatively, as illustrated in FIG. 42, the drive voltage pulse width of the blue (B)-LD can be decreased, and the pulse width of the green (G)-LD can be increased to output reddish white light with low color temperature.

Figure 40:
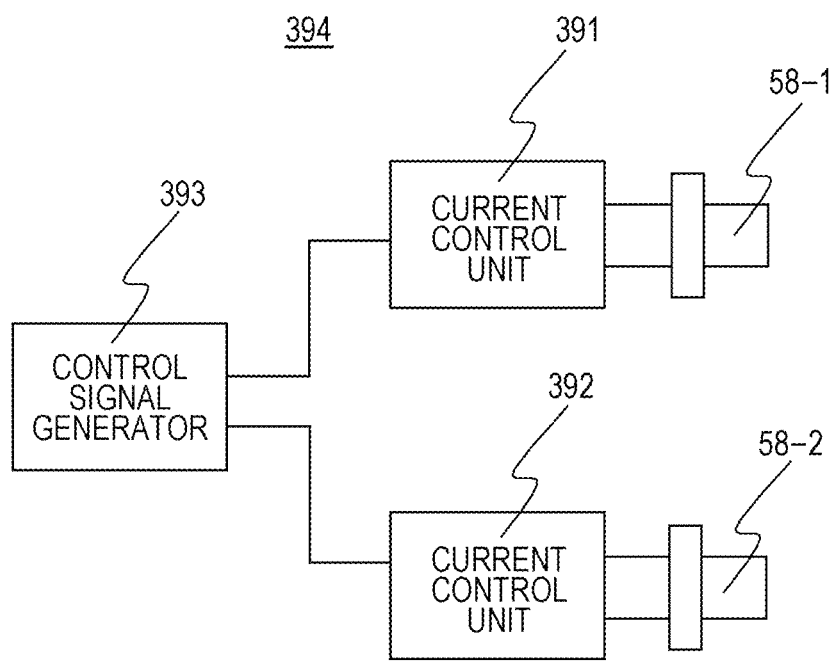
FIG. 40 is a block diagram of an example of a light source drive unit.

FIG. 40 is a block diagram of an example of a light source drive unit of the present embodiment. A light source drive unit 394 drives a light source to alter the hue of white light as described above. The light source drive unit 394 can be applied to any of the embodiments described above. The light source drive unit 394 includes the LD device 58-1, which is a blue light source, the LD device 58-2, which is a green light source, current control units 391 and 392, and a control signal generator 393. The current control unit 391 outputs a drive current to the LD device 58-1 and drives the LD device 58-1. The current control unit 392 outputs a drive current to the LD device 58-2 and drives the LD device 58-2. The control signal generator 393 outputs a control signal to the current control units 391 and 392 and independently controls a drive current output from the current control units 391 and 392. This can independently control the light outputs of the LD devices 58-1 and 58-2 and can alter the hue of white light to produce all white lights.

Figure 43:
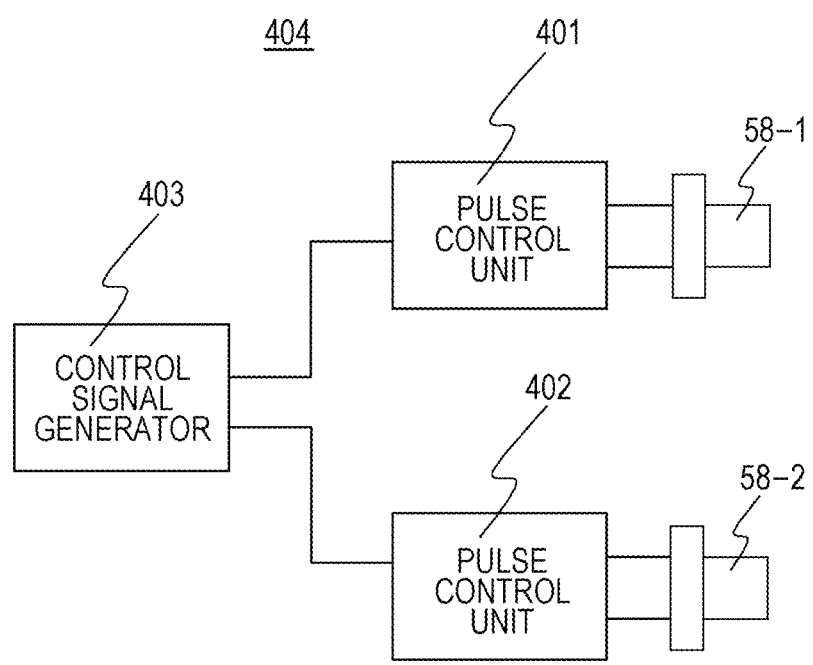
FIG. 43 is a block diagram of another example of the light source drive unit.

FIG. 43 is a block diagram of another example of the light source drive unit of the present embodiment. A light source drive unit 404 may drive a light source by another method to alter the hue of white light as described above. The light source drive unit 404 has the same structure as the light source drive unit 394 except that the current control units 391 and 392 and the control signal generator 393 are substituted by pulse control units 401 and 402 and a control signal generator 403. The pulse control unit 401 outputs a drive pulse to the LD device 58-1 and drives the LD device 58-1. The pulse control unit 402 outputs a drive pulse to the LD device 58-2 and drives the LD device 58-2. The control signal generator 403 outputs a control signal to the pulse control units 401 and 402 and independently controls the pulse width of a drive pulse output from the pulse control units 401 and 402. This can independently control the light outputs of the LD devices 58-1 and 58-2 and can alter the hue of white light to produce all white lights.

In the present disclosure, all or part of a unit, an apparatus, a member, or a portion, or all or part of a functional block illustrated in a figure may be implemented by one or more electronic circuits including a semiconductor device, a semiconductor integrated circuit (IC), or a large scale integration (LSI). LSI or IC may be integrated on one chip or a plurality of chips. For example, a functional block other than a memory device may be integrated on one chip. LSI or IC herein may also be a system LSI, a very large scale integration (VLSI), or an ultralarge scale integration (ULSI), depending on the degree of integration. A field programmable gate array (FPGA) programmed after the manufacture of LSI or a reconfigurable logic device, which allows reconfiguration of the junction relationship in LSI or setup of a circuit block in LSI, can also be used for the same purpose.

Furthermore, the function or operation of all or part of a unit, an apparatus, a member, or a portion may be performed by software processing. In this case, software is stored on one or a plurality of nontemporary recording media, such as a ROM, an optical disk, or a hard disk drive. When the software runs on a processing unit (processor), the function specified by the software is performed by the processing unit (processor) and a peripheral device. A system or apparatus may include one or a plurality of nontemporary recording media on which software is stored, a processing unit (processor), and a required hardware device, for example, an interface.

At least two selected from the group consisting of embodiments, modified examples, and examples of the present disclosure may be appropriately combined.

For example, a light-emitting apparatus of the present disclosure can be used as a light source in a general lighting apparatus, such as a ceiling light, a special lighting apparatus, such as a spotlight, stadium illumination, or studio illumination, a vehicle lighting apparatus, such as a headlight, a projection apparatus, such as a projector or a head-up display, an image pickup apparatus, such as an endoscopic light, a digital camera, a mobile phone, or a smartphone, or a liquid crystal display unit, such as a personal computer (PC) monitor, a laptop computer, a television set, a personal digital assistant (PDX), a smartphone, a tablet PC, or a mobile phone.

What is claimed is:

1. A light-emitting apparatus comprising:
a solid-state light source; and
a wavelength convertor, wherein the solid-state light source is configured to emit first light, the first light including green light with a peak wavelength in a range of 480 to 550 nm, inclusive, the wavelength convertor contains a red phosphor including Ce as a luminescent center, the red phosphor is configured to be excited by at least part of the green light to emit second light, the second light has a spectrum with a maximum peak wavelength in a range of 600 to 700 nm, inclusive, and the red phosphor contains a nitride or an oxynitride as a host material, wherein the red phosphor has a 1/e afterglow value of 100 ns or less.

2. The light-emitting apparatus according to claim 1, wherein
the peak wavelength of the green light is in a range of 510 to 540 nm, inclusive.

3. The light-emitting apparatus according to claim 1, wherein
the solid-state light source includes a GaN semiconductor laser.

4. The light-emitting apparatus according to claim 1, wherein
the wavelength convertor further contains at least one phosphor different from the red phosphor, and
each of all phosphors contained in the wavelength convertor has a 1/e afterglow value of not more than 100 ns.

5. The light-emitting apparatus according to claim 1, wherein
the red phosphor contains a host material, the host material containing Y or a lanthanoid element other than Ce.

6. The light-emitting apparatus according to claim 1, wherein
the red phosphor contains a host material having a tetragonal crystal structure.

7. The light-emitting apparatus according to claim 1, wherein
the red phosphor contains a crystal phase having a chemical composition of $Ce_xM_{3-x-y}\beta_6\gamma_{11-z}$,
where M denotes one or more elements selected from the group consisting of Sc, Y, La, Pr, Nd, Sm, Eu, Gd, Tb, Dy, Ho, Er, Tm, Yb, and Lu,
β includes Si in an amount of not less than 50% by mole of the total amount of Si,
γ includes N in an amount of not less than 80% by mole of the total amount of N, and
x, y and z satisfy $0<x\leq 0.6$, $0\leq y\leq 1.0$, and $0\leq z\leq 1.0$.

8. The light-emitting apparatus according to claim 7, wherein
the red phosphor contains a crystal phase having a chemical composition of $Ce_xM_{3-x}Si_{6-q}Al_qN_{11}$, where
q satisfies $0\leq q\leq 2.0$.

9. The light-emitting apparatus according to claim 8, wherein
the red phosphor contains a crystal phase having a chemical composition of $Ce_xM_{3-x}Si_{6-q}Al_qN_{11-z}$, where
q satisfies $0<q\leq 2.0$.

10. The light-emitting apparatus according to claim 8, wherein
the red phosphor contains a crystal phase having a chemical composition of $Ce_xM_{3-x}Si_{6-q}Al_qN_{11}$, where
p and x satisfy $(1.5-x)\leq p\leq (3-x)$.

11. The light-emitting apparatus according to claim 1, wherein
the wavelength convertor further contains a phosphor containing a garnet crystal including Ce as a luminescent center.

12. The light-emitting apparatus according to claim 1, wherein
the first light emitted from the solid-state light source further includes blue light with a peak wavelength in a range of 430 to 470 nm, inclusive.

13. The light-emitting apparatus according to claim 12, wherein
the solid-state light source includes a GaN semiconductor laser configured to emit the blue light and a YAG:Nd solid-state laser configured to emit the green light and that includes a second harmonic generator.

14. The light-emitting apparatus according to claim 12, wherein
the wavelength convertor further contains a phosphor configured to be excited by at least part of the blue light to emit third light,
the third light has a spectrum with a peak wavelength in a range of 500 to 600 nm, inclusive,
first synthesized light of the green light passing through the wavelength convertor and the second light emitted from the wavelength convertor has a chromaticity point satisfying $0.48<CIEx<0.6$ and $0.4<CIEy<0.49$, and
second synthesized light of the blue light passing through the wavelength convertor and the third light emitted from the wavelength convertor has a chromaticity point satisfying $0.15<CIEx<0.3$ and $0.2<CIEy<0.36$.

15. The light-emitting apparatus according to claim 14, further comprising a controller configured to control the solid-state light source to change an intensity of the blue light and an intensity of the green light to change color of third synthesized light of the first synthesized light and the second synthesized light from one selected from the group consisting of daylight, neutral white, white, warm white, and incandescent lamp color to another selected from the group consisting of daylight, neutral white, white, warm white, and incandescent lamp color.

16. The light-emitting apparatus according to claim 14, wherein the phosphor comprising a garnet crystal including Ce as a luminescent center.

17. A light-emitting apparatus comprising:
a solid-state light source; and
a wavelength convertor,
wherein the solid-state light source is configured to emit first light including green light with a peak wavelength in a range of 480 to 550 nm, inclusive,
the wavelength convertor contains a red phosphor including Ce as a luminescent center,
the red phosphor is configured to be excited by at least part of the green light to emit second light,
the second light has a spectrum with a maximum peak wavelength in the range of 600 to 700 nm, inclusive, and
the red phosphor contains an oxide as a host material.

* * * * *